(12) United States Patent
Watanabe

(10) Patent No.: US 8,309,629 B2
(45) Date of Patent: Nov. 13, 2012

(54) INK COMPOSITION, INKJET RECORDING METHOD, PRINTED MATERIAL, METHOD FOR PRODUCING PLANOGRAPHIC PRINTING PLATE, AND PLANOGRAPHIC PRINTING PLATE

(75) Inventor: Kotaro Watanabe, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 824 days.

(21) Appl. No.: 12/040,339

(22) Filed: Feb. 29, 2008

(65) Prior Publication Data

US 2008/0213550 A1 Sep. 4, 2008

(30) Foreign Application Priority Data

Mar. 1, 2007 (JP) .................................. 2007-051719

(51) Int. Cl.
*C09D 11/00* (2006.01)
(52) U.S. Cl. ...................... 523/161; 523/160; 428/195.1; 524/612; 524/599; 524/610; 427/487; 427/511; 101/453; 101/463.1
(58) Field of Classification Search .................. 523/160, 523/161
See application file for complete search history.

(56) References Cited

U.S. PATENT DOCUMENTS

| | | | | |
|---|---|---|---|---|
| 4,680,368 | A | * | 7/1987 | Nakamoto et al. ............... 528/49 |
| 6,440,633 | B1 | * | 8/2002 | Kawauchi ................... 430/270.1 |
| 2002/0020832 | A1 | * | 2/2002 | Oka et al. ....................... 252/500 |
| 2004/0063809 | A1 | * | 4/2004 | Fu et al. ......................... 523/160 |
| 2005/0197419 | A1 | * | 9/2005 | Graziano et al. ................. 522/74 |
| 2006/0182937 | A1 | * | 8/2006 | Tsuchimura ............... 428/195.1 |
| 2006/0223006 | A1 | * | 10/2006 | Shimada et al. .............. 430/302 |

FOREIGN PATENT DOCUMENTS

| | | |
|---|---|---|
| EP | 1 418 210 A1 | 5/2004 |
| EP | 1 426 421 A1 | 6/2004 |
| EP | 1 555 549 A2 | 7/2005 |
| GB | 2 219 591 A | 12/1989 |
| JP | 54-117203 A | 9/1979 |
| JP | 9-183928 A | 7/1997 |
| JP | 11-43540 A | 2/1999 |
| JP | 11-60702 A | 3/1999 |
| JP | 2000 104006 A | 4/2000 |
| JP | 2003-312121 A | 11/2003 |
| JP | 2003-341217 A | 12/2003 |
| JP | 2004-91558 A | 3/2004 |
| JP | 2004 167873 A | 6/2004 |
| JP | 2006 008880 A | 1/2006 |
| JP | 2006-152071 A | 6/2006 |
| JP | 2006-182970 A | 7/2006 |
| JP | 2007 169607 A | 7/2007 |

OTHER PUBLICATIONS

EP Communication, including Search Report, issued in corresponding EP Application No. 08003679.1, dated Oct. 2, 2008 (4 pages).
Japanese Office Action dated Jun. 19, 2012 issued in corresponding Japanese Application No. 2007-051719.

* cited by examiner

*Primary Examiner* — Doris Lee
(74) *Attorney, Agent, or Firm* — Sughrue Mion, PLLC

(57) ABSTRACT

There are provided an ink composition including a polymerization initiator, a polymerizable monomer and a phosphoric acid group-containing polymer having a weight-average molecular weight in a range of 10,000 to 30,000; an inkjet recording method using the ink composition; a printed material recorded by the inkjet recording method; a method of producing a planographic printing plate using the ink composition; and a planographic printing plate obtained by the method of producing a planographic printing plate.

19 Claims, No Drawings

INK COMPOSITION, INKJET RECORDING METHOD, PRINTED MATERIAL, METHOD FOR PRODUCING PLANOGRAPHIC PRINTING PLATE, AND PLANOGRAPHIC PRINTING PLATE

CROSS-REFERENCE TO RELATED APPLICATION

This application claims priority under 35 USC 119 from Japanese Patent Application No. 2007-051719, the disclosure of which is incorporated by reference herein.

BACKGROUND OF THE INVENTION

1. Field of the Invention

The present invention relates to an ink composition favorably used for inkjet recording, an inkjet recording method, a printed material produced therewith, a planographic printing plate produced using the ink composition, and a method for producing a planographic printing plate 2. Description of the Related Art Cyclic ether compounds such as 3-membered rings and 4-membered rings are known to exhibit high reactivity, and are used as polymerizable compounds contained in curable compositions subjected to photocationic polymerization or heat polymerization using an acid anhydride (for example, see Japanese Patent Application Laid-Open (JP-A) Nos. 11-43540 and 11-60702.)

There are many image-recording methods of forming an image on a recording medium such as paper based on image data signals, including those in electrophotographic process, sublimation or fusion heat-transfer process, and inkjet process. Among them, the inkjet process is advantageous in that it allow printing in a cheaper device at a lower running cost, because it forms an image directly on a recording medium by ejecting ink only in desirable image region and thus uses the ink more efficiently. In addition, the inkjet process is also less noisy and thus advantageous as an image-recording method. The inkjet process allows printing not only on plain paper but also on non-water absorbing recording media such as a plastic sheet or metal plate, but is imperatively required to increase the printing speed and improve the image quality. The time required for drying and curing the ink droplets after printing significantly influences the efficiency in producing printed materials and sharpness of the printed image.

In the inkjet recoding processes, there is a recording method by using an inkjet recording ink that cures by irradiation with radiation ray. In the method, it is possible to improve the printing efficiency and the quality of image, by curing the ink droplet by irradiating it with radiation ray immediately or after a particular period from ejection. By increasing the sensitivity of the inkjet recording ink which is curable by irradiation with a radiation ray such as ultraviolet light, the ink has higher curability for radiation rays, which brings about many benefits such as the improvement in inkjet recording efficiency, reduction in power consumption, prolongation of the lifetime of radiation ray generator owing to the decrease in the load, and prevention of volatilization of low-molecular substances caused by insufficient curing. Further, the increase in the sensitivity particularly increases the strength of the image formed using the inkjet recording ink. In particular, a planographic printing plate produced using the ink composition has increased strength in the image areas thereof, and thus provides higher printing durability.

In recent year, curable inkjet systems employing a radiation ray such as ultraviolet light is receiving attention because they give relatively less odor, produce fast-drying images, and allow recording on a recording medium which does not absorb ink. A cationic polymerizable ink composition which provides excellent adhesiveness to a recording medium with low shrinkage when exposed to ultraviolet light is supposed (for example, see JP-A No. 9-183928). However, the cationic polymerizable ink is not sufficiently stable during storage because of the reaction caused by the acid generated over time, which is an obstacle to the commercialization of the ink. Therefore, in order to improve the storage stability, a technique of adding a basic compound or a thermal base generator is supposed (for example, see JP-A Nos. 2003-312121, 2003-341217, and 2004-91558). However, there is another problem that the curing sensitivity of the ink deteriorates because the basic compound inhibits the function of the acid generated upon exposure.

However, in recent years, a technique of digitizing image information using a computer by electronically processing, storing, and outputting the information has become widespread, and a new image output system that can be used for the above technique has been desired. In particular, a method for making a printing plate without treatment with a developing solution is studied, and a method for directly making a planographic printing plate using an inkjet recording ink composition is studied (for example, see JP-A No. 54-117203). The method comprises steps of image-wisely ejecting ink on the support surface which is preferably hydrophilic, and curing the ink by irradiation with actinic radiation to make a printing plate having a desired image (preferably a hydrophobic image).

In order to form an image portion of a planographic printing plate, it is desired that the ink discharged onto a substrate has curability (curing sensitivity) and adhesion to the substrate. In response to such a desire, a ink containing an alicyclic polymer or a fluorine-containing polymer and a UV inkjet ink containing a resin chosen from polyurethane resin, polyamide resin, polyurea resin or polyester resin are disclosed (See, e.g., JP-A Nos. 2006-182970 and 2006-152071). However, such ink is insufficient in adhesion to a substrate, what's more it is unsatisfactory in both workability in ink preparation and ink jetting capabilities since an increase in ink viscosity during the preparation is observed.

SUMMARY OF THE INVENTION

The present invention has been made in view of the above circumstances, and provides an ink composition, an inkjet recording method, a printed material, a method for producing a planographic printing plate and a planographic printing plate.

A first aspect of the invention provides an ink composition containing a polymerization initiator, a polymerizable monomer and a phosphoric acid group-containing polymer having a weight-average molecular weight in a range of from 10,000 to 30,000.

A second aspect of the invention provides an inkjet recording method including: ejecting the ink composition of the invention onto a recording medium using an inkjet recording apparatus, and curing the ejected ink composition by irradiating the ejected ink composition with active radiation.

A third aspect of the invention provides printed material recorded by the inkjet recording method of the invention.

A fourth aspect of the invention provides a method of producing a planographic printing plate, including: ejecting the ink composition of the invention onto a support, and forming a hydrophobic image on the support by irradiating the ejected ink composition with active radiation to cure the ink composition.

A fifth aspect of the invention provides a planographic printing plate that has been produced by the method for producing a planographic plate of the invention.

DETAILED DESCRIPTION OF THE INVENTION

The ink composition according to the present invention contains a polymerization initiator, a polymerizable monomer, and a phosphoric acid group-containing polymer having a weight-average molecular weight in a range of 10,000 to 30,000, and may be cured by exposure to radiation.

The term "radiation" as stated in the invention has a wide meaning and no particular restriction so long as the irradiation therewith can impart energy by which an initiation species is produced in the composition. Specifically, it is intended to include α rays, γ rays, X rays, ultraviolet light, visible light and electron beams. Of these various kinds of radiation, ultraviolet light and electron beams, notably ultraviolet light, are preferred over the others from the viewpoints of curing sensitivity and availability of apparatus. Therefore, the present ink composition is preferably an ink composition capable of being cured by irradiation with ultraviolet light as the radiation.

In addition to the polymerization initiator, the polymerizable monomer and the phosphoric acid group-containing polymer, the present ink composition preferably contains a coloring agent, and may contain other additives as required.

Constituents of the present ink composition are described below in detail. Further, in the present specification, a phrase "... to ..." represents a range including the numeral values represented before and after "to" as a minimum value and a maximum value, respectively.

(Phosphoric Acid Group-Containing Polymer)

The phosphoric acid group-containing polymer for use in the invention (hereinafter, sometimes referred to as "specific phosphoric acid group-containing polymer") is required to have its weight-average molecular weight in the range of 10,000 to 30,000. From the viewpoints of adhesion of the ink composition to a substrate and viscosity control of the ink composition, the weight-average molecular weight is preferably from 10,000 to 25,000, far preferably from 10,000 to 20,000, particularly preferably from 10,000 to 15,000. By controlling the weight-average molecular weight of the specific phosphoric acid group-containing polymer to at least 10,000, there develops a tendency to enhance adhesion to a substrate, while control of the weight-average molecular weight to at most 20,000 is preferable because there develops a tendency of the rise in ink composition viscosity at the time of addition of the specific phosphoric acid group-containing polymer to be easily controlled.

The term "phosphoric acid group" as used in the invention is intended to include —P(=O)(OH)$_2$ and —OP(=O)(OH)$_2$ (inclusive of their esters and salts).

By incorporating the specific phosphoric acid group-containing polymer into the present ink composition, excellent adhesion to a substrate can be imparted to the ink composition, and an inkjet recording method using this ink composition can be offered. In addition, a printed material having printed records produced by inkjet recording method using the present ink composition can be made into images having excellent adhesion to the substrate.

In point of adhesion of the ink composition to a substrate, a preferred embodiment of the invention is in that the specific phosphoric acid group-containing polymer incorporated in the ink composition is a single polymer or a mixed polymer selected from (1-1) polyurethane resins, (1-2) polyester resins, (1-3) polyurea resins or (1-4) (meth)acrylic resins, more preferably (1-4) (meth) acrylic resins.

(1-1) Polyurethane Resin

Polyurethane resins usable in the invention are described below. The polyurethane resin used in the invention is a polyurethane resin having as its basic skeleton a structural unit represented as a product of reaction between at least one diisocyanate compound represented by the following formula (1A) and at least one diol compound represented by the following formula (1B)".

OCN—X$_0$—NCO             (1A)

HO—Y$_0$—OH              (1B)

(Herein, X$_0$ and Y$_0$ each independently represent a divalent organic residue.)

The polyurethane resin suitable as the polyurethane resin for use in the invention is a polyurethane resin which has a phosphoric acid group content of 0.4 meq/g or more.

The polyurethane resin used suitably is a polyurethane resin having its basic skeleton a structural unit represented by a product of reaction between a diisocyanate compound represented by formula (1A) and at least one diol compound selected from among diol compounds represented by formulae (23), (24) and (25), and/or a structural unit derived from a compound prepared by ring-opening reaction of tetracarboxylic acid anhydride with a diol compound.

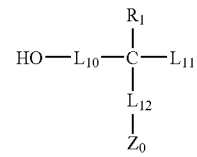

(23)

$$\text{HO}-\text{L}_{10}-\underset{\underset{Z_0}{|}}{\underset{|}{\underset{L_{12}}{|}}}{\overset{R_1}{\underset{|}{C}}}-\text{L}_{11}$$

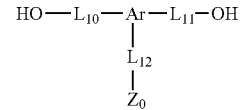

(24)

$$\text{HO}-\text{L}_{10}-\underset{\underset{Z_0}{|}}{\underset{|}{\underset{L_{12}}{|}}}{\text{Ar}}-\text{L}_{11}-\text{OH}$$

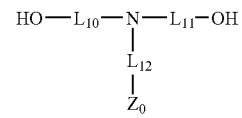

(25)

$$\text{HO}-\text{L}_{10}-\underset{\underset{Z_0}{|}}{\underset{|}{\underset{L_{12}}{|}}}{\text{N}}-\text{L}_{11}-\text{OH}$$

In formula (23), R$_1$ represents a hydrogen atom or an alkyl, aralkyl, aryl, alkoxy or aryloxy group which may have a substituent (e.g., a cyano group, a nitro group, a halogen atom (—F, —Cl, —Br, —I), —CONH$_2$, —COOR$_{113}$, —OR$_{113}$, —NHCONHR$_{113}$, —NHCOOR$_{113}$, —NHCOR$_{113}$, —OCONHR$_{113}$, —CONHR$_{113}$ (wherein R$_{113}$ is a group, such as an alkyl group having 1 to 10 carbon atoms or an aralkyl group having 7 to 15 carbon atoms), preferably a hydrogen atom, an alkyl group having 1 to 8 carbon atoms or an aryl group having 6 to 15 carbon atoms.

In formulae (23) to (25), L$_0$, L$_{11}$ and L$_{12}$ may be the same as or different from one another, and each of them represents a single bond or a divalent aliphatic or aromatic hydrocarbon residue which may have a substituent (e.g., alkyl, aralkyl, aryl, alkoxy, halogen). The group represented by L$_0$, L$_{11}$ and L$_{12}$ each is preferably an alkylene group having 1 to 20 carbon atoms or an arylene group having 6 to 15 carbon atoms, far preferably an alkylene group having 1 to 8 carbon atoms. L$_0$, $L_{11}$ and $L_{12}$ each may further have another functional group which does not undergo reaction with isocyanate group, such as carbonyl, ester, urethane, amido, ureido or ether group, as required. Additionally, any two or three of $R_1$, $L_{10}$, $L_{11}$ and $L_{12}$ may combine to form a ring.

In formula (24), Ar represents a trivalent aromatic hydrocarbon residue which may have a substituent, preferably an aromatic group having 6 to 15 carbon atoms.

In formulae (23) to (25), $Z_0$ represents either of the following groups.

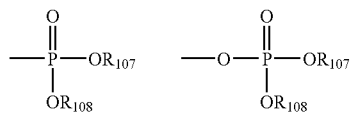

In the above formulae, $R_{107}$ and $R_{108}$ may be the same or different, and each of them represents a hydrogen atom, sodium, potassium, an alkyl group or an aryl group, preferably a hydrogen atom, an alkyl group having 1 to 8 carbon atom or an aryl group having 6 to 15 carbon atoms. Therein, it is preferable by far that both $R_{107}$ and $R_{108}$ are hydrogen atoms.

Diol compounds represented by formula (23), (24) or (25), which each have a phosphonic acid group, a phosphoric acid group or an ester group of either acid, for example, may be synthesized according to the method described below.

After protecting the hydroxyl groups of a halogenated compound represented by the following formula (26), (27) or (28) as required, the compound is subjected to phosphonate esterification by Michaelis-Arbuzov reaction represented by the formula (2a), and further hydrolyzed, e.g., with hydrogen bromide, if needed. In this manner, synthesis of the intended compound can be performed.

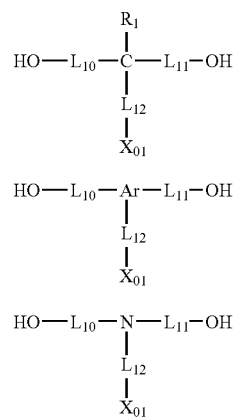

In the above formulae, $R_1$, $L_{10}$, $L_{11}$, $L_{12}$ and Ar have the same meanings as in formulae (23), (24) and (25). $R_{109}$ represents an alkyl group or an aryl group, preferably an alkyl group having 1 to 8 carbon atoms or an aryl group having 6 to 15 carbon atoms. $R_{110}$ is a residue obtained by removing $X_{01}$ from formula (26), (27) or (28), and $X_{01}$ represents a halogen atom, preferably Cl, Br or I.

Alternatively, as shown by the following reaction scheme (30), the diol compounds may be synthesized through hydrolysis after reaction with phosphorous oxychloride.

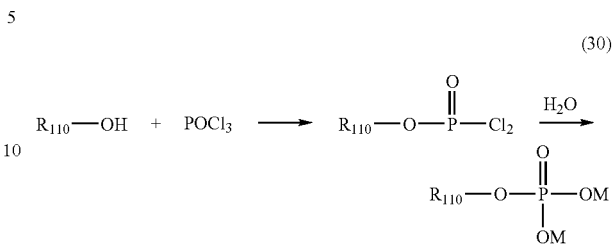

In the above reaction scheme, $R_{110}$ has the same meaning as in formula (29), and M represents a hydrogen atom, sodium or potassium.

When a polyurethane resin used in the invention has phosphonic acid groups, the resin may be synthesized by carrying out polyurethane resinification through reaction between a diisocyanate compound represented by formula (1A) and a phosphonate group-containing diol compound represented by formula (23), (24) or (25), and then hydrolyzing the resinification product with, e.g., hydrogen bromide.

Examples of tetracarboxylic acid dianhydride used suitably for synthesis of polyurethane resin in the invention include compounds represented by the following formulae (5), (6) and (7) respectively.

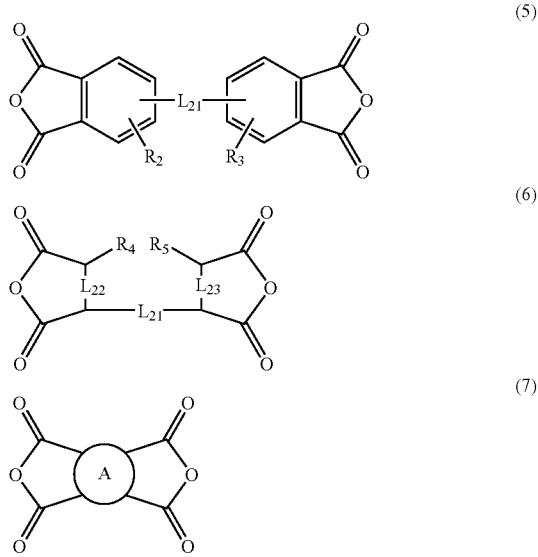

In the above formulae, $L_{21}$ represents a single bond, a divalent aliphatic or aromatic hydrocarbon residue which may have a substituent (suitable examples of which include an alky group, an aralkyl group, an aryl group, an alkoxy group, a halogeno group, an ester group and an amido group), —CO—, —SO—, —SO$_2$—, —O— or —S—, preferably a single bond, a divalent aliphatic hydrocarbon residue having 1 to 15 carbon atoms, —CO—, —SO$_2$—, —O— or —S—.

In formula (5), $R_2$ and $R_3$ may be the same or different, and each of them represents a hydrogen atom, an alkyl group, an aralkyl group, an aryl group, an alkoxy group or a halogeno group, preferably a hydrogen atom, an alkyl group having 1 to 8 carbon atoms, an aryl group having 6 to 15 carbon atoms, an alkoxy group having 1 to 8 carbon atoms or a halogeno group.

Alternatively, any two of $L_{21}$, $R_2$ and $R_3$ in formula (5) may combine with each other to form a ring.

In formula (6), $R_4$ and $R_5$ may be the same or different, and each of them represents a hydrogen atom, an alkyl group, an aralkyl group, an aryl group or a halogeno group, preferably a hydrogen atom, an alkyl group having 1 to 8 carbon atoms or an aryl group having 6 to 15 carbon atoms. Alternatively, any two of $L_{21}$, $R_4$ and $R_5$ in formula (6) may combine with each other to form a ring.

In formula (6), $L_{22}$ and $L_{23}$ may be the same or different, and each of them represents a single bond, a double bond or a divalent aliphatic hydrocarbon residue, preferably a single bond, a double bond or a methylene group.

In formula (7), A represents a mononuclear or polynuclear aromatic ring, preferably an aromatic ring having 6 to 18 carbon atoms.

Specifically, the following are included in compounds represented by formulae (5), (6) and (7) respectively.

The included are aromatic tetracarboxylic acid dianhydrides, such as pyromellitic acid dianhydride, 3,3',4,4'-benzophenonetetracarboxylic acid dianhydride, 3,3',4,4'-diphenyltetracarboxylic acid dianhydride, 2,3,6,7-naphthalenetetracarboxylic acid dianhydride, 1,4,5,8-naphthalenetetracarboxylic acid dianhydride, 4,4'-sulfonyldiphthalic acid dianhydride, 2,2-bis(3,4-dicarboxyphenyl)propane dianhydride, bis(3,4-dicarboxyphenyl) ether dianhydride, 4,4'-[3,3'-(alkylphosphoryldiphenylene)-bis(iminocarbonyl)] diphthalic acid dianhydride, an adduct of hydroquinone diacetate and trimellitic acid anhydride and an adduct of diacetyldiamine and trimellitic acid anhydride; alicyclic tetracarboxylic acid dianhydrides, such as 5-(2,5-dioxotetrahydrofuryl)-3-methyl-3-cyclohexene-1,2-dicarboxylic acid anhydride (EPICLON B-4400, a product of Dainippon Ink and Chemicals, Incorporated), 1,2,3,4-cyclopentanetetracarboxylic acid dianhydride, 1,2,4,5-cyclohexanetetracarboxylic acid dianhydride and tetrahydrofurantetracarboxylic acid dianhydride; and aliphatic tetracarboxylic acid dianhydrides, such as 1,2,3,4-butanetetracarboxylic acid dianhydride and 1,2,4,5-pentanetetracarboxylic acid dianhydride.

As a method of introducing into a polyurethane resin a structural unit derived from a compound prepared by ring-opening reaction of such a tetracarboxylic acid dianhydride with a diol compound, there are the following methods:

a) A method of inducing reaction between a diisocyanate compound and an alcohol-terminal compound obtained by ring-opening reaction of a tetracarboxylic acid dianhydride with a diol compound, and b) A method of inducing reaction between a tetracarboxylic acid dianhydride and an alcohol-terminal urethane compound obtained by reaction of a diisocyanate compound with an excess amount of diol compound.

Examples of a diol compound used therein include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxyethyl ether, p-xylylene glycol, dihydroxyethyl sulfone, bis(2-hydroxyethyl)-2,4-tolylene dicarbamate, 2,4-tolylenebis(2-hydroxyethylcarbamide), bis(2-hydroxyethyl)-m-xylylene dicarbamate and bis(2-hydroxyethyl) isophthalate.

The polyurethane resin usable in the invention is a polyurethane resin having the structure represented as a product of reaction with at least one kind of other diol compounds, preferably including a polyetherdiol compound, a polyesterdiol compound and a polycarbonatediol compound.

Examples of the polyetherdiol compound include random copolymers of any of compounds represented respectively by the following formulae (A), (B), (C), (D) and (E), hydroxyl-terminal ethylene oxide and hydroxyl-terminal propylene oxide.

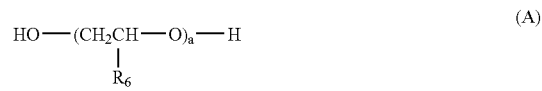

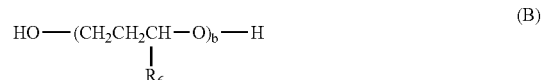

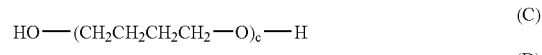

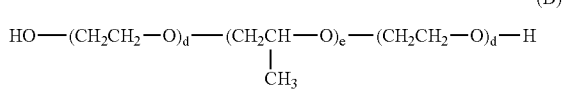

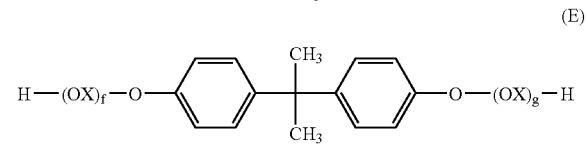

In the above formulae, $R_6$ represents a hydrogen atom or a methyl group, and X represents either of the following groups.

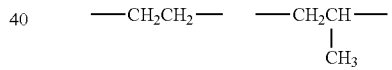

In formulae (A) to (E), a, b, c, d, e, f and g each independently represent an integer of 2 or more, preferably an integer of 2 to 100, independently.

Examples of polyetherdiol compounds represented by formulae (A) and (B) respectively include diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having an average molecular weight of 1,000, polyethylene glycol having an average molecular weight of 1,500, polyethylene glycol having an average molecular weight of 2,000, polyethylene glycol having an average molecular weight of 3,000, polyethylene glycol having an average molecular weight of 7,500 polypropylene glycol having an average molecular weight of 400, polypropylene glycol having an average molecular weight of 700, polypropylene glycol having an average molecular weight of 1,000, polypropylene glycol having an average molecular weight of 2,000, polypropylene glycol having an average molecular weight of 3,000, and polypropylene glycol having an average molecular weight of 4,000.

Examples of a polyetherdiol compound represented by formula (C) include PTMG 650, PTMG 1000, PTMG 20000 and PTMG 3000 (which are products of Sanyo Chemical Industries, Ltd.)

Examples of a polyetherdiol compound represented by formula (D) include NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108 and NEWPOL PE-128 (which are products of Sanyo Chemical Industries, Ltd.).

Examples of a polyetherdiol compound represented by formula (E) include NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BP-2P, NEWPOL BPE-23P, NEWPOL BPE-3P and NEWPOL BPE-5P (which are products of Sanyo Chemical Industries, Ltd.).

Examples of a random copolymer of ethylene oxide and propylene oxide each having terminal hydroxyl groups include NEWPOL 50HB-100, NEWPOL 50HB-260, NEWPOL 50HB-400, NEWPOL 50HB-660, NEWPOL 50HB-2000 and NEWPOL 50HB-5100 (which are products of Sanyo Chemical Industries, Ltd.).

Examples of a polyesterdiol compound include compounds represented by the following formulae (8) and (9).

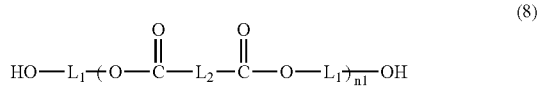

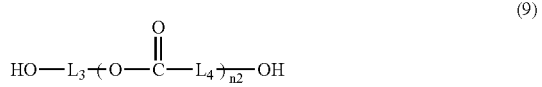

In the above formulae, $L_1$, $L_2$ and $L_3$ may be the same or different, each of which represents a divalent aliphatic or aromatic hydrocarbon residue, and $L_4$ represents a divalent aliphatic hydrocarbon residue. Therein, it is preferable that $L_1$, $L_2$ and $L_3$ each represent an alkylene group, an alkenylene group, an alkynylene group or an arylene group independently and $L_4$ represents an alkylene group. Additionally, another functional group incapable of reacting with an isocyanate group, such as an ether, carbonyl, ester, cyano, olefin, urethane, amido or ureido group, or a halogen atom, may be present in each of $L_1$, $L_2$, $L_3$ and $L_4$. $n_1$ and $n_2$ each independently represent an integer of 2 or more, preferably an integer of 2 to 100.

Examples of a polycarbonatediol compound include compounds represented by the following formula (10).

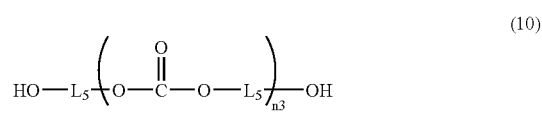

In the above formula, $L_5$s may be the same or different, and each of them represents a divalent aliphatic or aromatic hydrocarbon residue, preferably an alkylene group, an alkenylene group, an alkynylene group or an arylene group. Additionally, another functional group incapable of reacting with an isocyanate group, such as an ether, carbonyl, ester, cyano, olefin, urethane, amido or ureido group, or a halogen atom, may be present in $L_5$. $n_3$ represents an integer of 2 or more, preferably an integer of 2 to 100.

Examples of diol compounds represented by formulae (8), (9) and (10) respectively include the compounds illustrated below. n in each of the following structural formulae is an integer of 2 or more, preferably from 2 to 10, far preferably from 2 to 5, particularly preferably 2 or 3.

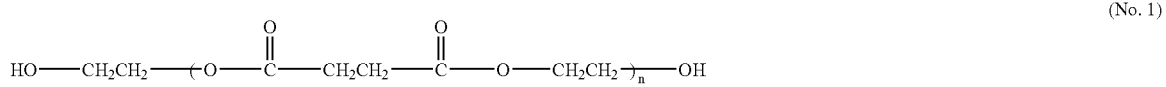

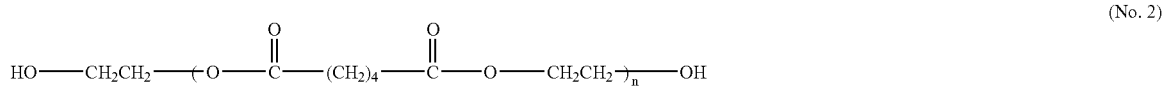

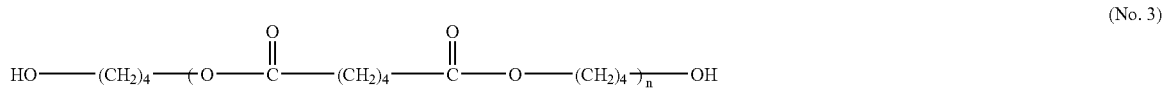

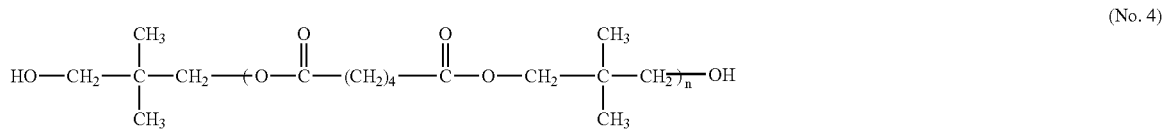

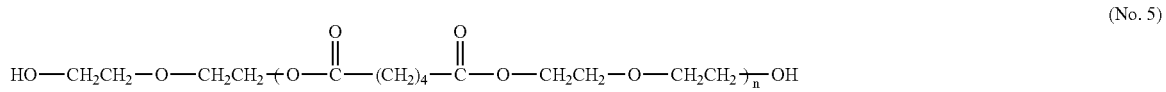

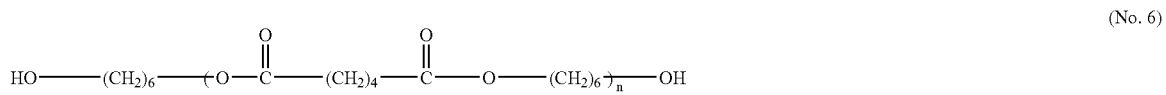

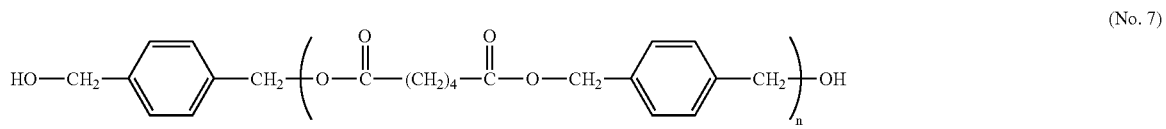

-continued

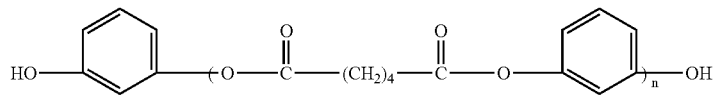
(No. 8)

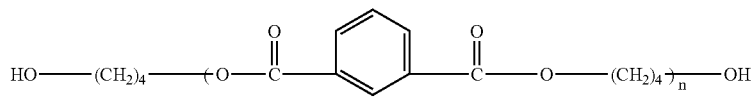
(No. 9)

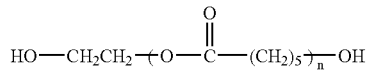
(No. 10)

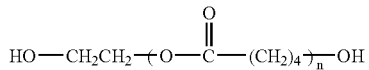
(No. 11)

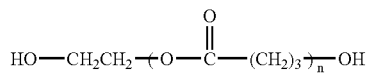
(No. 12)

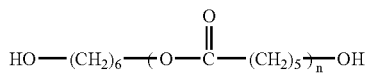
(No. 13)

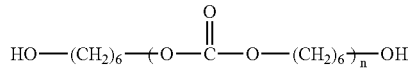
(No. 14)

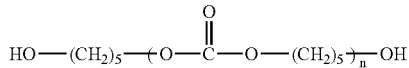
(No. 15)

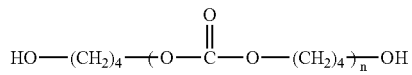
(No. 16)

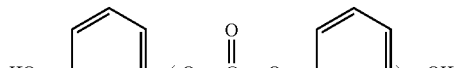
(No. 17)

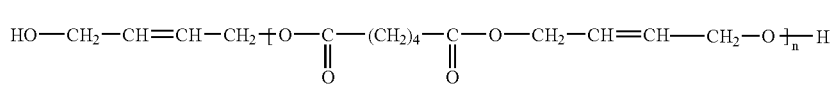
(No. 18)

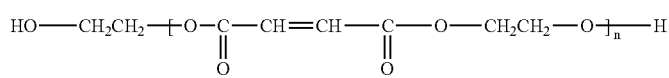
(No. 19)

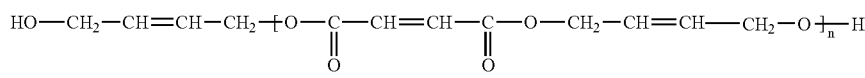
(No. 20)

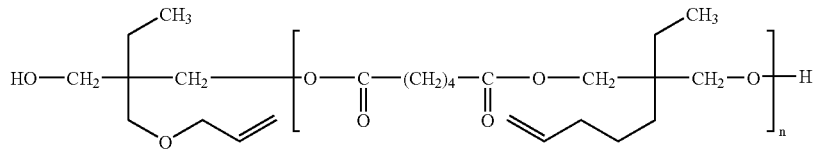
(No. 21)

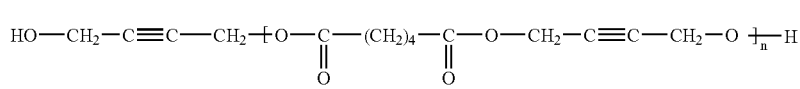
(No. 22)

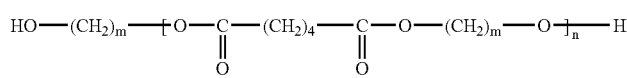
(No, 23)

m = 2, 4

Furthermore, the diol compounds as recited above can also be used in combination with diol compounds that have no carboxyl group and may have other substituents incapable of reacting with isocyanate. Such diol compounds include the following.

HO-L$_6$-O—CO-L$_7$-CO—O-L$_6$-OH (11)

HO-L$_7$-CO—O-L$_6$-OH (12)

In these formulae, L$_6$ and L$_7$ may be the same or different, and each of them represents a divalent aliphatic hydrocarbon, aromatic hydrocarbon or heterocycle residue which may have a substituent (examples of which include an alkyl group, an aralkyl group, an aryl group, an alkoxy group, an aryloxy group and a halogen atom (—F, —Cl, —Br or —I)). Each of L$_6$s and L$_7$ may further have another functional group which cannot react with an isocyanate group, such as a carbonyl, ester, urethane, amido or ureido group, if needed. Additionally, L$_6$ and L$_7$ may combine with each other to form a ring.

Examples of compounds represented by formulae (11) and (12) include the following compounds.

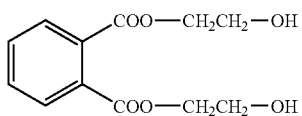
(No. 101)
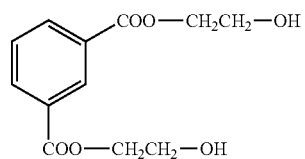
(No. 102)
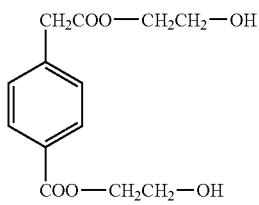
(No. 103)
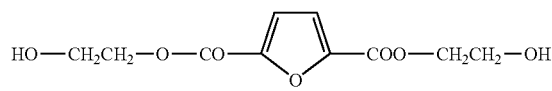
(No. 104)
HO—CH$_2$CH$_2$—O—CO—CH=CH—COO—CH$_2$CH$_2$—OH (No. 105)
HO—CH$_2$CH$_2$—O—COC$_{11}$H$_{22}$COO—CH$_2$CH$_2$—OH (No. 106)
HO—CH$_2$CH$_2$—O—COC$_{12}$H$_{24}$COO—CH$_2$CH$_2$—OH (No. 107)
HO—CH$_2$CH$_2$—O—COC$_{14}$H$_{28}$COO—CH$_2$CH$_2$—OH (No. 108)
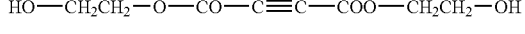
(No. 109)
HO—CH$_2$CH$_2$—O—CO—C≡C—COO—CH$_2$CH$_2$—OH (No. 110)
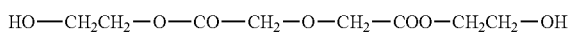
(No. 111)
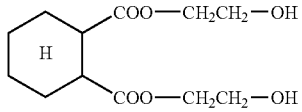
(No. 112)
HO—CH$_2$CH$_2$—O—CO—CH$_2$—O—CH$_2$—COO—CH$_2$CH$_2$—OH (No. 113)
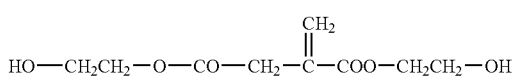
(No. 114)
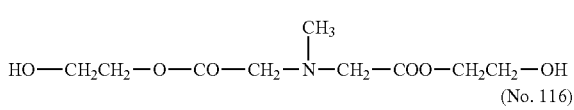
(No. 115)
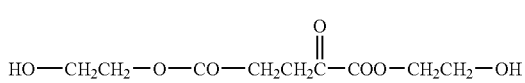
(No. 116)
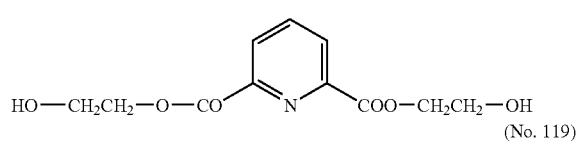
(No. 117)
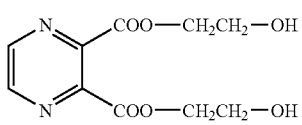
(No. 118)
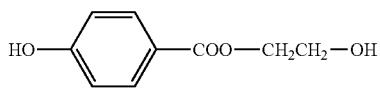
(No. 119)
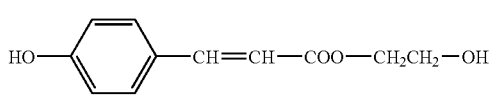
(No. 120)
(No. 121)
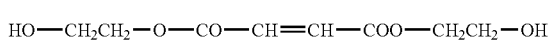
(No. 122)
HO—CH$_2$CH$_2$—COO—CH$_2$CH$_2$—OH (No. 123)

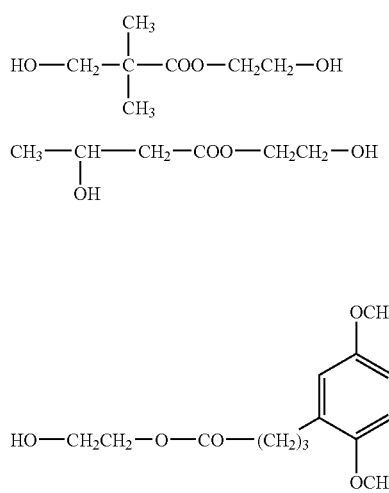
(No. 124)

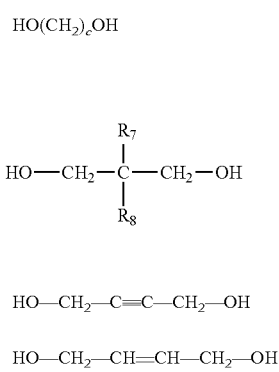

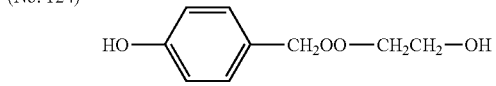
(No. 125)

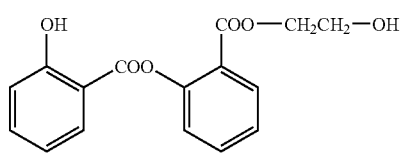
(No. 126)

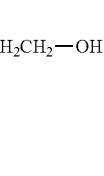
(No. 127)

(No. 128)

The diol compounds illustrated below can also be used suitably.

$$HO(CH_2)_cOH \quad (15)$$

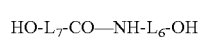
(16)

$$HO-CH_2-C(R_7)(R_8)-CH_2-OH$$

$$HO-CH_2-C\equiv C-CH_2-OH \quad (17)$$

$$HO-CH_2-CH=CH-CH_2-OH \quad (18)$$

In formula (16), $R_7$ and $R_8$ may be the same or different, and each of them represents an alkyl group which may have a substituent. c in formula (15) has the same meaning as mentioned hereinbefore, and represents an integer of 2 or more, preferably an integer of 2 to 100.

Diol compounds represented by formulae (15) to (18) are specifically mentioned below. Examples of the diol compound represented by formula (15) include ethylene glycol, 1,3-propanediol, 1,4-butanediol, 1,5-pentanediol, 1,6-hexanediol, 1,7-heptanediol and 1,8-octanediol, and examples of the diol compound represented by formula (16) include the following compounds.

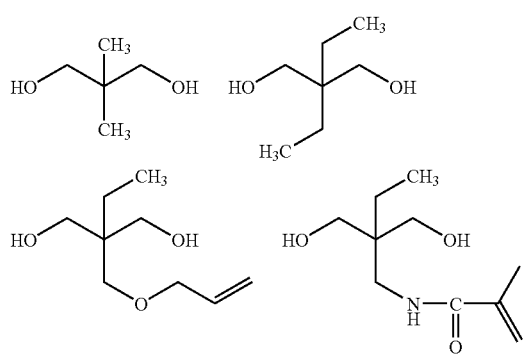

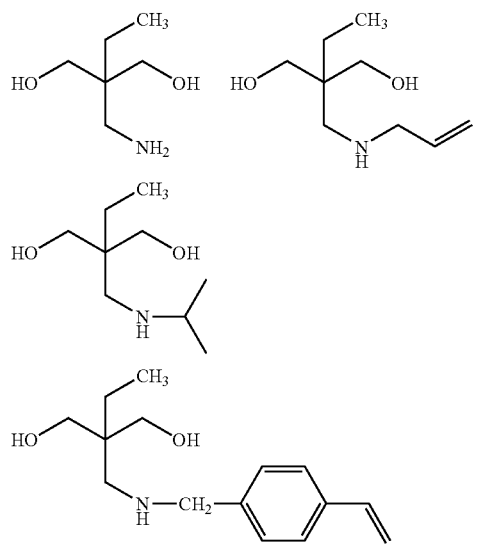

The compound of formula (17) is 2-butene-1,4-diol, and the compounds of formula (18) are cis-2-butene-1,4-diol and trans-2-butene-1,4-diol.

In addition, the following diol compounds can also be used suitably.

$$HO-L_6-NH-CO-L_7-CO-NH-L_6-OH \quad (19)$$

$$HO-L_7-CO-NH-L_6-OH \quad (20)$$

In these formulae, $L_6$ and $L_7$ may be the same or different, and each of them represents a divalent aliphatic hydrocarbon, aromatic hydrocarbon or heterocycle residue which may have a substituent (examples of which include an alkyl group, an aralkyl group, an aryl group, an alkoxy group, an aryloxy group and a halogen atom (—F, —Cl, —Br or —I)). Each of $L_6$s and $L_7$ may further have another functional group which cannot react with an isocyanate group, such as a carbonyl, ester, urethane, amido or ureido group, if needed. Additionally, $L_6$ and $L_7$ may combine with each other to form a ring.

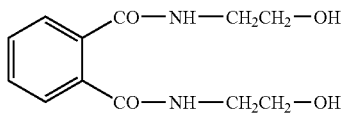 (No. 201)

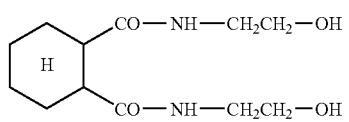 (No. 210)

In addition, examples of compounds represented by formulae (19) and (20) include the following compounds.

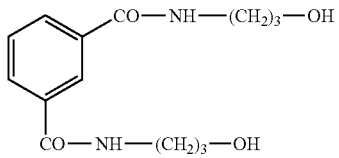 (No. 211)

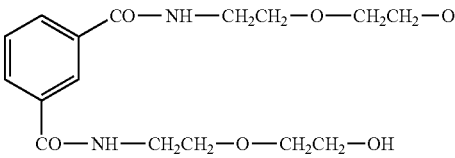 (No. 212)

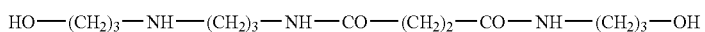 (No. 213)

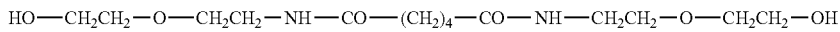 (No. 214)

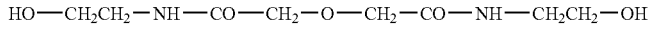 (No. 215)

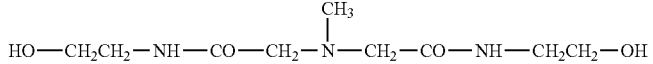 (No. 216)

 (No. 217)

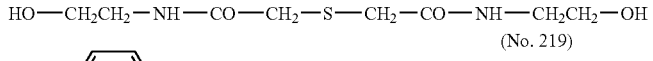 (No. 218)

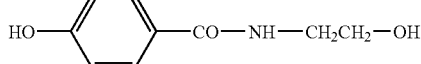 (No. 219)

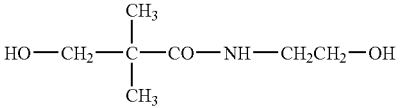 (No. 220)

-continued

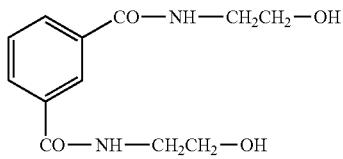 (No. 202)

Furthermore, the diol compounds illustrated below can also be used suitably.

$$\text{HO-AR}_2\text{-(L}_{16}\text{-AR}_3)_n\text{—OH} \quad (21)$$

$$\text{HO-AR}_2\text{-L}_{16}\text{-OH} \quad (22)$$

In these formulae, $L_{16}$ represents a divalent aliphatic hydrocarbon residue which may have a substituent (suitable examples of which include alkyl, aralkyl, aryl, alkoxy, aryloxy and halogeno groups). Another functional group incapable of reacting with an isocyanate group, such as an ester, urethane, amido or ureido group, may be present in $L_{16}$ as required. $AR_2$ and $AR_3$ may be the same or different, and each of them represents a divalent aromatic hydrocarbon residue which may have a substituent, preferably an aromatic group having 6 to 15 carbon atoms. n represents an integer of 0 to 10.

Examples of diol compounds represented by formulae (21) and (22) include catechol, resorcinol, hydroquinone, 4-methylcatechol, 4-t-butylcatechol, 4-acetylcatechol, 3-methoxycatechol, 4-phenylcatechol, 4-methylresorcinol, 4-ethylresorcinol, 4-t-butylresorcinol, 4-hexylresorcinol, 4-chlororesorcinol, 4-benzylresorcinol, 4-acetylresorcinol, 4-carbomethoxyresorcinol, 2-methylresorcinol, 5-methylresorcinol, t-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)

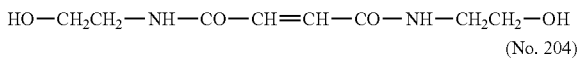 (No. 203)

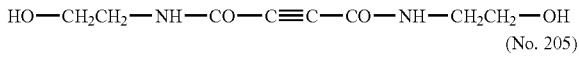 (No. 204)

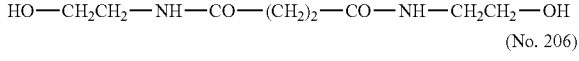 (No. 205)

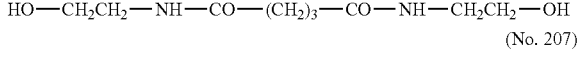 (No. 206)

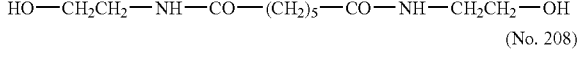 (No. 207)

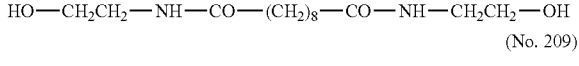 (No. 208)

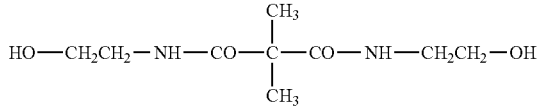 (No. 209)

hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate and resorcinol mono-2-hydroxyethyl ether.

Similarly to diol compounds, amino group-containing compounds shown below may also be allowed to react with diisocyanate compounds represented by formula (1)', thereby forming urea structures and being incorporated into polyurethane resin structures.

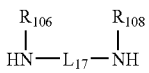  (31)

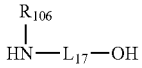  (32)

In the above formulae, $R_{106}$ and $R_{108}$ may be the same or different, and each of them represents a hydrogen atom or an alkyl, aralkyl or aryl group which may have a substituent (such as an alkoxy group, a halogen atom (—F, —Cl, —Br or —I), an ester group or a carboxyl group), preferably a hydrogen atom, an alkyl group having 1 to 8 carbon atoms which may have a carboxyl group as a substituent, or an aryl group having 6 to 15 carbon atoms. $L_{17}$ represents a divalent aliphatic hydrocarbon, aromatic hydrocarbon or heterocycle residue which may have a substituent (such as an alkyl group, an aralkyl group, an aryl group, an alkoxy group, an aryloxy group, a halogen atom (—F, —Cl, —Br or —I), or a carboxyl group). Another functional group incapable of reacting with an isocyanate group, such as a carbonyl, ester, urethane or amido group, may be present in $L_{17}$ as required. Alternatively, any two of $R_{106}$, $L_{17}$ and $R_{108}$ may combine with each other to form a ring.

Examples of compounds represented by formulae (31) and (32) include aliphatic diamine compounds, such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperizine, N,N-dimethylethylenediamine, lysine, L-cystine and isophoronediamine; aromatic diamine compounds, such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds, such as 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-s-triazine, 2,6-diaminopyridine, L-histidine, DL-tryptophan and adenine; and aminoalcohol and aminophenol compounds, such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2- aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycin, 2-aminobenzyl alcohol, 4-aminophenethyl alcohol, 2-carboxy-5-amino-1-naphthol and L-tyrosine.

Polyurethane resins usable in the invention can be synthesized by dissolving both isocyanate and diol compounds as recited above into aprotic solvents, adding thereto known catalysts having activities appropriate to reactivities of the compounds dissolved therein, and then applying heat thereto. Therein, the ratio between diisocyanate and diol compounds is preferably from 0.8:1 to 1.2:1 by mole and, when isocyanate groups remain at polymer terminals, synthesis products are treated with alcohol or amine compounds and thereby the intended resins free of isocyanate groups are eventually synthesized.

Examples of a polyurethane resin preferably used in the invention include the following compounds, but not limited to them.

| | Diisacyanate used (mol %) | Diol used (mol %) |
|---|---|---|
| Polyurethane (A-1) | OCN~~~NCO (50) | HO-CH(CH₂-O=P(OH)₂)-OH (50) |
| Polyurethane (A-2) | OCN~~~NCO (50) | HO-C(CH₃)(CH₂OH)-C(=O)-NH-(CH₂)₃-P(=O)(OH)₂ (50) |
| Polyurethane (A-3) | OCN~~~NCO (50) | HO-CH₂CH₂-N(CH₂CH₂OH)-CH₂-P(=O)(OH)₂ (50) |

| | Weight-average Molecular Weight |
|---|---|
| Polyurethane (A-1) | 12,000 |
| Polyurethane (A-2) | 18,000 |
| Polyurethane (A-3) | 28,000 |

SYNTHESIS EXAMPLE OF POLYURETHANE RESIN

SYNTHESIS EXAMPLE 1

By means of a 500 ml of three-necked flask, 125 g of 1,6-hexanediisocyanate and 67 g of 2,3-dihydroxypropylphosphonate were dissolved in 290 ml of dioxane. After adding thereto 1 g of N,N-diethylaniline, the resulting solution was stirred under reflux of dioxane for 6 hours. At the conclusion of the reaction, the reaction mixture was added little by little to a solution containing 40 cc of acetic acid in 4 L of water, thereby precipitating a polymer. The solid thus obtained was vacuum-dried to yield 185 g of polyurethane resin (A-1). The phosphoric acid group content in the resin obtained was found to be 2.12 meq/g. The weight-average molecular weight of the resin obtained was found to be 12,000 as measured by GPC and calculated in terms of polystyrene.

(1-2) Polyester Resin

It is also preferable that polyester resins having their weight-average molecular weights in the specified range are used as phosphoric acid group-containing polymers for use in the invention. The polyester resins usable in the invention can be synthesized according to the following method (1) or (2):

(1) A method of inducing reaction between a dicarboxylic acid or a derivative thereof and a diol compound represented by formula (23), (24) or (25) described in paragraph (1-1) Polyurethane Resin, and (2) A method of synthesizing a polyester resin having hydroxyl groups at its terminals through reaction between an excessive amount of diol compound and a dicarboxylic acid or a derivative thereof, and then reacting the polyester resin with a tetracarboxylic acid dianhydride.

In the method (1), a diol compound having no phosphoric acid group can further be used too. As the diol compound, diol compounds usable in the method (2) can be used.

Examples of a phosphoric acid group-free diol compound additionally usable in the method (1) and a diol compound usable in the method (2) include the following:

Ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2,2,4-trimethyl-1,3-pentanediol, 1,4-bis(β-hydroxyethoxy)cyclohexane, cyclohexanedimethanol, tricyclodecanedimethanol, hydrogenated bisphenol A, hydrogenated bisphenol F, ethylene oxide adducts of bisphenol A, propylene oxide adducts of bisphenol A, ethylene oxide adducts of bisphenol F, propylene oxide adducts of bisphenol F, ethylene oxide adducts of hydrogenated bisphenol A, propylene oxide adducts of hydrogenated bisphenol A, hydroquinone dihydroxyethyl ether, p-xylylene glycol and bis(2-hydroxyethyl) isophthalate. Of these diol compounds, the diol compounds having aromatic groups and the 2-10C aliphatic diol compounds are especially preferred as diol compounds for use in the methods (1) and (2).

Examples of dicarboxylic acids or their derivatives usable in the methods (1) and (2) include succinic acid, adipic acid, azelaic acid, sebacic acid, phthalic acid, isophthalic acid, terephthalic acid, tetrahydrophthalic acid, hexahydrophthalic acid, tetrabromophthalic acid, tetrachlorophthalic acid, 1,4-cyclohexanedicarboxylic acid, carboxynorbonanic acid, 5-sodiumsulfoisophthalic acid, 4-hydroxybenzylidenemalonic acid, 3-hydroxyphthalic acid, or derivatives of the dicarboxylic acids recited above. Of these compounds, the dicarboxylic acids having aromatic groups or derivatives thereof and the 2-10C aliphatic dicarboxylic acids or derivative thereof are especially preferred as the dicarboxylic acids or derivative thereof for use in the methods (1) and (2).

Examples of a tetracarboxylic acid dianhydride usable in the method (2) include compounds represented by the following formula (II).

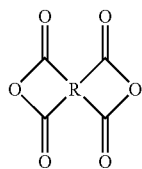

(II)

In formula (II), R represents a tetravelent organic group having at least two carbon atoms.

Examples of a tetracarboxylic acid dianhydride include aromatic tetracarboxylic acid dianhydrides, such as pyromellitic acid dianhydride, 3,3',4,4'-benzophenonetetracarboxylic acid dianhydride, 2,3,7-naphthalenetetracarboxylic acid dianhydride, 1,4,5,8-naphthalenetetracarboxylic acid dianhydride, 4,4'-sulfonyldiphthalic acid dianhydride, 2,2-bis(3,4-dicarboxyphenyl)propane dianhydride, 4,4'-{3,3'-(alkylphophoryldiphenylene)-bis(iminocarbonyl)}diphthalic acid dianhydride, an adduct of hydroquinone diacetate and trimellitic acid anhydride and an adduct of diacetyl diamine and trimellitic acid anhydride; and aliphatic or alicyclic tetracarboxylic acid dianhydrides, such as butane-1,2,3,4-tetracarboxylic acid dianhydride or cyclopentanetetracarboxylic acid dianhydride. Of these compounds, the aromatic tetracarboxylic acid anhydrides are preferred over the others.

The polyester resins can be easily produced according to the methods described, e.g., in Ogata, Koza Jugo Hanno-ron 9 Jushukugo, Kagagu-dojin Publishing Company, Inc., JP-A No. 60-165646 and U.S. Pat. No. 3,622,320.

In the methods (1) and (2), it is possible to heighten the molecular weight of a polyester resin produced by synthesizing a side-chain carboxyl group-containing polyester resin so that the resin synthesized has terminal hydroxyl groups, and further allowing the polyester resin to react with a compound having at least two per molecule of functional groups capable of reacting with the terminal hydroxyl groups (referred to as a chain elongating agent). Examples of a chain elongating agent having functional groups capable of reacting with terminal hydroxyl groups include diaryl oxalate compounds, diaryl phthalate compounds, diaryl carbonate compounds, bis(N-acyllactam) compounds, bis(N-acylimide) compounds, bisbenzoxadinone compounds, polyisocyanate compounds, bisoxazolone compounds, bis(N-acylimidazole) compounds, alkoxysilane compounds, silanol compounds, furoxane compounds, bisaziridine compounds, polyisothiocyanate compounds, divinyl ether compounds, diketene acetal compounds, unsaturated cycloacetal compounds and biscarbodiimide compounds.

The high-molecular-weight polyester resins produced through reaction with chain elongating agents can be easily synthesized according to, e.g., the method disclosed in JP-A No. 60-191244.

In addition, the polyester resins can also have carbon-carbon unsaturated bonding in their side chains. The term carbon-carbon unsaturated bonding includes both ethylenic bonding and acetylenic bonding, but ethylenic unsaturated bonding is preferable. Examples of an especially suitable side chain having unsaturated bonding include those represented by the following formulae (III) to (VI).

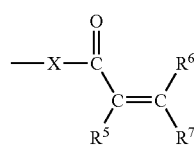

(III)

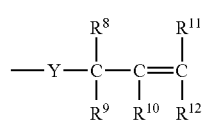

(IV)

In formula (III), $R^5$ to $R^7$ each independently represent a hydrogen atom or a univalent organic group independently. $R^5$ is preferably a hydrogen atom or an alkyl group which may have a substituent, and a hydrogen atom or a methyl group is particularly suitable as $R^5$ in terms of its high radical reactivity. $R^6$ and $R^7$ each independently represents a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Of the foregoing, a hydrogen atom, a carboxyl group, an alkoxycarbonyl group, an alkyl group which may have a substituent and an aryl group which may have a substituent are preferred over the others in terms of their high radical reactivity. When the substituents recited above contain carbon atoms, the total carbon number of each substituent is preferably from 1 to 12, far preferably from 1 to 6. X represents an oxygen atom, a sulfur atom or $—N(R^{17})$, and $R^{17}$ represents a hydrogen atom or a univalent organic group. Herein, the univalent organic group of $R^{17}$ is, e.g., an alkyl group which may have a substituent. Of the foregoing, a hydrogen atom, a methyl group, an ethyl group and an isopropyl group are preferred over the others in terms of their high radical reactivity. Examples of a substituent which can be introduced therein include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group. When the substituents recited herein contain carbon atoms, the total carbon number of each substituent is preferably from 1 to 12, far preferably from 1 to 6.

In formula (IV), $R^8$ to $R^{12}$ each independently represent a hydrogen atom or a univalent organic group independently. Each of $R^8$ to $R^{12}$ is preferably a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Of the foregoing, a hydrogen atom, a carboxyl group, an alkoxycarbonyl group, an alkyl group which may have a substituent and an aryl group which may have a substituent are preferred over the others in point of reactivity. When the substituents recited herein contain carbon atoms, the total carbon number of each substituent is preferably from 1 to 12, far preferably from 1 to 6. Examples of substituents which can be introduced therein include the same ones as in formula (III).

Y represents an oxygen atom, a sulfur atom or $—N(R^{18})—$. $R^{18}$ has the same meaning as $R^{17}$ in formula (III), and suitable examples thereof include the same as those of In formula (V), $R^{13}$ to $R^{15}$ each independently represent a hydrogen atom or a univalent organic group.

$R^{13}$ is preferably a hydrogen atom or an alkyl group which may have a substituent, and a hydrogen atom and a methyl group in particular are suitable as $R^{13}$ in terms of their high radical reactivity. $R^{14}$ and $R^{15}$ each independently represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Of the foregoing, a hydrogen atom, a carboxyl group, an alkoxycarbonyl group, an alkyl group which may have a substituent and an aryl group which may have a substituent are preferred over the others in terms of their high radical reactivity. When the substituents recited above contain carbon atoms, the total carbon number of each substituent is preferably from 1 to 12, far preferably from 1 to 6. Examples of substituents which can be introduced therein include the same ones as in formula (III). And Z represents an oxygen atom, a sulfur atom, $—N(R^{18})—$ or a phenylene group which may have a substituent. $R^{18}$ has the same meaning as in $R^{17}$ in formula (III), and suitable examples thereof include the same as those in formula (III).

In formula (VI), $R^{16}$ represents a hydrogen atom or a univalent organic group. $R^{16}$ is preferably a hydrogen atom, an alkyl group which may have a substituent, or an aromatic group which may have a substituent. Of the foregoing, a hydrogen atom, a methyl group and a phenyl group which may have a substituent are preferred over the others in terms of their high radical reactivity. A represents an alkylene group which may have a substituent, or a phenylene group which may have a substituent. Among them, a methylene group is preferred over the others in terms of high radical reactivity. Examples of substituents which can be introduced herein include the same as those in formula (III).

Each of the carbon-carbon unsaturated bonds can be introduced in accordance with the following method (3) or (4).

(3) A dicarboxylic acid having a carbon-carbon unsaturated bond or its derivative is used as or in combination with a dicarboxylic acid or its derivative used in the foregoing method (1) or (2).

(4) A part of carboxyl groups in the specified polyester resin having carboxyl groups in its side chains which are synthesized according to the method (1) or (2) are made to react with a halide or epoxy compound having a carbon-carbon unsaturated bond.

Examples of a dicarboxylic acid having a carbon-carbon unsaturated bond and its derivative usable in the method (3) include maleic acid, fumaric acid, itaconic acid, citraconic acid, tetrahydrophthalic acid, Himic acid, p-phenylenediacrylic acid, m-phenylenediacrylic acid, cinnamylidenemalonic acid, p-carboxycinnamic acid, and anhydrides and ester derivatives of the dicarboxylic acids recited above. Of the foregoing, fumaric acid, itaconic acid, citraconic acid, p-phenylenediacrylic acid, m-phenylenediacrylic acid, and anhydrides and ester derivative of those dicarboxylic acids in particular are preferred.

Examples of carbon-carbon unsaturated bond-containing halide and epoxy compounds usable in the method (4) include halides such as allyl bromide, 2-butenyl bromide, 1-phenyl-1-propenyl-3-bromide, 2-bromoethyl cinnamate, bromomethylstyrene, chloromethylstyrene, propargyl bromide and bromo-2-butyne; and epoxy compounds such as allyl glycidyl ether, 2-butenyl glycidyl ether, 1-phenylpropenyl glycidyl ether, glycidyl acrylate, glycidyl methacrylate, glycidyl cinnamate, propargyl glycidyl ether and the epoxy compounds illustrated below. Of these compounds, halogenated compounds including allyl bromide, chloromethylstyrene and propargyl bromide, and epoxy compounds including allyl glycidyl ether, glycidyl acrylate, glycidyl methacrylate and the cyclic epoxy compounds as illustrated below are preferred over the others.

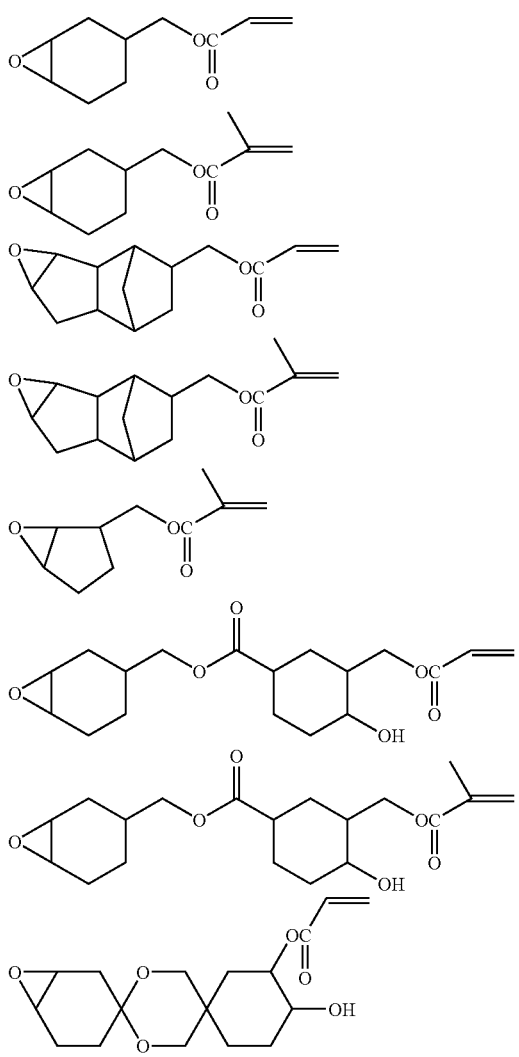

The carbon-carbon unsaturated bonds are introduced into the polyester resin so as to have a content of preferably 0.1 to 3.0 meq/g, far preferably from 0.5 to 3.0 meq/g, based on 1 g of the polyester resin. When the content is 0.1 meq/g or more, introduction of carbon-carbon unsaturated bonds can produce a sufficient effect in increasing the sensitivity and, when the content is 3.0 meq/g or below, there is a tendency to ensure sufficient storage stability.

The degree of polydispersion (weight-average molecular weight/number-average molecular weight ratio) is preferably 1 or more, far preferably 1.1 to 10. When the weight-average molecular weight is in such a range, the present ink composition can have excellent storage stability. In addition, the polyester resin may have another linkage, such as a urethane, ester, ureido or ether linkage, in its chain.

Examples of a compound more suitable as the polyester resin include the following, but not limited thereto.

| | Carboxylic acids used (mol %) | | Diol used (mol %) |
|---|---|---|---|
| Polyester (B-1) | (10) | (40) | (50) |
| Polyester (B-2) | (10) | (40) | (50) |
| Polyester (B-3) | (10) | (40) | (50) |

| | Weight-average Molecular Weight |
|---|---|
| Polyester (B-1) | 14,000 |
| Polyester (B-2) | 17,000 |
| Polyester (B-3) | 24,000 |

SYNTHESIS EXAMPLE OF POLYESTER RESIN (B-1)

To a mixture (raw material component of Polyester Resin (B-1)) of 100 g of succinic acid anhydride (dicarboxylic acid component) and 206.4 g of 2,3-dihydroxypropyl phosphate (diol component), 0.5 wt % of dibuyltin laurate was added. The resulting mixture was heated to 180° C. and stirred for 3 hours in an atmosphere of nitrogen gas, thereby making the dicarboxylic acid component react with the diol component. Under the same temperature, the pressure inside the reaction vessel was reduced to 50 mmHg, and distillates were removed while stirring the reaction mixture for additional three hours under heating. The temperature of the reaction vessel was restored to room temperature, and then N,N-dimethylacetamide was added as a solvent to prepare a 60 wt % solution. Thereto, pyromellitic acid anhydride (tetracarboxylic acid anhydride, a raw material component of Polyester Resin (B-1)) was added with stirring, and heated to 110° C. Therein, reaction was continued for 8 hours, and the reaction product obtained was diluted with Rapi-Cure DVE-3 (a vinyl ether compound, a product of ISP Europe) to prepare a 20 wt % solution containing Polyester Resin (B-1).

(1-3) Polyurea Resin

As the phosphoric acid group-containing polymer in the invention, it is also preferable to use a polyurea resin having the specified weight-average molecular weight.

The polyurea resin is preferably insoluble in water and soluble in alkali, but has no other particular restrictions so long as it has a urea linkage in its polymer's principal chain. The term "urea linkage", though generally refers to —NH—CO—NH—, is intended herein to include structures formed by substituting an arbitrary substituent for hydrogen of each —NH—. Examples of such a urea linkage in the invention include linkages represented by the following formula (a).

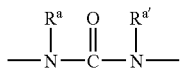
(a)

In formula (a), $R^a$ and $R^{a'}$ each independently represent a hydrogen atom, an alkyl group, an aryl group or an aralkyl group independently. In the invention, the case where both $R^a$ and $R^{a'}$ are hydrogen atoms is preferred. When $R^a$ and $R^{a'}$ are alkyl groups, the number of carbon atoms in each alkyl group is preferably on the order of 1 to 20, far preferably on the order of 1 to 6. When $R^a$ and $R^{a'}$ are aryl groups, the number of carbon atoms in each aryl group is preferably on the order of 6 to 24, far preferably on the order of 6 to 15. When $R^a$ and $R^{a'}$ are aralkyl groups, the number of carbon atoms in each aralkyl group is preferably on the order of 7 to 24, far preferably on the order of 7 to 15. In addition, a ring structure may be formed by combining at least either of substituents represented by $R^a$ and $R^{a'}$ with the other bonding hand of the nitrogen atom to which the substituent is attached. For instance, the linkage represented by the following formula is also included in the urea linkage in the invention.

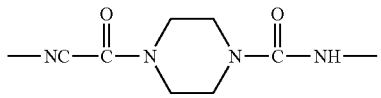

An example of a method of introducing such a urea linkage into the principal chain of a polymer is a method of allowing isocyanate groups to react with a primary or secondary amine. The polyurea resin preferred in the invention is a high polymer compound having as its basic skeleton a product of reaction between at least one kind of diisocyanate compound represented by the following formula (I), at least one kind of diol compound of formula (23), (24) or (25) mentioned in the foregoing paragraph (1-1) Polyurethane Resin, and at least one kind of compound capable of introducing urea linkage into the polymer's principal chain, such as a primary or secondary amine.

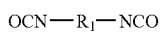
(I)

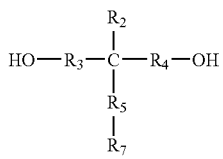
(II)

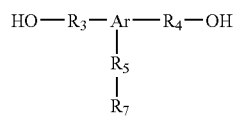
(III)

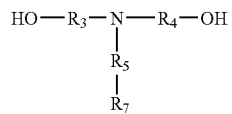
(IV)

In formula (I), $R_1$ represents a divalent linkage group. Examples of such a linkage group include linkage groups derived from aliphatic hydrocarbon, alicyclic hydrocarbon and aromatic hydrocarbon compounds, preferably alkylene groups having 2 to 12 carbon atoms and arylene groups having 6 to 20 carbon atoms. The arylene groups may be groups formed by combining at least two ring structures via a single bond or a divalent organic linkage group such as a methylene group, or groups forming condensed polycyclic structures. In addition, when required, $R_1$ may have another functional group incapable of reacting with the isocyanate groups in formula (I), such as an ester, urethane or amido group.

$R_1$ may further have a substituent. Examples of a substituent which can preferably be introduced into $R_1$ include an alkyl group, an aralkyl group, an aryl group, an alkoxy group and a halogen atom (—F, —Cl—, —Br or —I).

In addition to the compounds within the coverage of the foregoing formula (I), high-molecular-weight diisocyanate compounds having isocyanate groups at both terminals of their corresponding high-molecular-weight compounds, such as oligomers or polymers, produced from diol compounds described hereinafter may also be included in diisocyanate compounds usable in the invention.

Examples of such diisocyanate compounds include the following compounds, but these compounds should not be construed as limiting the scope of the invention.

Specifically, the diisocyanate compounds usable in the invention include aromatic diisocyanate compounds, such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthalene diisocyanate and 3,3'-dimethylbiphenyl-4,4'-diisocyanate; aliphatic diisocyanate compounds, such as hexamethylene diisocyanate, trimethylhexamethylene diisocyanate, lysine diisocyanate and dimer acid diisocyanate; alicyclic diisocyanate compounds, such as isophorone diisocyanate, 4,4'-methylenebis(cyclohexylisocyanate), methylcyclohexane-2,4-(or 2,6-)diisocyanate and 1,3-di(isocyanatemethyl)cyclohexane; and diisocyanate compounds as products of reaction between diol and diisocyanate compounds, such as an adduct of one mole of 1,3-butylene glycol and two moles of tolylene diisocyanate. Of these compounds, 4,4'-diphenylmethane diisocyanate, p-xylene diisocyanate and 3,3'-dimethylbiphenyl-4,4'-diisocyanate are preferred over the others in terms of sensitivity and chemical resistance.

The primary or secondary amine used in the polyurea resin has no particular restriction, and examples thereof include compounds having at least one primary or secondary amino group per molecule, such as aliphatic diamine compounds, aromatic diamine compounds, heterocyclic amine compounds, and amino-alcohol or aminophenol compounds, and compounds having urea linkage introduced in advance into their respective molecules (hereinafter referred to as "urea compounds" for convenience sake). Of these compounds, primary aliphatic diamine and primary aromatic diamine in particular are preferred from the viewpoint of sensitivity. Examples of such compounds include the compounds recited below, but these compounds should not be construed as limiting the scope of the invention.

Examples of the aliphatic diamine compound include ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperizine, N,N-dimethylethylenediamine, lysine and L-cystine. Of these diamine compounds, ethylenediamine, propylenediamine, tetramethylenediamine and hexamethylenediamine are especially preferable to the others.

Examples of the aromatic diamine compounds include o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl)sulfone, 4-carboxy-o-phenylenediamine, 3-carboxy-m-phenylenediamine, 4,4'-diaminodiphenyl ether and 1,8-naphthalenediamine. Of these compounds, m-phenylenediamine and 4,4'-diaminophenyl ether are especially preferable to the others.

Examples of the heterocyclic amine compounds include 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-s-triazine, 2,6-diaminopyridine, L-histidine, DL-tryptophan and adenine.

Examples of the amino-alcohol or aminophenol compounds include ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycin, 2-aminobenzyl alcohol, 4-aminophenethyl alcohol, 2-carboxy-5-amino-1-naphthol and L-tyrosine. Of these compounds, m-aminophenol and 4-aminophenethyl alcohol are especially preferable to the others.

The urea compounds for use in the invention are compounds having at least one urea linkage per molecule, and have no particular restriction so long as they can introduce urea linkage into the polymer's principal chain at the time of polymer synthesis. Examples of such a urea compound include 2,4-tolylene-bis(2-hydroxyethylcarbamide), m-xylylene-bis(2-hydroxyethylcarbamide), hexamethylene-bis (2-hydroxyethylcarbamide), 4,4'-diphenylmethane-bis(2-hydroxyethylcarbamide) and 1,5-naphthalene-bis(2-hydroxyethylcarbamide). Of these compounds, hexamethylene-bis(2-hydroxyethylcarbamide) and 4,4'-diphenylmethane-bis(2-hydroxyethylcarbamide) are especially preferable to the others.

In addition, diol compounds other than those represented by formulae (23), (24) and (25) described in the foregoing paragraph "(1-1) Polyurethane Resin" may be introduced into the principal chains of polyurea resins so long as introduction thereof does not impair effects of the invention. Examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinone dihydroxyethyl ether, p-xylylene glycol, dihydroxyethylsulfone, bis(2-hydroxyethyl)-2,4-tolylene dicarbamate, bis(2-hydroxyethyl)-m-xylylene dicarbamate and bis(2-hydroxyethyl) isophthalate.

The polyurea resins can be synthesized by dissolving the reactant ingredients as recited above in aprotic solvents, and then adding known active catalysts appropriate to reactivity of the reactants dissolved and heating them. The ratio of the sum of diol compounds represented by formulae (II) to (IV) and primary or secondary amines and/or compounds having urea linkages to diisocyanate compounds used is preferably from 0.8:1 to 1.2:1 by mole. When isocyanate groups remain at the terminals of a polymer synthesized, the polymer is treated with an alcohol or amine compound and thereby eventually rendered free of isocyanate groups. In addition, the ratio of primary or secondary amines and/or urea compounds to the diol compounds represented by formulae (II) to (IV) is preferably from 95:5 to 0:100 by mole, far preferably from 90:10 to 10:90 by mole, further preferably from 80:20 to 20:80 by mole.

Examples of polyurea resins preferred by far include the following compounds, but not limited to them.

| | Diisocyanate used (mol %) | Diamine used (mol %) | Diol used (mol %) |
|---|---|---|---|
| Polyurea (C-1) | 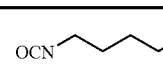 | $H_2N-(CH_2)_6-NH_2$ (10) | 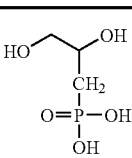 |

-continued

| | | | |
|---|---|---|---|
| Polyurea(C-2) | OCN~~~~~~NCO (40) | H₂N—(CH₂)₆—NH₂ (10) | (50) |
| Polyurea(C-3) | OCN~~~~~~NCO (40) | H₂N—(CH₂)₆—NH₂ (10) | (50) |

| | Weight-average Molecular Weight |
|---|---|
| Polyurea (C-1) | 14,000 |
| Polyurea (C-2) | 22,000 |
| Polyurea (C-3) | 25,000 |

SYNTHESIS EXAMPLE OF POLYUREA RESIN

SYNTHESIS EXAMPLE 1

In a 500-ml three-necked round bottom flask equipped with a condenser and a stirrer, 13.4 g (0.066 mole) of 2,3-dihydroxypropyl phosphonate and 2.4 g (0.040 mole) of hexamethylenediamine were dissolved in 120 ml of N,N-dimethylacetamide. Thereto, 50.1 g (0.20 mole) of hexamethylene diisocyanate was added, and heated at 100° C. for 6 hours with stirring. Then, the resulting reaction mixture was diluted with 200 ml of N,N-dimethylformamide and 50 ml of acetic acid. The reaction solution thus obtained was charged into 4 liters of water with stirring, thereby precipitating a white polymer. The white polymer was filtered, washed with water and dried under vacuum condition to obtain 759 of polymer. The number-average molecular weight of the polymer was 14,000 as measured by gel permeation chromatography (GPC) and calculated in terms of polystyrene. And the phosphoric acid group content (acid value) in white polymer [Polyurea Resin (C-1)] was 1.22 meq/g as measured by titration.

SYNTHESIS EXAMPLE 2

By using 13.4 g (0.066 mole) of 3-(1,1-bis(hydroxymethyl)ethylcarbonylamino)propyl phosphate, 4.2 g (0.04 mole) of hexamethylenediamine and 10.1 g (0.060 mole) of hexamethylene diisocyanate, reaction and after treatment were performed in similar manners as in Synthesis Example 1. Thus, 76 g of a white polymer was obtained. The number-average molecular weight of the white polymer was 22,000 as measured by GPC and calculated in terms of polystyrene. And the phosphoric acid group content (acid value) in the white polymer [Polyurea Resin (C-2)] was 1.20 meq/g as measured by titration.

(1-4) Acrylic and Methacrylic Resins

The phosphoric acid group-containing structural units in a polymer are preferably those represented by the following formula (1).

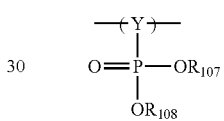

(1)

In formula (1), Y represents a trivalent linkage group, and the phosphoric acid group can be attached to a polymer's side chain via this linkage group. $R_{107}$ and $R_{108}$ may be the same or different, and each of them represents a hydrogen atom, sodium, potassium, an alkyl group or an aryl group, preferably a hydrogen atom, an alkyl group having 1 to 8 carbon atoms or an aryl group having 6 to 15 carbon atoms.

Of such structural units represented by formula (1), the preferred are those represented by the following formula (1-2), but these units should not be construed as limiting the scope of the invention.

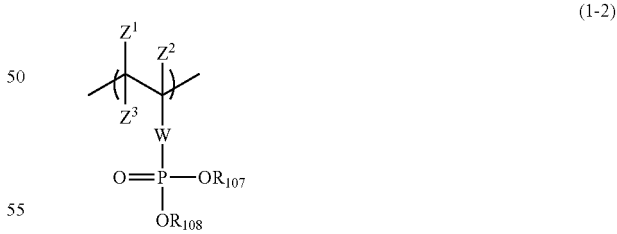

(1-2)

In formula (1-2), W represents a divalent linkage group, and $Z^1$, $Z^2$ and $Z^3$ each independently represent a hydrogen atom or a univalent organic group independently. $R_{107}$ and $R_{108}$ each independently represent a hydrogen atom, sodium, potassium, an alkyl group or an aryl group, preferably a hydrogen atom, an alkyl group having 1 to 8 carbon atoms or an aryl group having 6 to 15 carbon atoms.

In addition, two or more of such phosphoric acid groups may be present in one structural unit. Such a case can take a form that another phosphoric acid group is linked to the structural unit at the site of $Z^1$ or $Z^3$ via a linkage group W, or a form that the linkage group W has a branched structure and another phosphoric acid group is linked to one end of the branched structure.

Examples of W in formula (1-2) include a 1-20C straight-chain, branched-chain or cyclic alkylene, a 2-20C straight-chain, branched-chain or cyclic alkenylene, a 2-20C alkynylene group, a 6-20C arylene (including monocyclic and heterocyclic ones), —OC(=O)—, —OC(=O)Ar—, —OC(=O)O—, —OC(=O)OAr—, —C(=O)N(R)—, —C(=O)N(Ar)—, —SO$_2$N(R)—, —SO$_2$N(Ar)—, alkyleneoxy, polyalkyleneoxy, —OAr-(aryleneoxy or polyaryleneoxy), —C(=O)O—, —C(=O)O—Ar—, —C(=O)Ar—, —C(=O)—, —SO$_2$O—, —SO$_2$OAr—, —OSO$_2$—, —OSO$_2$Ar—, —N(R)SO$_2$—, —N(Ar)SO$_2$—, —N(R)C(=O)—, —N(Ar)C(=O)—, —N(R)C(=O)O—, —N(Ar)C(=O)O—, —OC(=O)N(R)—, —OC(=O)N(Ar)—, —N(Ar)—, —N(R)—, —N$^+$(R)(R')—, —N$^+$(R)(Ar)—, —N$^+$(Ar)(Ar')—, —S—, —SAr—, —ArS—, a heterocycle residue (a residue of 3- to 12-membered monocyclic or condensed ring containing at least one hetero atom, such as nitrogen, oxygen or sulfur), —OC(=S)—, —OC(=S)Ar—, —C(=S)O—, —C(=S)OAr—, —C(=S)OAr—, —C(=O)S—, —C(=O)SAr—, —ArC(=O)—, —ArC(=O)N(R)—, —ArC(=O)N(Ar)—, —ArC(=O)O—, —ArC(=O)S—, —ArC(=S)O—, —ArO— and —ArN(R)—.

Therein, each of R and R' represents a hydrogen atom, a straight-chain or branched alkyl group (having 1 to 20, preferably 1 to 8, carbon atoms), a chain or cyclic alkyl group (having 1 to 20, preferably 1 to 8, carbon atoms), a straight-chain or branched alkenyl group (having 2 to 20, preferably 2 to 8, carbon atoms), a chain or cyclic alkenyl group (having 2 to 20, preferably 2 to 8, carbon atoms), a straight-chain or branched alkynyl group (having 2 to 20, preferably 2 to 8, carbon atoms), or a chain or cyclic alkynyl group (having 2 to 20, preferably 2 to 8, carbon atoms) and each of Ar and Ar' represents an aryl group.

Of those linkage groups, 6-20C arylene groups (including monocyclic and heterocyclic ones), —C(=O)N(R)—, —C(=O)N(Ar)—, alkyleneoxy, polyalkyleneoxy, —OAr-(aryleneoxy or polyaryleneoxy), —C(=O)O—, —C(=O)O—Ar—, —C(=O)—, —C(=O)Ar—, —S—, —SAr—, —ArS—, —ArC(=O)—, —ArC(=O)O—, —ArO— and —ArN(R)— are preferred over the others, and 6-20C arylene groups (including monocyclic and heterocyclic ones), —C(=O)N(R)—, —C(=O)N(Ar)—, alkyleneoxy, polyalkyleneoxy, —OAr-(aryleneoxy or polyaryleneoxy), —C(=O)O—, —C(=O)O—Ar—, —SAr—, —ArS—, —ArC(=O)—, —ArC(=O)O—, —ArO— and —ArN(R)— are preferable by far.

Additionally, the linkage group represented by W in the invention may be a combination of any two or more of the linkage groups recited above.

$Z^1$, $Z^2$ and $Z^3$ in formula (1-2) are independent of one another, and each of them represents a hydrogen atom, a 1-20C straight-chain, branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl), a 2-20C straight-chain, branched-chain or cyclic alkenyl group (e.g., vinyl, 1-methylvinyl, cyclohexene-1-yl), a 2-20C alkynyl group (e.g., ethynyl, 1-propynyl), a 6-20C aryl group (e.g., phenyl, naphthyl, anthryl), a 1-20C acyloxy group (e.g., acetoxy, tetradecanoyloxy, benzoyloxy), a 2-20C alkoxycarbonyloxy group (e.g., methoxycarbonyloxy, 2-methoxyethoxycarbonyloxy), a 7-20C aryloxycarbonyloxy group (e.g., phenoxycarbonyloxy), a 1-20C carbamoyloxy group (e.g., N,N-dimethylcarbamoyloxy), a 1-20C carbonamido group (e.g., formamido, N-methylacetamido, acetamido, N-methylformamido, benzamido), a 1-20C sulfonamido group (e.g., methanesulfonamido, dodecanesulfonamido, benzenesulfonamido, p-toluenesulfonamido), a 1-20C carbamoyl group (e.g., carbamoyl, N-methylcarbamoyl, N,N-diethylcarbamoyl, N-mesylcarbamoyl), a 0-20C sulfamoyl group (e.g., sulfamoyl, N-butylsulfamoyl, N,N-diethylsulfamoyl, N-methyl-N-(4-methoxyphenyl)sulfamoyl), a 1-20C alkoxy group (e.g., methoxy, propoxy, isopropoxy, octyloxy, t-octyloxy, dodecyloxy, 2-(2,4-di-t-pentylphenoxy)ethoxy, polyalkyleneoxy), a 6-20C aryloxy group (e.g., phenoxy, 4-methoxyphenoxy, naphthoxy), a 7-20C aryloxycarbonyl group (e.g., phenoxycarbonyl, naphthoxycarbonyl), a 2-20C alkoxycarbonyl group (e.g., methoxycarbonyl, t-butoxycarbonyl), a 1-20C N-acylsulfamoyl group (e.g., N-tetradecanoylsulfamoyl, N-benzoylsulfamoyl), a 1-20C N-sulfamoylcarbamoyl group (e.g., N-methanesulfonylcarbamoyl), a 1-20C alkylsulfonyl group (e.g., methanesulfonyl, octylsulfonyl, 2-methoxyethylsulfonyl, 2-hexyldecylsulfonyl), a 6-20C arylsulfonyl group (e.g., benzenesulfonyl, p-toluenesulfonyl, 4-phenylsulfonylphenylsulfonyl), a 2-20C alkoxycarbonylamino group (e.g., ethoxycarbonylamino), a 7-20C aryloxycarbonylamino group (e.g., phenoxycarbonylamino, naphthoxycarbonylamino), a 0-20C amino group (e.g., amino, methylamino, diethylamino, diisopropylamino, anilino, morpholino), a 3-20C ammonio group (e.g., trimethylammonio, dimethylbenzylammonio), a cyano group, a nitro group, a carboxyl group, a hydroxyl group, a sulfo group, a mercapto group, a 1-20C alkylsulfinyl group (e.g., methanesulfinyl, octanesulfinyl), a 6-20C arylsulfinyl group (e.g., benzenesulfinyl, 4-chlorophenylsulfinyl, p-toluenesulfinyl), a 1-20C alkylthio group (e.g., methylthio, octylthio, cyclohexylthio), a 6-20C arylthio group (e.g., phenylthio, naphthylthio), a 1-20C ureido group (e.g., 3-methylureido, 3,3-dimethylureido, 1,3-diphenylureido), a 2-20C heterocyclic group (containing at least one hetero atom, such as nitrogen, oxygen or sulfur atom, and including 3- to 12-membered monocyclic and condensed ring residues, such as 2-furyl, 2-pyranyl, 2-pyridyl, 2-thienyl, 2-imidazolyl, morpholino, 2-quinolyl, 2-benzimidazolyl, 2-benzothiazolyl and 2-benzoxazolyl groups), a 1-20C acyl group (e.g., formyl, acetyl, benzoyl, trifluoroacetyl), a 0-20C sulfamoylamino group (e.g., N-butylsulfamoylamino, N-phenylsulfamoylamino), a 3-50C silyl group (e.g., trimethylsilyl, dimethyl-t-butylsilyl, triphenylsilyl), an azo group, or a halogen atom (e.g., fluorine atom, chlorine atom, bromine atom).

When each of $Z^1$ to $Z^3$ in formula (1-2) is a substituent other than a hydrogen atom or a halogen atom, the substituent may further have a substituent, and examples of such a substituent include the substituents recited above.

Each of $Z^1$ to $Z^3$ in formula (1-2) is preferably a hydrogen atom, a 1-20C straight-chain, branched-chain or cyclic alkyl group, a 6-20C aryl group, a 1-20C acyloxy group, a 1-20C carbonamido group, a 1-20C alkoxy group, a 6-20C aryloxy group, a 7-20C aryloxycarbonyl group, a 2-20C alkoxycarbonyl group, a 0-20C amino group, a cyano group, a hydroxyl group or a halogen atom. Of the foregoing, a hydrogen atom, a 1-20C straight-chain, branched-chain or cyclic alkyl group, a 6-20C aryl group, a 1-20C acyloxy group, a 1-20C alkoxy group, a 6-20C aryloxy group, a 7-20C aryloxycarbonyl group, a 2-20C alkoxycarbonyl group, a 0-20C amino group, a cyano group and a halogen atom are preferred over the others.

From the viewpoint of adhesion properties, it is preferable by far that the structural unit represented by formula (1-2) is a structural unit represented by the following formula (1-3).

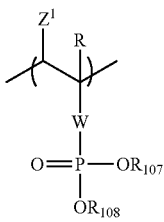

(1-3)

In formula (1-3), R represents a hydrogen atom or a methyl group. $R_{107}$ and $R_{108}$ each independently represent a hydrogen atom, sodium, potassium, an alkyl group or an aryl group, preferably a hydrogen atom, an alkyl group having 1 to 8 carbon atom or an aryl group having 6 to 15 carbon atoms.

W in formula (1-3) has the same meaning as in formula (1-2). As to the divalent substituent represented by W in formula (1-3), the following in particular are preferred examples from the viewpoint of adhesion properties, but these examples should not be construed as limiting the scope of the invention.

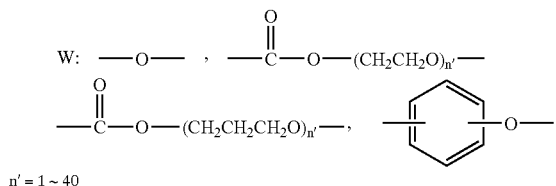

$n' = 1 \sim 40$ $Z^1$ in formula (1-3) has the same meaning as in formula (1-2). As to the univalent organic group represented by $Z^1$, the following in particular are preferred examples from the viewpoint of steady solubility in an ink composition, but these examples should not be construed as limiting the scope of the invention.

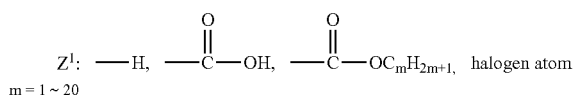

$m = 1 \sim 20$

Herein, examples of a structural unit having a phosphoric acid group relating to the invention are illustrated below, but these examples should not be construed as limiting the scope of the invention.

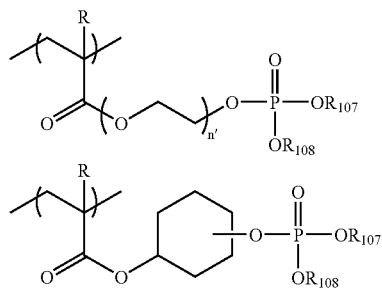

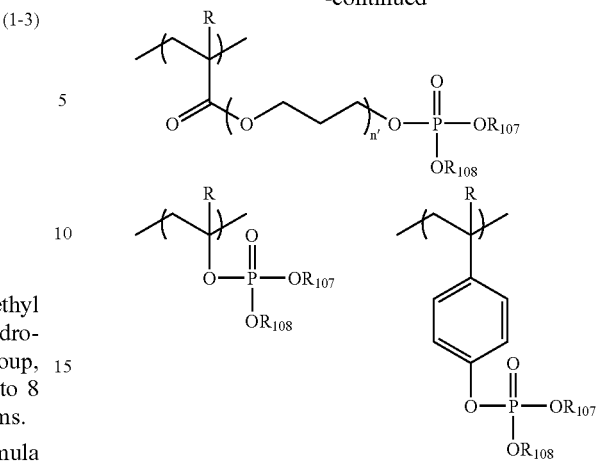

R represents a hydrogen atom or a methyl group
$n' = 1$ to 40

In the above formulae each, $R_{107}$ and $R_{108}$ each independently represent a hydrogen atom, sodium, potassium, an alkyl group or an aryl group, preferably a hydrogen atom, an alkyl group having 1 to 8 carbon atom or an aryl group having 6 to 15 carbon atoms. And n' is preferably from 0 to 5, particularly preferably from 0 to 2. In addition, a copolymerization product from a phosphoric acid group-containing monomer chosen from the above-recited ones and any of the following comonomers may be used as the specified polymer.

(1) Polymerizable monomers having phenol groups.
(2) Polymerizable monomers having sulfonamido groups.
(3) Polymerizable monomers having substituted sulfonamido groups.
(4) Polymerizable monomers having carboxylic acid groups.
(5) Polymerizable monomers having sulfonic acid groups.
(6) Acrylates and methacrylates having aliphatic hydroxyl groups, such as 2-hydroxyethyl acrylate and 2-hydroxyethyl methacrylate.
(7) Acrylates including methyl acrylate, ethyl acrylate, propyl acrylate, 2-ethylhexyl acrylate, butyl acrylate, dodecyl acrylate, amyl acrylate, benzyl acrylate, 2-chloroethyl acrylate, glycidyl acrylate, N-dimethylaminoethyl acrylate, polyethylene glycol monoacrylate and polypropylene glycol monoacrylate.
(8) Methacrylates including methyl methacrylate, ethyl methacrylate, propyl methacrylate, 2-ethylhexyl methacrylate, butyl methacrylate, dodecyl methacrylate, amyl methacrylate, cyclohexyl methacrylate, benzyl methacrylate, 2-chloroethyl methacrylate, glycidyl methacrylate, N-dimethylaminoethyl methacrylate, polyethylene glycol monomethacrylate and polypropylene glycol monomethacrylate.
(9) Acrylamides or methacrylamides including acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylmethacrylamide and N-ethyl-N-phenylacrylamide.
(10) Vinyl ethers including ethyl vinyl ether, 2-chloroethyl vinyl ether, hydroxyethyl vinyl ether, propyl vinyl ether, butyl vinyl ether and phenyl vinyl ether.
(11) Vinyl esters including vinyl acetate, vinyl chloroacetate, vinyl butyrate and vinyl benzoate.
(12) Styrenes including α-methylstyrene, methylstyrene and chloromethylstyrene.

(13) Vinyl ketones including methyl vinyl ketone, ethyl vinyl ketone, propyl vinyl ketone and phenyl vinyl ketone.

(14) Olefins including ethylene, propylene, isobutylene, butadiene and isoprene.

(15) N-vinylpyrrolidone, N-vinylcarbazole, 4-vinylpyridine, acrylonitrile and met hacrylonitrile.

(16) Unsaturated imides including maleimide, N-acryloylacrylamide, N-acetylmethacrylamide, N-propionylmethacrylamide and N-(p-chlorobenzoyl)methacrylamide.

From the viewpoint of ink solubility, it is preferable that the (meth)acrylic resin has at least one kind of comonomer chosen from the foregoing (7) or (8) as a copolymer constituent. Examples of a comonomer far preferred as the copolymer constituent include methyl acrylate, ethyl acrylate, propyl acrylate, 2-ethylhexyl acrylate, butyl acrylate, dodecyl acrylate, methyl methacrylate, ethyl methacrylate, propyl methacrylate, 2-ethylhexyl methacrylate, butyl methacrylate and dodecyl methacrylate. Of these comonomers, propyl acrylate, 2-ethylhexyl acrylate, butyl acrylate, propyl methacrylate, 2-ethylhexyl methacrylate and butyl methacrylate are further preferred over the others. A preferred polymer's form other than those recited above is (meth)acrylate resin in point of ink solubility. Examples of a comonomer preferable by far as the copolymer constituent include propyl acrylate, 2-ethylhexyl acrylate, butyl acrylate, propyl methacrylate, 2-ethylhexyl methacrylate and butyl methacrylate. The specified phosphoric acid group-containing polymers in the invention may be used alone or as mixtures of two or more thereof.

Examples of copolymers far preferred as the (meth)acrylic resins include the following, but not limited to these compounds.

Compound (D-1)

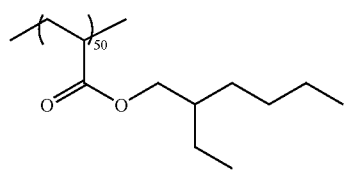

Compound (D-2)

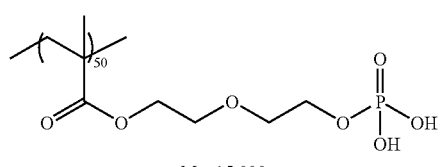

Mw 15,000

Compound (D-3)

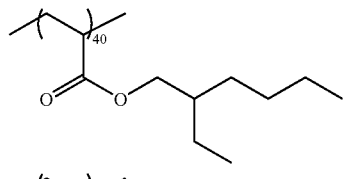

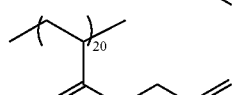

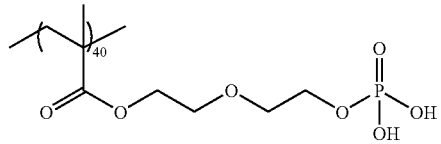

Mw 10,000

Compound (D-4)

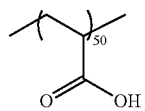

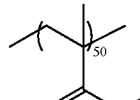

Mw 15,000

Compound (D-5)

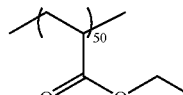

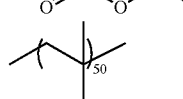

Mw 15,000

Compound (D-6)

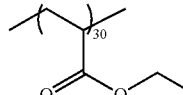

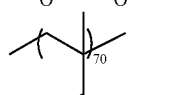

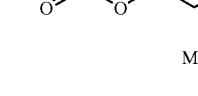

Mw 15,000

In the specified phosphoric acid group-containing polymer according to the invention, it is preferable in terms of adhesion properties and ink solubility that the phosphoric acid groups are present in a content of 0.4 meq/g or more, especially from 1.2 meq/g to 3.6 meq/g. By having a phosphoric acid group content of 0.4 meq/g or more, the polymer shows a tendency to produce a further increase in adhesion to a substrate. And in point of a trend toward a further increase in ink solubility, it is advantageous for the polymer to have a phosphoric acid group content of 3.6 meq/g or less.

The specified phosphoric acid group-containing polymers according to the invention may be used alone or as mixtures of two or more thereof. The content of the specified phosphoric acid group-containing polymers in the present ink composition is not particularly limited, but preferably from 1 to 20 mass %, far preferably from 1 to 15 mass %, particularly preferably from 1 to 10 mass %, in terms of ink solubility and ink viscosity. Additionally, combinations of the preferred aspects of the specified phosphoric acid group-containing polymers according to the invention are far preferred aspects.

(Polymerizable Compound)

For the purpose of enhancing adhesion of the present ink composition to a substrate, it is required that the specified phosphoric acid group-containing polymers be used in combination with polymerizable compounds (including cationic polymerizable compounds and radical polymerizable compounds) as polymerizable monomers described below in detail. Examples of polymerizable compounds include the epoxy compounds, oxetane compounds and vinyl ether compounds as recited below.

-Cationic Polymerizable Compound-

As the cationic polymerizable compound, various well-known cationic polymerizable monomers that have been known as a photo cationic polymerizable monomer may be used. Examples of the cationic polymerizable monomer include the epoxy compounds, the vinylether compounds, and the oxetane compounds described in, for example, Japanese Unexamined Patent Publication No. H06-9714, and Japanese Unexamined Patent Publication Nos. 2001-31892, 2001-40068, 2001-55507, 2001-310938, 2001-310937, and 2001-220526.

The epoxy compounds include aromatic epoxides, alicyclic epoxides, aromatic epoxides, and the like.

The aromatic epoxides are, for example, di- or poly-glycidyl ethers prepared in reaction of a polyvalent phenol having at least one aromatic ring or the alkyleneoxide adduct thereof with epichlorohydrin, and example thereof include di- or poly-glycidyl ethers of bisphenol A or the alkyleneoxide adduct thereof, di- or poly-glycidyl ethers of a hydrogenated bisphenol A or the alkyleneoxide adduct thereof, novolak epoxy resins, and the like. The alkyleneoxide is ethyleneoxide, propyleneoxide, or the like.

Preferable examples of the alicyclic epoxides include compounds containing cyclohexene oxide or cyclopentene oxide prepared through epoxidation of a compound having at least one cycloalkane ring such as a cyclohexene or cyclopentene ring with an appropriate oxidant such as hydrogen peroxide or peroxy acid.

Examples of the aliphatic epoxide include diglycidyl or polyglycidyl ethers of aliphatic polyhydric alcohols or alkylene oxide adducts thereof, and typical examples thereof include diglycidyl ethers of alkylene glycols such as diglycidyl ether of ethylene glycol, diglycidyl ether of propylene glycol, and diglycidyl ether of 1,6-hexanediol, polyglycidyl ethers of polyhydric alcohols such as diglycidyl or triglycidyl ether of glycerol or alkylene oxide adducts thereof, diglycidyl ethers of polyalkylene glycols such as diglycidyl ether of polyethylene glycol or alkylene oxide adducts thereof, and diglycidyl ether of polypropylene glycol or alkylene oxide adducts thereof. Examples of the alkylene oxide include ethylene oxide and propylene oxide.

The monofunctional and polyfunctional epoxy compounds for use in the invention will be described in detail below. Examples of the monofunctional epoxy compounds include phenyl glycidylether, p-tert-butylphenyl glycidylether, butyl glycidylether, 2-ethylhexyl glycidylether, allyl glycidylether, 1,2-butyleneoxide, 1,3-butadienemonooxide, 1,2-epoxydodecane, epichlorohydrin, 1,2-epoxydecane, styreneoxide, cylcohexeneoxide, 3-methacryloyloxymethylcylco- hexeneoxide, 3-acryloyloxymethylcylcohexeneoxide, 3-vinylcylcohexeneoxide, and the like.

Examples of the multifunctional epoxy compounds include bisphenol A diglycidylether, bisphenol F diglycidylether, bisphenol S diglycidylether, brominated bisphenol A diglycidylether, brominated bisphenol F diglycidylethers, brominated bisphenol S diglycidylether, epoxy novolak resins, hydrogenated bisphenol A diglycidylethers, hydrogenated bisphenol F diglycidylethers, hydrogenated bisphenol S diglycidylethers, 3,4-epoxycyclohexylmethyl-3',4'-epoxycyclohexanecarboxylate, 2-(3,4-epoxycyclohexyl-5,5-spiro-3,4-epoxy)cyclohexane-meta-dioxane, bis(3,4-epoxycyclohexylmethyl) adipate, vinylcylcohexeneoxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexanecarboxylate, methylene-bis(3,4-epoxycyclohexane), dicyclopentadiene diepoxide, ethylene glycol di(3,4-epoxycyclohexylmethyl)ether, ethylene bis(3,4-epoxycyclohexanecarboxylate), epoxyhexahydrodioctyl phthalate, epoxyhexahydrodi-2-ethylhexyl phthalate, 1,4-butanediol diglycidylether, 1,6-hexanediol diglycidylether, glycerol triglycidylether, trimethylolpropane triglycidylether, polyethylene glycol diglycidylether, polypropylene glycol diglycidylether, 1,1,3-tetradecadienedioxide, limonenedioxide, 1,2,7,8-diepoxyoctane, 1,2,5,6-diepoxycyclooctane, and the like.

Among these epoxy compounds, aromatic and alicyclic epoxides are preferable from the viewpoint of curing speed, and alicyclic epoxides are particularly preferable.

Examples of the vinyl ether compounds include di- or tri-vinyl ether compounds such as ethylene glycol divinylether, diethylene glycol divinylether, triethylene glycol divinylether, propylene glycol divinylether, dipropylene glycol divinylether, butanediol divinylether, hexanediol divinylether, cyclohexanedimethanol divinylether, and trimethylolpropane trivinylether; monovinylether compounds such as ethyl vinylether, n-butyl vinylether, isobutyl vinylether, octadecyl vinylether, cyclohexyl vinylether, hydroxybutyl vinylether, 2-ethylhexyl vinylether, cyclohexanedimethanol monovinylether, n-propyl vinylether, isopropyl vinylether, isopropenylether-O-propylene carbonate, dodecyl vinylether, diethylene glycol monovinylether, and octadecyl vinylether; and the like.

Hereinafter, the monofunctional and multifunctional vinyl ethers will be described in detail. Examples of the monofunctional vinylethers include methyl vinylether, ethyl vinylether, propyl vinylether, n-butyl vinylether, t-butyl vinylether, 2-ethylhexyl vinylether, n-nonyl vinylether, lauryl vinylether, cyclohexyl vinylether, cyclohexylmethyl vinylether, 4-methylcyclohexylmethyl vinylether, benzyl vinylether, dicyclopentenyl vinylether, 2-dicyclopentenoxyethyl vinylether, methoxyethyl vinylether, ethoxyethyl vinylether, butoxyethyl vinylether, methoxyethoxyethyl vinylether, ethoxyethoxyethyl vinylether, methoxypolyethylene glycol vinylether, tetrahydrofurfuryl vinylether, 2-hydroxyethyl vinylether, 2-hydroxypropyl vinylether, 4-hydroxybutyl vinylether, 4-hydroxymethylcyclohexylmethyl vinylether, diethylene glycol monovinylether, polyethylene glycol vinylether, chloroethyl vinylether, chlorobutyl vinylether, chloroethoxyethyl vinylether, phenylethyl vinylether, phenoxypolyethylene glycol vinylether, and the like.

Examples of the multifunctional vinylethers include divinyl ethers such as ethylene glycol divinylether, diethylene glycol divinylether, polyethylene glycol divinylether, propylene glycol divinylether, butylene glycol divinylether, hexanediol divinylether, bisphenol A alkyleneoxide divinylethers, and bisphenol F alkyleneoxide divinylethers; multifunctional vinyl ethers such as trimethylolethane trivinylether, trimethylolpropane trivinylether, ditrimethyrollpropane tetravinylether, glycerol trivinylether, pentaerythritol tetravinylether, dipentaerythritol pentavinylether, dipentaerythritol hexavinylether, ethyleneoxide adducts of trimethylolpropane trivinylether, propyleneoxide adducts of trimethylolpropane trivinylether, ethyleneoxide adducts of ditrimethyrollpropane tetravinylether, propyleneoxide adducts of ditrimethyrollpropane tetravinylether, ethyleneoxide adducts of pentaerythritol tetravinylether, propyleneoxide adducts of pentaerythritol tetravinylether, ethyleneoxide adducts of dipentaerythritol hexavinylether, and propyleneoxide adducts of dipentaerythritol hexavinylether, and the like. Examples of the multifunctional vinylethers include divinyl ethers such as ethylene glycol divinylether, diethylene glycol divinylether, polyethylene glycol divinylether, propylene glycol divinylether, butylene glycol divinylether, hexanediol divinylether, bisphenol A alkyleneoxide divinylethers, and bisphenol F alkyleneoxide divinylethers; multifunctional vinyl ethers such as trimethylolethane trivinylether, trimethylolpropane trivinylether, ditrimethyrollpropane tetravinylether, glycerol trivinylether, pentaerythritol tetravinylether, dipentaerythritol pentavinylether, dipentaerythritol hexavinylether, ethyleneoxide adducts of trimethylolpropane trivinylether, propyleneoxide adducts of trimethylolpropane trivinylether, ethyleneoxide adducts of ditrimethyrollpropane tetravinylether, propyleneoxide adducts of ditrimethyrollpropane tetravinylether, ethyleneoxide adducts of pentaerythritol tetravinylether, propyleneoxide adducts of pentaerythritol tetravinylether, ethyleneoxide adducts of dipentaerythritol hexavinylether, and propyleneoxide adducts of dipentaerythritol hexavinylether, and the like. Di- or tri-vinylether compounds are prefereble as the vinyl ether compounds, form the viewpoints of curing efficiency, adhesiveness to recording medium, and the surface hardness of formed image; and divinylether compounds are particularly preferable.

The oxetane compounds which may be used in the invention may be feely selected from known oxetane compounds such as those described in JP-A Nos. 2001-220526, 2001-310937, and 2003-341217. In the invention, the compound having an oxetane ring which may be used in combination with the specific polymerizable compound is preferably a compound having 1 to 4 oxetane rings in the structure thereof The use of the compound facilitates maintenance of the viscosity of the composition within a range which achieves favorable processability, and, in cases where the composition is used as an ink composition, ensures high adhesiveness between the cured composition and a recording medium.

Examples of the compounds having one or two oxetane rings in the molecule that are used additionally in the invention include the compounds represented by the following formulae (1) to (3), and the like.

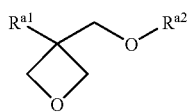

(1)

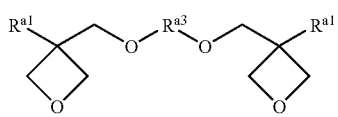

(2)

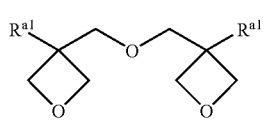

(3)

$R^{a1}$ represents a hydrogen atom, an alkyl group having 1 to 6 carbon atoms, a fluoroalkyl group having 1 to 6 carbon atoms, an allyl group, an aryl group, a furyl group, or a thienyl group. In cases where two $R^{a1}$s are present in the molecule, they may be the same or different from each other. Examples of the alkyl group include a methyl group, an ethyl group, a propyl group, and a butyl group, and any of hydrogen atoms in these alkyl groups may be substituted with a fluorine atom, which are preferable as the fluoroalkyl group.

$R^{a2}$ represents a hydrogen atom, an alkyl group having 1 to 6 carbon atoms, an alkenyl group having 2 to 6 carbon atoms, an aromatic ring-containing group, an alkylcarbonyl group having 2 to 6 carbon atoms, an alkoxycarbonyl group having 2 to 6 carbon atoms, and an N-alkylcarbamoyl group having 2 to 6 carbon atoms. Examples of the alkyl group include a methyl group, an ethyl group, a propyl group, and a butyl group. Examples of the alkenyl group include a 1-propenyl group, a 2-propenyl group, a 2-methyl-1-propenyl group, a 2-methyl-2-propenyl group, a 1-butenyl group, a 2-butenyl group, and a 3-butenyl group. Examples of the aromatic ring-containing group include a phenyl group, a benzyl group, a fluorobenzyl group, a methoxybenzyl group, and a phenoxyethyl group. Examples of the alkylcarbonyl group include an ethylcarbonyl group, a propylcarbonyl group, and a butylcarbonyl group. Examples of the alkoxycarbonyl group include an ethoxycarbonyl group, a propoxycarbonyl group, and a butoxycarbonyl group. Examples of the N-alkylcarbamoyl group include an ethylcarbamoyl group, a propylcarbamoyl group, a butylcarbamoyl group, and a pentylcarbamoyl group. $R^{a2}$ may be optionally substituted, and examples of the substituent include an alkyl group having 1 to 6 carbon atoms, and a fluorine atom.

$R^{a3}$ represents a linear or branched alkylene group, a linear, a linear or branched unsaturated hydrocarbon group, a carbonyl group or a carbonyl group-containing alkylene group, a carboxyl group-containing alkylene group, a carbamoyl group-containing alkylene group, or a group shown below. Examples of the alkylene groups include ethylene, propylene, and butylene groups and the like; and examples of the poly (alkyleneoxy) groups include poly(ethyleneoxy) and poly (propyleneoxy) groups and the like. Examples of the unsaturated hydrocarbon groups include propenylene, methylpropenylene, and butenylene groups, and the like.

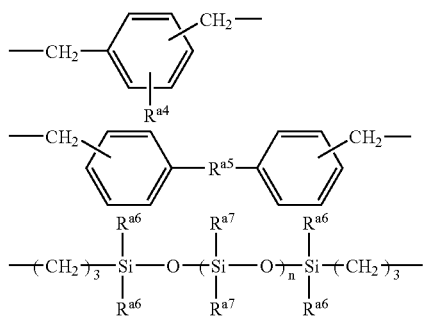

In cases where $R^{a3}$ is one of the above-described polyvalent groups, $R^{a4}$ represents a hydrogen atom, an alkyl group having 1 to 4 carbon atoms, an alkoxy group having 1 to 4 carbon atoms, a halogen atom, a nitro group, a cyano group, a mercapto group, a lower alkyl carboxyl group, a carboxyl group, or a carbamoyl group. $R^{a5}$ represents an oxygen atom, a sulfur atom, a methylene group, NH, SO, $SO_2$, $C(CF_3)_2$, or $C(CH_3)_2$. $R^{a6}$ represents an alkyl group having 1 to 4 carbon atoms, or an aryl group, and n is an integral number of 0 to 2,000. $R^{a7}$ represents an alkyl group having 1 to 4 carbon atoms, an aryl group, or a monovalent group having the structure shown below. In the following formula, $R^{a8}$ represents an alkyl group having 1 to 4 carbon atoms or an aryl group, and m is an integral number of 0 to 100.

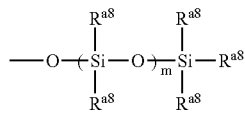

Examples of the compounds represented by the formula (1) include 3-ethyl-3-hydroxymethyloxetane (OXT-101: manufactured by Toagosei Co., Ltd.), 3-ethyl-3-(2-ethylhexyloxymethyl)oxetane (OXT-212: manufactured by Toagosei Co., Ltd.), and 3-ethyl-3-phenoxymethyloxetane (OXT-211: manufactured by Toagosei Co., Ltd.). Examples of the compounds represented by the formula (2) include 1,4-bis[(3-ethyl-3-oxetanylmethoxy)methyl]benzene (OXT-121: Toagosei Co., Ltd. In addition, examples of the compounds represented by the formula (3) include bis(3-ethyl-3-oxetanylmethyl)ether (OXT-221: Toagosei Co., Ltd.).

Examples of the compounds having 3 or 4 oxetane rings include the compounds represented by the following formula (4).

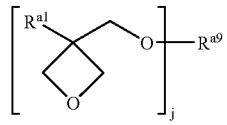

In formula (4), $R^{a1}$ is the same as that in formula (1) above. Examples of the polyvalent connecting group $R^{a9}$ include branched alkylene group having 1 to 12 carbon atoms such as the groups represented by the following groups A to C, branched poly(alkyleneoxy) groups such as the groups represented by the following group D, and branched polysiloxy groups such as the group represented by the following group E, and the like. j is 3 or 4.

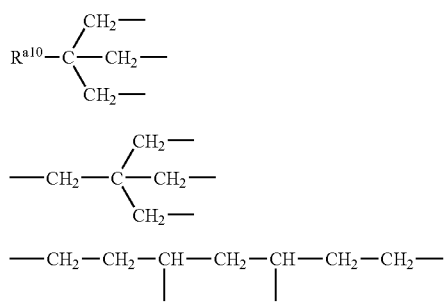

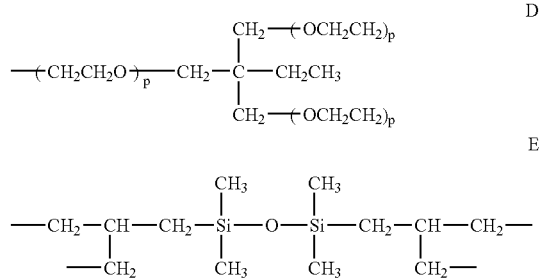

In the group A, $R^{a10}$ represents a methyl, ethyl or propyl group. In the group D, p is an integer of 1 to 10.

Other examples of the oxetane compounds favorably used in the invention include compounds represented by the following formula (5) having oxetane rings on the side chains.

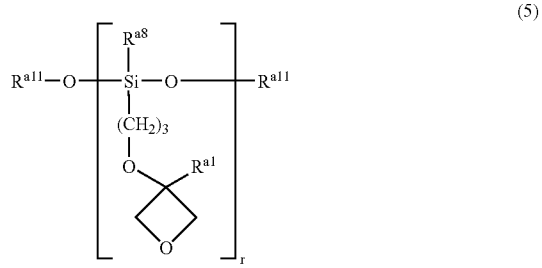

In formula (5), $R^{a1}$ and $R^{a8}$ are the same as that in the above formula. $R^{a11}$ represents an alkyl group having 1 to 4 carbon atoms or a trialkylsilyl group such as a methyl group, an ethyl group, a propyl group, or a butyl group, and r is an integral number of 1 to 4.

The compounds having an oxetane ring are described in detail in JP-A No. 2003-341217, paragraphs (0021) to (0084), and these compounds are favorably used in the invention. The oxetane compound described in JP-A No. 2004-91556 may be used in combination in the invention. The compound is described in detail in JP-A No. 2004-91556, paragraphs (0022) to (0058). Among the other oxetane compounds which may be used in the invention, compounds having one oxetane ring is preferable from the viewpoint of the viscosity and tackiness of the composition.

-Radical Polymerizable Compound-

Radical polymerizable compounds usable in the invention are compounds each having a radical polymerizable ethylenic unsaturated bond, and include compounds having any chemical structural forms, such as monomeric, oligomeric and polymeric forms, as long as they have at least one per molecule of radical polymerizable unsaturated bond.

The radical polymerizable compounds may be used alone, or two or more of them may be used in combination at any ratio for the purpose of enhancing the intended qualities. From the standpoint of controlling properties, such as reactivity and physical properties, combined use of two or more of the radical polymerizable compounds is advantageous.

Examples of a polymerizable compound having a radical polymerizable ethylenic unsaturated bond include unsaturated carboxylic acids, such as acrylic acid, methacrylic acid, itaconic acid, crotonic acid, isocrotonic acid and maleic acid, and salts thereof, anhydrides having ethylenic unsaturated groups, acrylonitrile, styrene, and other various kinds of radical polymerizable compounds, such as unsaturated polyester, unsaturated polyether, unsaturated polyamide and unsaturated polyurethane.

More specifically, those compounds include acrylic acid derivatives, such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligoester acrylate, N-methylolacrylamide, diacetone acrylamide and epoxy acrylate; methacrylic acid derivatives, such as methyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate and 2,2-bis (4-methacryloxypolyethoxyphenyl)propane; and allyl compound derivatives, such as allyl glycidyl ether, diallyl phthalate and triallyl trimellitate. To be concrete, commercially available radical polymerizable compounds listed, e.g., in Kakyozai Handbook, compiled by Shinzo Yamashita, published by Taiseisha, Ltd. (1981), UV-EB Koka Handbook (Genryo Hen), compiled by Kiyomi Kato, published by Kobunshi Kankoukai (1985), UV-EB Koka Gijutsu no Oyo to Ichiba, p.79, compiled by RadTech Japan, published by CMC Publishing Co., Ltd. (1989), and Ei-ichiro Takiyama, Polyester Jushi Handbook, The Nikkan Kogyo Shinbun, Ltd. (1988), or radical polymerizable or crosslinkable monomers, oligomers and polymers publicly known to persons skilled in the art can be used.

In addition, the light-curable polymerizable compound materials used in the photopolymerizable compositions disclosed, e.g., in JP-A No. 7-159983, JP-B No. 7-31399, JP-A Nos. 8-224982, 10-863 and 9-134011 are known as radical polymerizable compounds, and these compounds are also applicable in the present ink composition.

Moreover, it is also preferable to use vinyl ether compounds as radical polymerizable compounds. Examples of vinyl ether compounds suitable as the radical polymerizable compounds include di- or trivinyl ether compounds, such as ethylene glycol divinyl ether, ethylene glycol monovinyl ether, diethylene glycol divinyl ether, triethylene glycol monovinyl ether, triethylene glycol divinyl ether, propylene glycol divinyl ether, dipropylene glycol divinyl ether, butanediol divinyl ether, hexanediol divinyl ether, cyclohexanedimethanol divinyl ether, hydroxyethyl monovinyl ether, hydroxynonyl monovinyl ether and trimethylolpropane trivinyl ether; and monovinyl ether compounds, such as ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexanedimethanol monovinyl ether, n-propyl vinyl ether, isopropyl vinyl ether, isopropenyl ether O-propylenecarbonate, dodecyl vinyl ether, diethylene glycol monovinyl ether and octadecyl vinyl ether.

Of those vinyl ether compounds, the divinyl ether compounds and the trivinyl ether compounds, especially divinyl ether compounds, are preferred over the others in terms of curability, adhesion properties and surface hardness. These vinyl ether compounds may be used alone or as appropriate combinations of two or more thereof.

In the invention, the polymerizable compound content of the ink composition is preferably from 60 to 95 mass %, far preferably from 70 to 95 mass %, especially preferably from 75 to 95 mass %. The content adjustment to 60 mass % or more is preferred in terms of a tendency toward enhancement of the sensitivity, and the content adjustment to 95 mass % or below is also preferred in terms of acceptance of other ingredients.

(Polymerization Initiator)

It is preferable that the present ink composition contains at least one kind of polymerization initiator which enables the phosphoric acid group-containing polymerizable compounds and the other polymerizable compounds to be cured through polymerization. The polymerization initiator shows its absorption in the wavelength region of actinic energy rays and, when exposed to actinic energy rays, it can act on polymerizable compounds and promote polymerization curing.

The polymerization initiator is a compound that can cause a chemical change when undergoes the action of actinic energy rays or the interaction with electronically-excited states of sensitizing dyes, and thereby produce at least one kind of radical, acid or base. Specifically, such a compound includes an initiator capable of producing an active radical species when actinic energy rays are applied thereto, and thereby initiating and promoting polymerization curing of polymerizable compounds (or the ink composition), and an initiator capable of producing a cation species when actinic energy rays are applied thereto and, as with the above, initiating and promoting polymerization curing of polymerizable compounds (or the ink composition), and can be chosen from the following as appropriate.

The term "actinic energy rays" used in the invention refers to actinic rays capable of inducing production of a radical or cation from a polymerization initiator, wherein are included ultraviolet light (UV light), visible light, γ-ray, α-ray, X-rays and other electron beams. Examples of a light source applicable therein include LD, LED, a fluorescent light, a low-pressure mercury light, a high-pressure mercury light, a metal halide lamp, a carbon arc light, a xenon lamp and a chemical lamp. Of these light sources, LED, a high-pressure mercury light and a metal halide lamp are preferred over the others.

As the polymerization initiator, those well-known to persons skilled in the art can be used without any restrictions. Examples thereof include the polymerization initiators described, e.g., in Bruce M. Monroe et al., Chemical Revue, 93, 435 (1993), R. S. Davidson, Journal of Photochemistry and Biology A: Chemistry, 73, 81 (1993), J. P. Faussier, Photoinitiated Polymerization—Theory and Applications: Rapra Review, vol. 9, Report, Rapra Technology (1998), and M. Tsunooka et al., Prog. Polym. Sci., 21, 1 (1996). In addition, the compounds described as compounds usable for chemical amplification photo resist compositions and cationic photopolymerization in Imaging yo Yuki Zairyo, compiled by The Japanese Research Association for Organic Electronics Materials, published by Bunshin Design Printing Publishing and Digital Communications, pp. 187-192 (1993) are also applicable. Furthermore, a group of compounds causing oxidative or reductive binding cleavage by undergoing interactions with electronically-excited states of sensitizing dyes as described in F. D. Saeva, Topics in Current Chemistry, 156, 59 (1990), G. G. Maslak, Topics in Current Chemistry, 168, 1 (1993), H. B. Shuster et al., JACS, 112, 6329 (1990), and I. D. F. Eaton et al., JACS, 102, 3298 (1980) can also be given as examples of the polymerization initiator.

Examples of polymerization initiators preferred in the invention include (a) aromatic ketones, (b) aromatic onium salt compounds, (c) organic peroxides, (d) hexaarylbiimidazole compounds, (e) keto-oxime ester compounds, (f) borate compounds, (g) azinium salt compounds, (h) metallocene compounds, (i) active ester compounds, and (j) compounds having carbon-halogen bonds.

Examples of compounds suitable as the aromatic ketones symbolized by (a) include the compounds having benzophenone or thioxanthone skeletons as described in J. P. Fouassier and J. F. Pabek, Radiation Curing in Polymer Science and Technology, pp. 77-117 (1993). Examples of compounds more suitable as aromatic ketones include the α-thiobenzophenone compounds disclosed in JP-B No. 47-6416, the benzoin ether compounds disclosed in JP-B No. 47-3981, the α-substituted benzoin compounds disclosed in JP-B No. 47-22326, the benzoin derivatives disclosed in JP-B No. 47-23664, the aroylphosphonic acid esters disclosed in JP-A No. 57-30704, the dialkoxybenzophenones disclosed in JP-B No. 60-26483, the benzoin ethers disclosed in JP-B No. 60-26403 and JP-A No. 62-81345, the α-aminobenzophenones disclosed in JP-B No. 1-34242, U.S. Pat. No. 4,318,791 and EP-A1 No. 0,284,561, p-di(dimethylaminobenzoyl)benzene disclosed in JP-A No. 2-211452, the thio-substituted aromatic ketones disclosed in JP-A No. 61-194062, the acylphosphine sulfides disclosed in JP-B No. 2-9597, the acylphosphines disclosed in JP-B No. 2-9596, the thioxanthones disclosed in JP-B No. 63-61950, and the coumarins disclosed in JP-B No. 59-42864.

The aromatic onium salt compounds symbolized by (b) include aromatic onium salts of elements belonging to the groups 15, 16 and 17 in the long-period form of periodic system, such as N, P, As, Sb, Bi, O, S, Se, Te and I. Suitable examples of such aromatic onium salts include the iodonium salts disclosed in European Patent No. 104,143, U.S. Pat. No. 4,837,124 and JP-A Nos. 2-150848 and 2-96514, the sulfonium salts disclosed in European Patent Nos. 370,693, 233, 567, 297,443, 297,442, 279,210 and 422,570, and U.S. Pat. Nos. 3,902,144, 4,933,377, 4,760,013, 4,734,444 and 2,833, 827, diazonium salts (such as benzenediazonium which may have a substituent), diazonium salt resins (such as formaldehyde resin of diazodiphenylamine), N-alkoxypyridinium salts (including those disclosed in U.S. Pat. No. 4,743,528, JP-A Nos. 63-138345, 63-142345 and 63-142346, and JP-B No. 46-42363, such as 1-methoxy-4-phenylpyridinium tetrafluoroborate), and the compounds disclosed in JP-B Nos. 52-147277, 52-14278 and 52-14279. These compounds produce radicals or acids as active species.

The organic peroxides symbolized by (c) include organic compounds having at least one oxygen-oxygen bond per molecule, and suitable examples thereof include peroxy esters, such as 3,3',4,4'-tetra(t-butylperoxycarbonyl)benzophenone, 3,3',4,4'-tetra(t-amylperoxycarbonyl)benzophenone, 3,3',4, 4'-tetra(t-hexylperoxycarbonyl)benzophenone, 3,3',4,4'-tetra (t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyldiperoxyisophthalate.

Examples of the hexaarylbiimidazole compounds symbolized by (d) include the lophine dimers as disclosed in JP-B Nos. 45-37377 and 44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4', 5,5'-tetraphenylbiimidazole.

Examples of the keto-oxime ester compounds symbolized by (e) include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-p-toluenesulfonyloxyiminobutane-2-one, and 2-ethoxycarbonyloxyimino -1-phenylpropane-1-one.

Examples of the borate compounds symbolized by (f) include the compounds disclosed in U.S. Pat. Nos. 3,567,453 and 4,343,891, and European Patent Nos. 109,772 and 109, 773.

Examples of the azinium salt compounds symbolized by (g) include the compounds having N—O bonds as disclosed in JP-A Nos. 63-138345, 63-142345, 63-142346 and 63-143537, and JP-B No. 46-42363.

Examples of the metallocene compounds symbolized by (h) include the titanocene compounds disclosed in JP-A Nos. 59-152396, 61-151197, 63-41484, 2-249 and 2-4705, and the iron-arene complexes disclosed in JP-A Nos. 1-304453 and 1-152109.

Examples of the titanocene compounds include dicyclopentadienyl-Ti-dichloride, dicyclopentadienyl-Ti-bisphenyl, dicyclopentadienyl-Ti-bis-2,3,4,5,6-pentafluorophenyl-1-yl, dicyclopentadienyl-Ti-bis-2,3,5,6-tetrafluorophenyl-1-yl, dicyclopentadienyl-Ti-bis-2,4,6-trifluorophenyl-1-yl, dicyclopentadienyl-Ti-2,6-difluorophenyl-1-yl, dicyclopentadienyl-Ti-bis-2,4-difluorophenyl-1-yl, dimethylcyclopentadienyl-Ti-bis-2,3,4,5,6-pentafluorophenyl-1-yl, dimethylcyclopentadienyl-Ti-2,3,5,6-tetrafluorophenyl-1-yl, dimethylcyclopentadienyl-Ti-bis-2,4-difluorophenyl-1-yl, bis(cyclopentadienyl)-bis(2,6-difluoro-3-(pyr-1-yl)phenyl)titanium, bis(cyclopentadienyl)-bis[2,6-difluoro-3-(methylsulfonamido)phenyl]titanium, and bis(cyclopentadienyl)-bis[2,6-difluoro-3-(N-butylbiaroylamino)phenyl]titanium.

Examples of the active ester compounds symbolized by (i) include the nitrobenzyl ester compounds disclosed in European Patent Nos. 0,290,750, 046,083, 156,153, 271,851 and 0,388,343, U.S. Pat. Nos. 3,901,710 and 4,181,531, and JP-A Nos. 60-198538 and 53-133022, the iminosulfonate compounds disclosed in European Patent Nos. 0,199,672, 84,515, 199,672, 044,155 and 0,101,122, U.S. Pat. Nos. 4,618,564, 4,371,605 and 4,431,774, and JP-A Nos. 64-18143, 2-245756 and 4-365048, and the compounds disclosed in JP-B Nos. 62-6223 and 63-14340, and JP-A No. 59-174831.

Suitable examples of the compounds symbolized by (j), which have carbon-halogen bonds, include the compounds described in Wakabayashi et al., Bull. Chem. Soc. Japan, 42, 2924 (1969), the compounds disclosed in British Patent No. 1,388,492, the compounds disclosed in JP-A No. 53-133428, and the compounds disclosed in German Patent No. 3,337, 024.

In addition, the compounds described in F. C. Schaefer et al., J. Org. Chem., 29, 1527 (1964), the compounds disclosed in JP-A No. 62-58241, and the compounds disclosed in JP-A No. 5-281728 can be given as examples. Moreover, the compounds disclosed in German Patent No. 2,641,100, the compounds disclosed in German Patent No. 3,333,450, the compounds disclosed in German Patent No. 3,021,590 or the compounds disclosed in German Patent No. 3,021,599 can also be given as examples.

Suitable examples of the compounds represented by (a) to (j) include the following compounds.

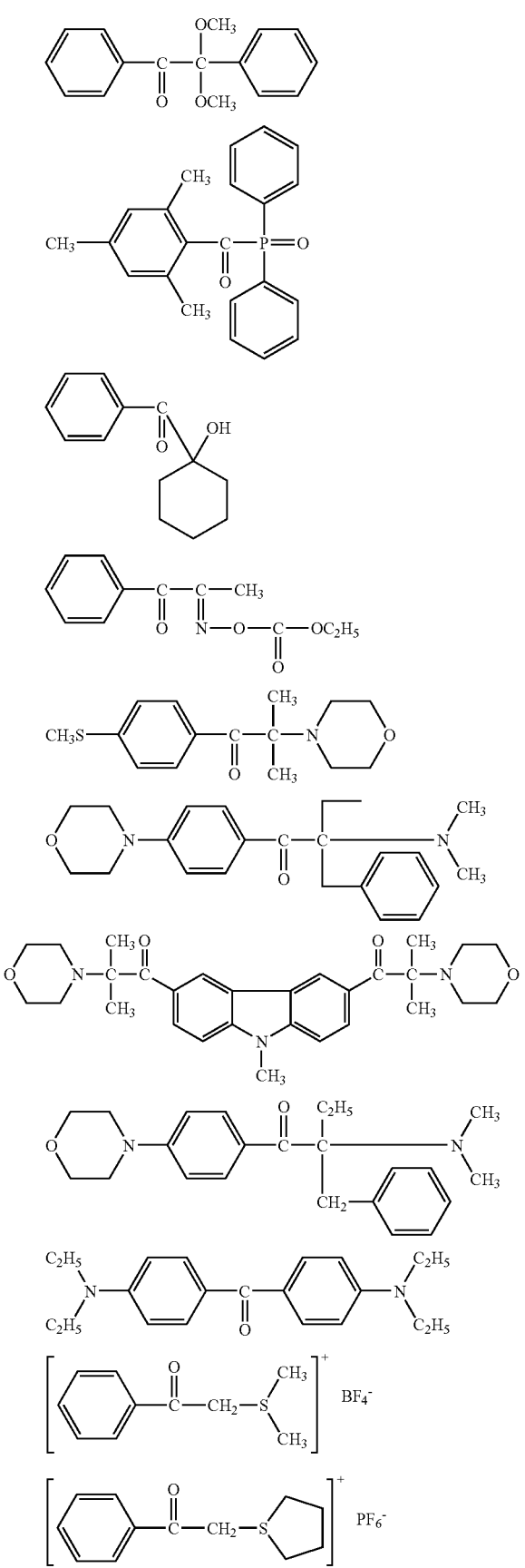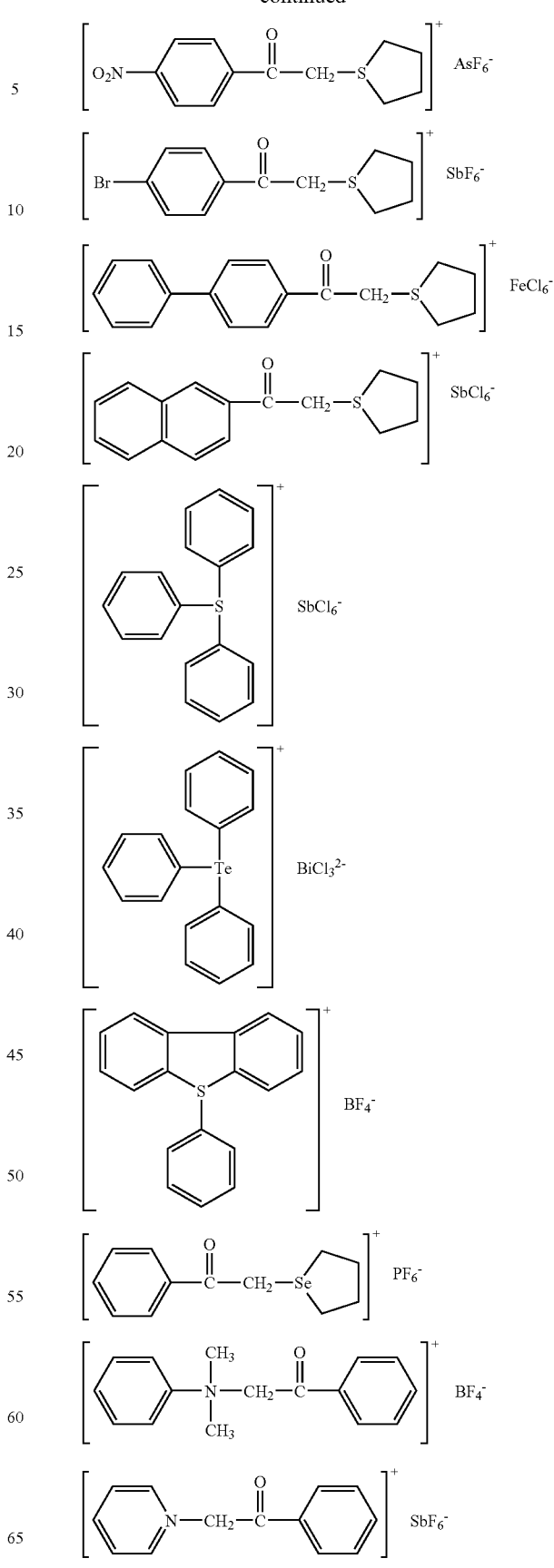

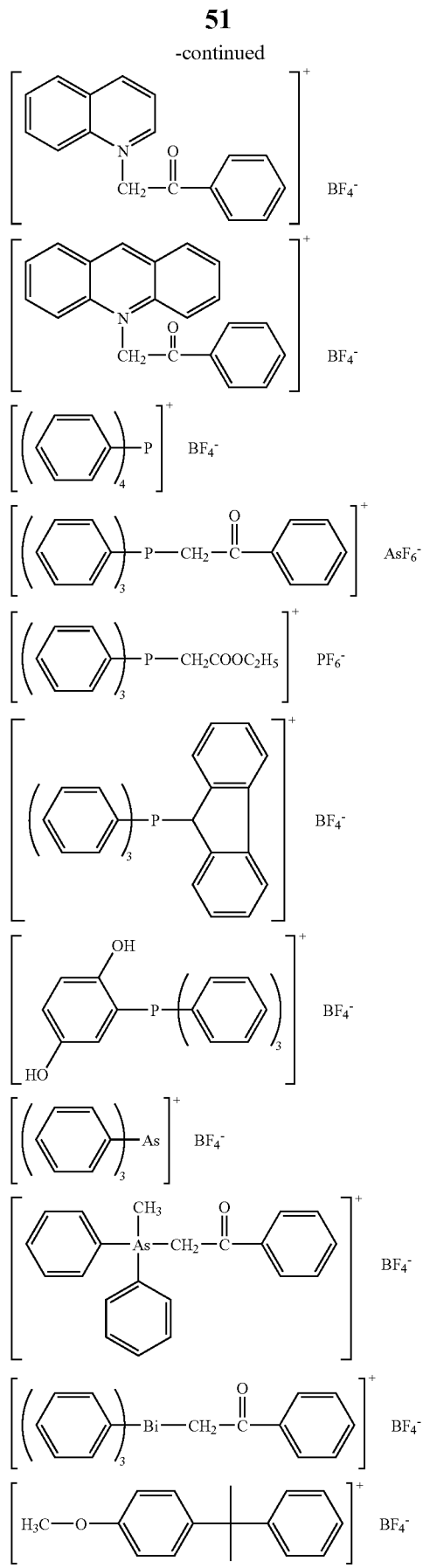
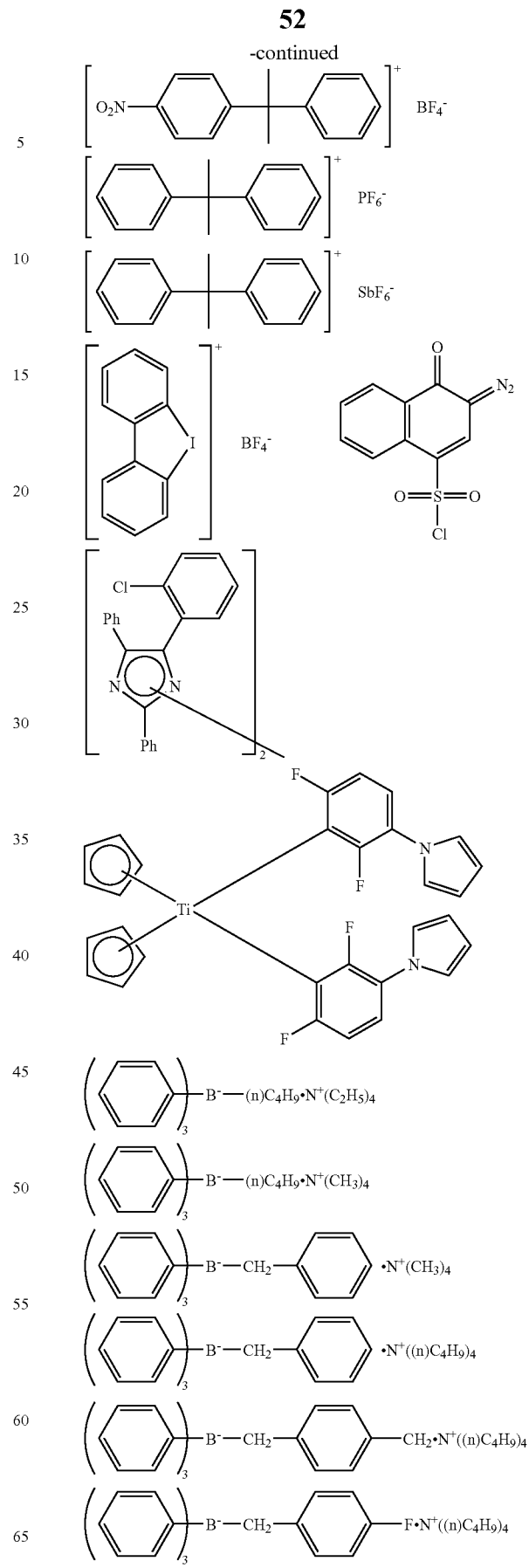

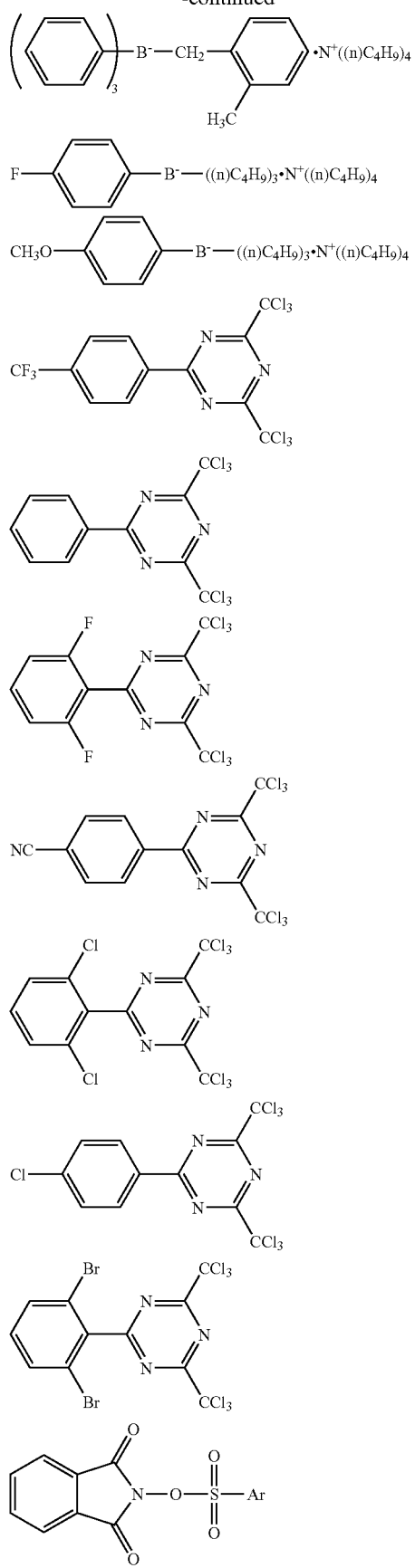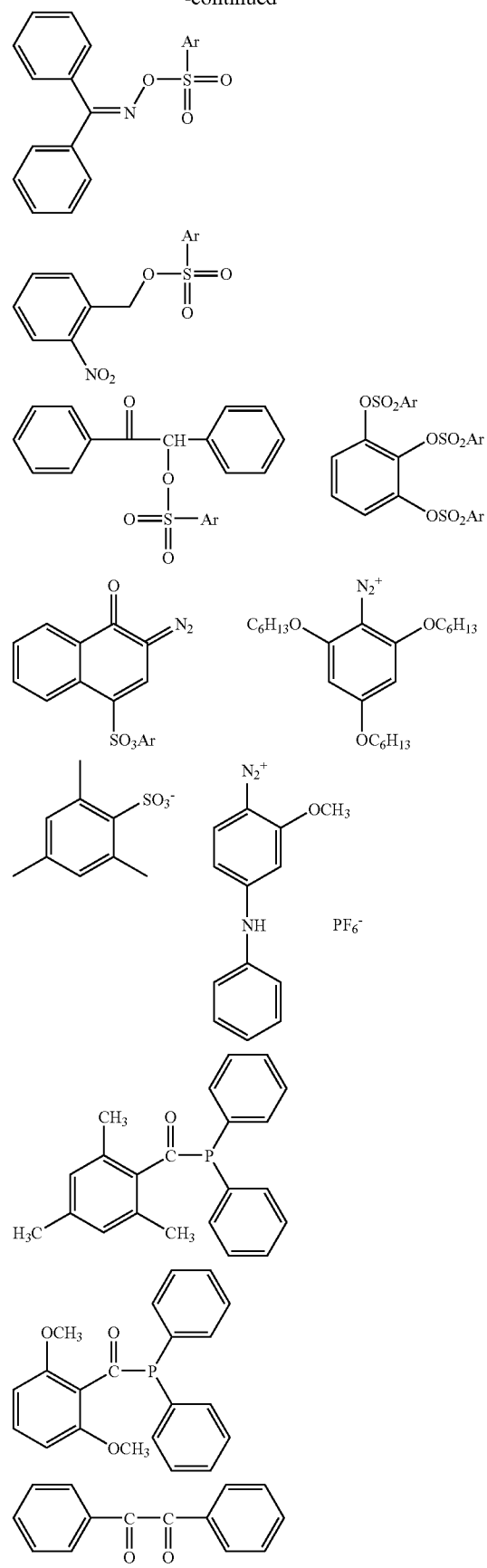

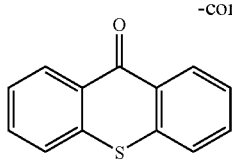

The polymerization initiator content in the ink composition is preferably from 0.5 to 20 mass %, far preferably from 1 to 12 mass %, based on the total amount of polymerizable compounds and polymerization initiator used. By adjusting the content to the foregoing range in particular, high curing speed and excellent curability can be attained, and recording of rugged images can be effectively performed. In addition, the ink images formed suffers no deterioration in abrasion resistance.

(Coloring Agent)

It is preferable that the present ink composition contains a coloring agent. Coloring agents usable in the invention have no particular restrictions, but highly weather-resistant, color reproducibility-rich pigments and oil-soluble dyes are preferred and coloring agents arbitrarily chosen from publicly known soluble dyes and the like can be used. And it is preferred that the coloring agents suitably usable in the present ink composition or inkjet recording ink composition have no function as polymerization inhibitor in the polymerization reaction for curing. This is because the coloring agents avoid becoming a cause of reduction in curing reaction sensitivity to active radiation.

<Pigment>

The pigment is not particularly limited, and any one of common commercially available pigments, including organic and inorganic pigments, dispersions of the pigment dispersed in an insoluble resin, and pigments surface-grafted with a resin, may be used. In addition, dyed resin particles may also be used. Such pigments include the pigments described, for example, in Seijiro Itoh Ed., "Ganryo no Jiten (Dictionary of Pigments)" (2000), W. Herbst K. Hunger, Industrial Organic Pigments", and JP-A Nos. 2002-12607, 2002-188025, 2003-26978, and 2003-342503.

Specific Examples of the organic and inorganic pigments exhibiting yellow color employable in the invention include monoazo pigments such as C.I. Pigment Yellow 1 (Fast Yellow G, etc.) and C.I. Pigment Yellow 74, disazo pigments such as C.I. Pigment Yellow 12 (Disazo Yellow AAA, etc.) and C.I. Pigment Yellow 17, non-benzidine azo pigments such as C.I. Pigment Yellow 180, azolake pigments such as C.I. Pigment Yellow 100 (tartrazine yellow lake, etc.), condensation azo pigments such as C.I. Pigment Yellow 95 (condensation azo yellow GR, etc.), acidic dye lake pigments such as C.I. Pigment Yellow 115 (quinoline yellow lake, etc.), basic dye lake pigments such as C.I. Pigment Yellow 18 (thioflavin lake, etc.), anthraquinone pigments such as fravantrone yellow (Y-24), isoindolinone pigments such as isoindolinone yellow 3RLT (Y-110), quinophtharone pigments such as quinophtharone yellow (Y-138), isoindoline pigments such as isoindoline yellow (Y-139), nitroso pigments such as C.I. Pigment Yellow 153 (nickel nitroso yellow, etc.), metal complex salt azomethine pigments such as C.I. Pigment Yellow 117 (copper azomethine yellow, etc.), and the like.

Examples thereof exhibiting red or magenta color include monoazo pigments such as C.I. Pigment Red 3 (toluidine red, etc.), disazo pigments such as C.I. pigment red 38 (pyrazolone red B, etc.), azolake pigments such as C.I. Pigment Red 53:1 (lake red C, etc.) and C.I. Pigment Red 57:1 (Brilliant Carmine 6B), condensation azo pigments such as C.I. Pigment Red 144 (condensation azo red BR, etc.), acidic dye lake pigments such as C.I. Pigment Red 174 (phloxine B lake, etc.), basic dye lake pigments such as C.I. Pigment Red 81 (rhodamine 6G' lake, etc.), anthraquinone pigments such as C.I. Pigment Red 177 (dianthraquinonyl red, etc.), thioindigo pigments such as C.I. Pigment Red 88 (Thioindigo Bordeaux, etc.), perynone pigments such as C.I. Pigment Red 194 (perynone red, etc.), perylene pigments such as C.I. pigment red 149 (perylene scarlet, etc.), quinacridone pigments such as C.I. Pigment Violet 19 (unsubstituted quinacridone) and C.I. Pigment Red 122 (quinacridone magenta, etc.), isoindolinone pigments such as C.I. Pigment Red 180 (isoindolinone red 2BLT, etc.), alizarin lake pigments such as C.I. Pigment Red 83 (madder lake, etc.), and the like.

Examples thereof exhibiting blue or cyan color include disazo pigments such as C.I. Pigment Blue 25 (dianisidine blue, etc.), phthalocyanine pigments such as C.I. Pigment Blue 15 (phthalocyanine blue, etc.), acidic dye lake pigments such as C.I. Pigment Blue 24 (peacock blue lake, etc.), basic dye lake pigments such as C.I. Pigment Blue 1 (Victria Pure Blue BO lake, etc.), anthraquinone pigments such as C.I. Pigment Blue 60 (indanthron blue, etc.), alkali blue pigments such as C.I. Pigment Blue 18 (alkali Blue V-5:1), and the like.

Examples of the pigment exhibiting green color include phthalocyanine pigments such as C.I. Pigment Green 7 (phthalocyanine green) and C.I. Pigment Green 36 (phthalocyanine green), and azometal complex pigments such as C.I. Pigment Green 8 (nitroso green).

Examples of the pigment exhibiting orange color include isoindoline-based pigments such as C.I. Pigment Orange 66 (isoindoline orange), and anthraquinone-based pigments such as C.I. Pigment Orange 51 (dichloropyranthrone orange).

Examples of the pigment exhibiting black color carbon black, titanium black, and aniline black.

Specific examples of the white pigments include basic lead carbonate $(2PbCO_3Pb(OH)_2$, so-called silver white), zinc oxide (ZnO, so-called zinc white), titanium oxide ($TiO_2$, so-called titanium white), and strontium titanate ($SrTiO_3$, so-called titanium strontium white).

Titanium oxide has a lower density and a higher refractive index than other white pigments, is more stable chemically or physically, and thus, has a greater masking and coloring potentials as a pigment, and is excellent in resistance to acid or alkali and other environmental factors. Thus, use of titanium oxide as the white pigment is preferable. Other white pigments (including white pigments other than those described above) may be used as needed.

For dispersing the pigment, any one of dispersing machines, such as ball mill, sand mill, attriter, roll mill, jet mill, homogenizer, paint shaker, kneader, agitator, Henschel mixer, colloid mill, ultrasonic wave homogenizer, pearl mill, and wet jet mill, may be used.

It is also possible to add a dispersant during dispersion of the pigment. Examples of the dispersants include hydroxyl group-containing carboxylic acid esters, salts of a long-chain polyaminoamide with a high-molecular weight acid ester, high-molecular weight polycarboxylic acid salts, high-molecular weight unsaturated acid esters, high-molecular weight copolymers, modified polyacrylates, polyvalent aliphatic carboxylic acids, naphthalenesulfonic acid/formalin condensates, polyoxyethylene alkylphosphoric esters, pigment derivatives, and the like. Use of a commercially available polymer dispersant such as a Solsperse series product manufactured by Zeneca is also preferable. A dispersion aid suitable for the pigment may be used as a dispersion aid. The dispersant and dispersion aid are preferably added in an amount of 1 to 50 parts by mass with respect to 100 parts by mass of the pigment.

A solvent may be added as the dispersion medium for various components such as pigment in the ink composition or alternatively, the cationic polymerizable compound above, which is a low-molecular weight component, may be used without solvent; but, the ink composition according to the invention preferably contains no solvent, because the composition is a radiation-curing ink that is hardened after application on a recording medium. It is because the solvent remaining in the hardened ink image leads to deterioration in solvent resistance and causes a problem of VOC (Volatile Organic Compound). From the viewpoints above, the cation polymerizable compound is preferably used as the dispersion medium, and selection of a cation polymerizable monomer lowest in viscosity among them is preferable for improvement in dispersibility and processability of the ink composition.

The average diameter of the pigment is preferably in the range of 0.02 to 0.4 µm, more preferably 0.02 to 0.1 µm, and still more preferably 0.02 to 0.07 µm. The pigment, the dispersant, and dispersion medium are selected and the dispersion and filtration conditions are determined in such a manner that the average diameter of the pigment particles falls in the preferable range above. Control of particle diameter enables prevention of the clogging in head nozzles and preservation of the storage stability, transparency and curing efficiency of ink.

<Dye>

The dye for use in the invention is preferably an oil soluble dye. Specifically, the dye preferably has a solubility in water (mass of the coloring agent dissolved in 100 g of water) of 1 g or less at 25° C., preferably 0.5 g or less, and more preferably 0.1 g or less. Accordingly, so-called water-insoluble and oil soluble dyes are used favorably.

As for the dyes for use in the invention, it is preferable to introduce an oil-solubilizing group on the basic dye structure described above, to ensure that the dye is dissolved in the amount needed in the ink composition.

Examples of the oil-solubilizing groups include long-chain branched alkyl groups, long-chain branched alkoxy groups, long-chain branched alkylthio groups, long-chain branched alkylsulfonyl groups, long-chain branched acyloxy groups, long-chain branched alkoxycarbonyl groups, long-chain branched acyl groups, long-chain branched acylamino groups, branched alkylsulfonylamino groups, long-chain branched alkylaminosulfonyl groups, as well as aryl, aryloxy, aryloxycarbonyl, arylcarbonyloxy, arylaminocarbonyl, arylaminosulfonyl, and arylsulfonylamino groups containing these long-chain branched substituent groups, and the like.

Alternatively, it is also possible to introduce an oil-solubilizing group, such as alkoxycarbonyl, aryloxycarbonyl, alkylaminosulfonyl or arylaminosulfonyl, on water-soluble dyes containing carboxylic acid or sulfonic acid groups, by using a long-chain branched alcohol, amine, phenol, or aniline derivative.

The melting point of the oil soluble dye is preferably 200° C. or lower, more preferably 150° C. or lower, and further preferably 100° C. or lower. Through the use of an oil soluble dye having a low melting point, crystallization of the dye in the ink composition is suppressed, which improves the storage stability of the ink composition.

The dye preferably has an higher oxidation potential for achieving higher resistance to fading in particular caused by oxidizers such as ozone, and better curing properties. Accordingly, the oxidation potential of the oil soluble dye used in the invention is preferably 1.0 V (vs SCE) or higher, more preferably 1.1 V (vs SCE) or higher, and particularly preferably 1.15 V (vs SCE) or higher.

The yellow dyes having the structure represented by the formula (Y-I) described in JP-A 2004-250483 are preferable. Example of the dyes particularly preferable include the dyes represented by the formulae (Y-II) to (Y-IV) in JP-A No. 2004-250483, paragraph No. (0034), and typical examples thereof include the compounds described in JP-A No. 2004-250483, paragraph Nos. (0060) to (0071). The oil soluble dyes represented by the formula (Y-I) described therein may be used not only in yellow ink, but also in inks in any other colors such as black and red.

The compounds having the structures represented by the formulae (3) and (4) in JP-A No. 2002-114930 are preferable as the magenta dyes; and typical examples thereof include the compounds described in JP-A No. 2002-114930, paragraph Nos. (0054) to (0073). Particularly preferable dyes are the azo dyes represented by the formulae (M-1) to (M-2) in JP-A No. 2002-121414, paragraph Nos. (0084) to (0122), and typical examples thereof include the compounds described in JP-A No. 2002-121414, paragraph Nos. (0123) to (0132). The oil soluble dyes represented by the formulae (3), (4), and (M-1) to (M-2) may be used not only in magenta ink, but also in inks in any other colors such as black and red inks.

Examples of the cyan dyes include the dyes represented by the formulae (I) to (IV) described in JP-A No. 2001-181547, and the formulae (IV-1) to (IV-4) described in JP-A No. 2002-121414, paragraph Nos. (0063) to (0078), and specific examples thereof include the compounds described in JP-A No. 2001-181547, paragraph Nos. (0052) to (0066), and JP-A No. 2002-121414, paragraph Nos.(0079) to (0081). Examples of the particularly preferable dyes include the phthalocyanine dyes represented by the formulae (C-I) and (C-II) described in JP-A No. 2002-121414, paragraph Nos. (0133) to (0196), and the phthalocyanine dye represented by the formula (C-II) is even further preferable. Specific examples thereof include the compounds described in JP-A No. 2002-12141, paragraph Nos. (0198) to (0201). The oil soluble dyes represented by the formulae (I) to (IV), (IV-1) to (IV-4), (C-I), and (C-II) are applicable to any color other than cyan, such as black ink and green ink.

These coloring agents are preferably added to the ink composition in an amount of 1 to 20 mass %, more preferably 2 to 10 mass % as solid matter.

(Other Components)

Various additives which may added as needed to the ink composition according to the invention are described below.

<Ultraviolet Absorbent>

An ultraviolet absorbent may be added to the ink composition according to the invention, for improvement in weather fastness and prevention of discoloration of the image obtained. Examples of the ultraviolet absorbents include the benzotriazole compounds described in JP-A Nos. 58-185677, 61-190537, 2-782, 5-197075 and 9-34057 and others; the benzophenone compounds described in JP-A Nos. 46-2784 and 5-194483, U.S. Pat. No. 3,214,463, and others; the cinnamic acid compounds described in JP-B Nos. 48-30492 and 56-21141, JP-A No. 10-88106, and others; the triazine compounds described in JP-A Nos. 4-298503, 8-53427, 8-239368, 10-182621, and 8-501291, and others; the compounds described in Research Disclosure No. 24239; compounds emitting light by absorbing ultraviolet ray such as stilbene and benzoxazole compounds; so-called fluorescent brighteners; and the like. The addition amount may be decided suitably according to applications, but is generally, approximately 0.5 to 15 mass % as solid matter.

<Sensitizer>

In the invention, a sensitizer may be added for the purposes of improving the efficiency of acid generation by the photo acid generating agent, and extending the photosensitive wavelength of the agent. The sensitizer may be any sensitizer which sensitizes the photo acid generating agent through an electron transfer mechanism or an energy transfer mechanism. Preferable examples thereof include fused polycyclic aromatic compounds such as anthracene, 9,10-dialkoxyanthracene, pyrene, and perylene, aromatic ketone compounds such as acetophenone, benzophenone, thioxanthone, and Michler ketone, and heterocyclic compounds such as phenothiazine and N-aryloxazolidinone. The addition amount is selected properly according to applications, but, and more preferably 0. 1 to 0.5 mole % with respect to the photo acid generating agent.

<Antioxidant>

An antioxidant may be added according to the invention, for improvement of stability of the ink composition. Examples of the antioxidants include those described in EP Laid-Open Nos. 223739, 309401, 309402, 310551, 310552, and 459416, German Patent Laid-Open No. 3435443, JP-A Nos. 54-48535, 62-262047, 63-113536, 63-163351, 2-262654, 2-71262, 3-121449, 5-61166, and 5-119449, U.S. Patent Nos. 4,814,262 and 4,980,275, and others. The addition amount is decided properly according to applications, but generally, approximately 0.1 to 8 mass % as solid matter.

<Antifading Agent>

Various types of organic antifading agents and metal complex antifading agents may be used according to the invention. Examples of the organic antifading agents include hydroquinones, alkoxy phenols, dialkoxy phenols, phenols, anilines, amines, indanes, chromanes, alkoxy anilines, and heterocycles. Examples of the metal complex antifading agents include nickel complexes and zinc complexes. Specific examples thereof include the compounds described in patents cited in Research Disclosure No. 17643, VII, Sections I to J, Research Disclosure No. 15162, Research Disclosure No. 18716, p. 650 left column, Research Disclosure No. 36544, p. 527, Research Disclosure No. 307105, p. 872, and Research Disclosure No. 15162, and the compounds included in the formula of typical compounds and compound examples described in JP-A No. 62-215272, pp. 127-137. The addition amount is selected properly according to applications, but preferably 0.1 to 8 mass % as solid matter.

<Conductive Salt>

A conductive salt such as potassium thiocyanate, lithium nitrate, ammonium thiocyanate, and dimethylamine hydrochloride may be added according to the invention, for the purpose of controlling the ejection properties.

<Solvent>

Addition of an extremely trace amount of organic solvent to the ink composition according to the invention is effective for improvement in adhesiveness to the recording medium. Examples of the solvents include ketone solvents such as acetone, methylethylketone, and diethylketone; alcohol solvents such as methanol, ethanol, 2-propanol, 1-propanol, 1-butanol, and tert-butanol; chlorine-based solvents such as chloroform, and methylene chloride; aromatic solvents such as benzene and toluene; ester solvents such as ethyl acetate, butyl acetate, and isopropyl acetate; ether solvents such as diethylether, tetrahydrofuran, and dioxane; glycol ether solvents such as ethylene glycol monomethyl ether and ethylene glycol dimethyl ether; and the like. In such a case, the amount of the solvent added is in the range that does not cause problems of solvent resistance and VOC, and thus, preferably in the range of 0.1 to 5 mass %, more preferably 0.1 to 3 mass %, in the entire ink composition.

<Polymer Compound>

Various types of polymer compounds may be added according to the invention for the purpose of controlling the physical properties of the film formed by curing. Examples of the polymer compounds include acrylic polymers, polyvinylbutyral resins, polyurethane resins, polyamide resins, polyester resins, epoxy resins, phenol resins, polycarbonate resins, polyvinylbutyral resins, polyvinylformal resins, shellac, vinyl resins, acrylic resins, rubber resin, waxes, other natural resins, and the like. These resins may be used in combination of two or more. Among them, vinyl copolymers obtained by copolymerization with an acrylic monomeric are preferable. In addition, copolymers containing a "carboxyl group-containing monomer", an "alkyl methacrylate ester", or an "alkyl acrylate ester" as the structural unit as a copolymerization component are also used favorably for the polymer binding material.

<Surfactant>

Surfactants may be added in the ink composition of the invention. The surfactants include those described in JP-A Nos. 62-173463 and 62-183457. Examples thereof include anionic surfactants such as dialkylsulfoscuccinic acid salts, alkylnaphthalenesulfonic acid salts, and fatty acid salts; nonionic surfactants such as polyoxyethylene alkylethers, polyoxyethylene alkylallylethers, acetylene glycol, and polyoxyethylene-polyoxypropylene block copolymers; cationic surfactants such as alkylamine salts and quaternary ammonium salts; and the like. An organic fluorocompound may be used instead of the surfactant. The organic fluorocompound is preferably hydrophobic. Examples of the organic fluorocompounds include fluorochemical surfactants, oily fluorochemical compounds (e.g., fluorine oil) and solid fluorochemical compound resins (e.g., tetraethylenefluoride resin); and typical examples thereof include those described in JP-B No. 57-9053 (Columns 8 to 17) and JP-A No. 62-135826.

In addition, a leveling additive, a matting agent, a wax for adjustment of film physical properties, or a tackifier for improvement of the adhesiveness to the recording medium such as of polyolefin and PET that does not inhibit polymerization may be added as needed to the ink composition according to the invention.

Typical examples of the tackifiers include the high-molecular weight adhesive polymers described in JP-A2001-49200, pp. 5 to 6 (e.g., copolymers of a (meth)acrylic ester and an alcohol with an alkyl group having 1 to 20 carbons, of a (meth)acrylic ester and an alicyclic alcohol having 3 to 14 carbons, and of a (meth)acrylic ester and an aromatic alcohol having 6 to 14 carbons), and low-molecular weight adhesive resin containing a polymerizable unsaturated bond, and the like.

(Preferred Aspect of Ink Composition)

The present ink composition contains a polymerization initiator, a polymerizable monomer, the specified phosphoric acid group-containing polymer, a coloring agent and so on, as is mentioned above. In the present ink composition, those ingredients each preferably takes on their suitable aspects, and it is preferable by far that their individually suitable aspects combine together.

In cases where the ink composition according to the invention is used as an inkjet recording ink, in consideration of the ejection properties, the viscosity is preferably 7 to 30 mPa·s, and more preferably 7 to 20 mPa·s at the temperature during ejection (for example 40 to 80° C., preferably 25 to 30° C.). For example, the viscosity of the ink composition according to the invention at room temperature (25 to 30° C.) is preferably 35 to 500 mPa·s, and more preferably 35 to 200 mPa·s. The composition ratio of the ink composition according to the invention is preferably adjusted properly in such a manner that the viscosity falls within the above-described range. When the composition is highly viscous at room temperature, ink penetration into a recording medium is avoided even if the recording medium is porous, which allows to reduce the amount of uncured monomers and odors. Further, bleeding of the landed ink droplets is reduced, which results in the improvement of image quality.

The surface tension of the ink composition according to the invention is preferably 20 to 30 mN/m, and more preferably 23 to 28 mN/m. When the ink composition according to the invention is used on various recording media such as polyolefin, PET, coated paper, and non-coated paper, the surface tension thereof is preferably 20 mN/m or more for prevention of ink bleeding and penetration, and 30 mN/m or less for improvement in wettability therewith.

The ink composition according to the invention is favorably used as an inkjet recording ink. In cases where the composition is used as an inkjet recording ink, the ink composition is ejected on a recording medium using an inkjet printer, thereafter the ejected ink composition is cured by irradiation with a radiation for recording.

Since the image portion is cured by irradiation of the radiation such as ultraviolet rays, and the image portion has an excellent strength, the printed material obtained by the ink composition may be used for various usages such as formation of an ink receiving layer (image portion) of a planographic printing plate, in addition to image formation by the ink.

[Inkjet Recording Method and Printed Material]

The inkjet recording method to which the ink composition according to the invention is favorably applied (the inkjet recording method according to the invention) is further described below.

The inkjet recording method according to the invention comprises: ejecting the ink composition according to the invention onto a recording medium (for example, a support or a recording material) using an inkjet recording apparatus, and then curing the ink composition by irradiating the ejected ink composition with active radiation. The cured ink composition forms an image on the recording medium.

The recording medium applicable to the inkjet recording method according to the invention is not particularly limited, and examples thereof include papers such as ordinary uncoated paper and coated paper, various unabsorbent resin materials and films thereof used for so-called soft packaging. Examples of the various plastic films include a PET film, an OPS film, an OPP film, an ONy film, a PVC film, a PE film, and a TAC film. Other examples of the plastics useful as the recording medium material include, polycarbonate, acrylic resins, ABS, polyacetal, PVA, and rubbers. Metals and glasses are also useful as the recording medium. The ink composition according to the invention undergoes less heat shrinkage during curing, and provides excellent adhesiveness to the base material (recording medium). Therefore, the ink composition has the advantage in its capability to form a high definition image even on a film tends to be curled or deformed by curing shrinkage of the ink, or by heat generated during curing reaction of the ink, for example, thermally shrinkable films, a PET film, an OPS film, an OPP film, an ONy film, and a PVC film. In addition, another examples of the recording material applicable to the invention include the support of the below-described planographic printing plate.

Examples of the active radiation applicable to the inkjet recording method according to the invention include α rays, γ rays, X rays, ultraviolet light, visible light, infrared light, and electron beams. The peak wavelength of the active radiation is preferably 200 to 600 nm, more preferably 300 to 450 nm, and further preferably 350 to 420 nm. The power of the active radiation is preferably 2,000 mJ/cm$^2$ or less, more preferably 10 to 2,000 mJ/cm$^2$, further preferably 20 to 1,000 mJ/cm$^2$, and most preferably 50 to 800 mJ/cm$^2$. In particular, according to the inkjet recording method according to the invention, the radiation ray is preferably emitted from a light emitting diode which emits ultraviolet light having a emission peak wavelength of 350 to 420 nm and achieving a maximum illumination intensity of 10 to 1,000 mW/cm$^2$ on the surface of the above-described recording medium.

In addition to the above conditions and the like, the conditions applied to an inkjet recording method of the invention and the details of an inkjet recording apparatus will be described below in a planographic printing plate and a method of producing a planographic printing plate of the invention that are preferred applications of the inkjet recording method of the invention.

In the inkjet recording method of the invention, since the aforementioned ink composition of the invention is used and the ink composition is cured by irradiation with active radiation rays, images being excellent in rubbing resistance and having controlled surface stickiness may be formed. Although it is possible to conduct the irradiation with active radiation rays after ejection of all colors, it is preferable to conduct exposure after ejection of each color in view of the acceleration of curing.

The printed material of the invention is a product containing an image formed from the ink composition of the invention by the inkjet recording method described above (namely, the inkjet recording method of the invention). It therefore is a printed material which has an image being excellent in rubbing resistance and having controlled surface stickiness.

[Planographic Printing Plate and Method for Producing Planographic Printing Plate]

The method for producing a planographic printing plate according to the invention is a method for producing a planographic printing plate comprising: ejecting the ink composition according to the invention onto a support, and then curing the ejected ink composition by irradiation of active radiation so as to form a hydrophobic image. The planographic printing plate according to the invention is also a planographic printing plate prepared according to the method of producing a planographic printing plate according to the invention, which has a support and a hydrophobic image formed on the support.

Heretofore, as a planographic printing plate, a so-called PS plate composed of a hydrophilic support having thereon an lipophilic photosensitive resin layer has been widely used. In a method for producing this PS plate, normally, after a mask exposure (surface exposure) is carried out via a lith film, non-exposed areas are dissolved and removed to give a desired printing plate. However, in recent years, a technique of digitizing image information using a computer by electronically processing, storing, and outputting the information has become widespread, and a new image output system that can be used for the above technique has been desired. In particular, a computer to plate (CTP) technique in which a printing plate is directly produced by scanning according to digitized image information with highly coherent light such as laser light without using a lith film has been developed.

As a system for obtaining a planographic printing plate that makes possible the above scanning exposure, a method for directly producing a planographic printing plate using an ink composition can be cited. This method comprises ejecting an ink onto a support (preferably a hydrophilic support) using an inkjet system or the like, and exposing areas having the ink composition or the inkjet recording ink to active radiation to give a printing plate having a desired image (preferably a hydrophobic image). The ink composition suitable for such a system is the ink composition or the inkjet recording ink according to invention.

(The Step Ejecting the Ink Composition According to the Invention on the Surface of the Support)
<Support>

The support (recording medium) for the planographic printing plate according to the invention is not particularly limited, if it is a dimensionally rigid plate-shaped support. The support is preferably a hydrophilic support. Examples thereof include papers, papers laminated with a plastic material (e.g., polyethylene, polypropylene, or polystyrene), metal plates (e.g., plates of aluminum, zinc, and copper), plastic films (e.g., films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal), papers or plastic films having a laminated or vapor-deposited layer of the metal described above, and the like. Preferable supports are, for example, polyester films and aluminum plates. Among them, aluminum plates, which are dimensionally stable and relatively cheaper, are preferable.

The aluminum plate is a pure aluminum plate, an alloy plate containing aluminum as a main component and a small amount of a different element, or a thin film of aluminum or an aluminum alloy laminated with a plastic. Examples of the different element contained in the aluminum alloy include silicon, iron, manganese, copper, magnesium, chromium, zinc, bismuth, nickel, and titanium. The content of the different element in the alloy is preferably 10 mass % or less. In the invention, a pure aluminum plate is preferable, but since the production of completely pure aluminum is difficult with the currently available refining technique, aluminum containing a slight amount of foreign elements may be used. The aluminum plate is not specified as to its composition, and may be selected properly from known materials. The thickness of the support is preferably 0.1 to 0.6 mm, and more preferably 0.15 to 0.4 mm.

In advance of using the aluminum plate, the aluminum plate is preferably subjected to surface treatment such as surface-roughening treatment and anodizing treatment. The surface treatment facilitate enhancing hydrophilicity and ensuring adhesion between the image recording layer and the support. Before surface-roughening the aluminum plate, if desired, degreasing treatment for removing the rolling oil on the surface is performed using a surfactant, an organic solvent, an alkaline aqueous solution or the like.

Various methods may be used for surface roughening of aluminum plate, and examples thereof include mechanical surface-roughening treatment, electrochemical surface-roughening treatment (surface-roughening by dissolving the surface electrochemically), and chemical surface-roughening treatment (surface-roughening by dissolving the surface chemically). Any one of the methods known in the art such as ball polishing, brushing, blast polishing, and buffing may be used as the method of mechanical surface-roughening. Alternatively, a transfer method of transferring surface irregularity with a surface-irregular roll during hot rolling of aluminum may be used. The electrochemical surface-roughening may be performed, for example, by applying an alternate or direct current to the support in an electrolyte solution containing an acid such as hydrochloric acid or nitric acid. Yet alternatively, the method of using a mixed acid described in JP-A No. 54-63902 may also be used. The aluminum plate after surface-roughening treatment may be etched as needed by using an aqueous solution, for example, of potassium hydroxide or sodium hydroxide, and further after neutralization, treated as needed in an anodizing process for improvement in abrasion resistance.

Various electrolytes forming a porous oxide film may be used as the electrolytes for use in the process of anodizing aluminum plate. Sulfuric acid, hydrochloric acid, oxalic acid, chromic acid, or a mixed acid thereof is used commonly. The concentration of the electrolyte is determined properly according to the kind of electrolyte. The condition of the anodizing process varies according to the electrolyte used, and thus is not specified particularly; but generally, the electrolyte concentration is 1 to 80 mass %; liquid temperature, 5 to 70° C.; electric current density, 5 to 60 A/dm$^2$; voltage, 1 to 100 V; and electrolysis period, 10 seconds to 5 minutes. The amount of the anodic oxide film formed is preferably 1.0 to 5,0 g/m$^2$ and more preferably 1.5 to 4.0 g/m$^2$. Favorably in the range above, it is possible to obtain a planographic printing plate favorable in printing durability and scuff resistance in the nonimage portion.

The surface-finished support having an anodic oxide film described above may be used as the support for use in the invention, but may be subjected to another treatment as needed, for example, the treatment for expanding or sealing the micropores in the anodic oxide film described in JP-A Nos. 2001-253181 and 2001-322365 or a surface hydrophilizing treatment of immersing it in an aqueous solution containing a hydrophilic compound, for further improvement in adhesion to the upper layer, hydrophilicity, staining resistance, heat insulation efficiency, and others. The expanding and sealing treatments are not limited to the methods described above, and any one of known methods may be used.

<Micropore Sealing Treatment>

Micropore sealing may carried out in steam, or in fluorozirconic acid alone, an aqueous solution containing an inorganic fluorine compound such as sodium fluoride, steam containing lithium chloride, or heat water. Among them, micropore sealing in an aqueous solution containing an inorganic fluorine compound, water vapor, or heat water is preferable. The methods are respectively described below.

-Micropore Sealing in an Aqueous Solution Containing an Inorganic Fluorine Compound- The inorganic fluorine compound used in micropore sealing in an aqueous solution containing an inorganic fluorine compound is preferably a metal fluoride. Examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate. Among them, sodium fluorozirconate, sodium fluorotitanate, fluorozirconic acid, and fluorotitanic acid are preferable.

The concentration of the inorganic fluorine compound in the aqueous solution is 0.01 mass % or more, and more preferably 0.05 mass % or more to sufficiently seal the micropores on the anodized film, and preferably 1 mass % or less, and more preferably 0.5 mass % or less from the viewpoint of stain resistance. The aqueous solution containing an inorganic fluorine compound preferably further contains a phosphate compound. The inclusion of a phosphate compound is preferable because it improves hydrophilicity on the surface of the anodized film, on-machine developability, and stain resistance.

Preferable examples of the phosphate compound include metal phosphates such as alkali metal phosphates and alkaline earth metal phosphates. Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, ammonium sodium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Of these phosphate compounds, sodium dihydrogen phosphate, disodium hydrogen phosphate, potassium dihydrogen phosphate and dipotassium hydrogen phosphate are preferred over the others. Among them, sodium dihydrogen phosphate, disodium hydrogen phosphate, potassium dihydrogen phosphate, and dipotassium hydrogen phosphate are preferable. The combination of an inorganic fluorine compound and a phosphate compound not particularly limited, but it is preferable that the aqueous solution contain sodium fluorozirconate as the inorganic fluorine compound and at least sodium dihydrogen phosphate as the phosphate compound. The concentration of the phosphate compound in the aqueous solution is preferably 0.01 mass % or more, and more preferably 0.1 mass % or more from the viewpoints of on-machine developability and stain resistance, and preferably 20 mass % or less, and more preferably 5 mass % or less from the viewpoint of solubility.

The proportion between the compounds in the aqueous solution is not particularly limited, but the mass ratio between the inorganic fluorine compound and the phosphate compound is preferably 1/200 to 10/1, and more preferably 1/30 to 2/1. The temperature of the aqueous solution is preferably 20° C. or more, and more preferably 40° C. or more, besides preferably 100° C. or less, and more preferably 80° C. or less. The pH of the aqueous solution is preferably 1 or more, and more preferably 2 or more, besides preferably 11 or less, and more preferably 5 or less.

The method for micropore sealing in an aqueous solution containing an inorganic fluorine compound is not particularly limited, and examples thereof include a immersion method and a spray method. Operations in these methods may be performed once or more than once individually, or those methods may be used in combination. Among the methods, the immersion method is preferable. In cases where the immersion method is used for the treatment, the treatment time is preferably 1 second or more, more preferably 3 seconds or more, besides preferably 100 seconds or less, and more preferably 20 seconds or less.

-Micropore Sealing in Steam-

The micropore sealing in steam can be performed, for example, by bringing steam under elevated or normal pressure into contact with the anodic oxide film continuously or uncontinuously. The temperature of the steam is preferably 80° C. or higher, more preferably 95° C. or higher, and preferably 105° C. or lower. The pressure of the steam is preferably in the range of (atmospheric pressure −50 mm Aq) to (atmospheric pressure +300 mmAq), or ($1.008 \times 10^5$ to $1.043 \times 10^5$ Pa). The contact time of the steam is preferably 1 second or more, more preferably 3 seconds or more and preferably 100 seconds or less, more preferably 20 seconds or less.

-Micropore Sealing in Hot Water-

The micropore sealing in steam is performed, for example, by immersing an aluminum plate carrying a formed anodic oxide film in hot water. The hot water may contain an inorganic salt (e.g., phosphate salt) or an organic salt. The temperature of the hot water is preferably 80° C. or higher, more preferably 95° C. or higher, and preferably 100° C. or lower. The period of immersion in hot water is preferably 1 second or more, more preferably 3 seconds or more, and preferably 100 seconds or less, more preferably 20 seconds or less.

The hydrophilizing treatments for use in the invention include the alkali metal silicate methods described in U.S. Pat. Nos. 2,714,066, 3,181,461, 3,280,734 and 3,902,734. In the method, the support is immersed and electrolyzed, for example, in an aqueous solution of sodium silicate. Also included are the method of treating the support with potassium fluorozirconate described in JP-B No. 36-22063 and the methods of treating it with polyvinylphosphonic acid described in U.S. Pat. Nos. 3,276,868, 4,153,461 and 4,689,272.

The support preferably has an average center-line roughness of 0.10 to 1.2 μm. Favorably in the range above, it is possible to obtain desirable adhesiveness to the image-recording layer, favorable printing durability, and favorable staining resistance.

In ejecting the ink composition according to the invention on the surface of the hydrophilic support above, it is preferably to heat the ink composition to a temperature of preferably 40 to 80° C., more preferably 25 to 30° C. and thus lower the viscosity of the ink composition to preferably 7 to 30 mPa·s, more preferably 7 to 20 mPa·s. In particular, use of an ink composition having an ink viscosity of 35 to 500 mP·s at 25° C. is preferable as it give a better effect. Use of the method provides high ejection stability.

Commonly, radiation-curing ink compositions including the ink composition according to the invention have higher viscosity than aqueous inks normally used ink compositions, and the viscosity thereof varies significantly according to the fluctuation of temperature during ejection. The fluctuation of the ink viscosity has great influences on the change of droplet size and droplet ejection speed, consequently leading to deterioration in image quality. Thus, it is necessary to keep the temperature during ink ejection as constant as possible. Thus, the control width of the temperature in the invention is preferably temperature setting ±5° C., more preferably temperature setting ±2° C., and still more preferably temperature setting ±1° C.

<Inkjet Recording Apparatus>

The inkjet recording apparatus used in the invention is not particularly limited, and any one of commercially available inkjet recording apparatuses may be used. That is, in the invention, an image may be recorded on a recording medium by using a commercially available inkjet recording apparatus. The inkjet recording apparatus used in the invention has, for example, an ink-supplying system, a temperature sensor, and a radiation ray source. The ink-supplying system further has, for example, a stock tank storing an inkjet composition, a supply pipe, an inkjet composition-supplying tank immediately before the inkjet head, a filter, and a piezoelectric inkjet head. The piezoelectric inkjet head allows ejection of multi-sized dots in amounts of 1 to 100 pl, preferably, 8 to 30 pl, at a definition, for example, of 320×320 to 4,000×4,000 dpi, preferably 400×400 to 1,600×1,600 dpi, and more preferably 720×720 dpi. The "dpi" in the invention means the dot number per 2.54 cm.

As described above, since a radiation curable ink preferably has a constant temperature at the time of ejection, the section from the ink supply tank to the inkjet head may be thermally insulated and heated. The method for controlling the temperature is not limited, and preferable examples thereof include a method of providing a plurality of temperature sensors in piping areas, thereby controlling the temperature in accordance with the ink flow and the environmental temperature. The temperature sensors may be provided on the ink supply tank and in the vicinity of the nozzle of the inkjet head. The head unit to be heated is preferably thermally blocked or insulated. In order to reduce the warm-up time of the printer, or reduce the heat energy loss, it is preferable that the head unit be thermally insulated from other sections, and the thermal capacity of the whole unit to be heated be preferably smaller.

(Forming a Hydrophobic Image on the Surface of a Support by Irradiating the Ejected Ink Composition with Active Radiation to Cure the Ink Composition)

The ink composition ejected onto the surface of a hydrophilic support is cured by irradiation with active radiation. At this time, if there is a sensitizing dye present together with a initiator in the ink composition, then the sensitizing dye in the system is activated into an excited state by absorption of the active radiation, accelerating decomposition of the initiator upon contact with the polymerization initiator, and a more sensitive curing reaction may be achieved.

Examples of the active radiation used herein include α rays, γ rays, electron beam, X rays, ultraviolet light, visible light, and infrared light. Although the peak wavelength of the active radiation varies according to the absorption properties of the sensitizing dye, but is, for example, 200 to 600 nm, preferably 300 to 450 nm, and more preferably 350 to 420 nm. In the invention, the polymerization initiating system has sufficient sensitivity even to a low power active radiation. Accordingly, the power of the active radiation as irradiation energy is, for example, 2,000 mJ/cm$^2$ or less, preferably from 10 to 2,000 mJ/cm$^2$, more preferably from 20 to 1,000 mJ/cm$^2$, and further preferably from 50 to 800 mJ/cm$^2$. Further, the active radiation is applied so that the illumination intensity on the exposed surface is, for example, from 10 to 2,000 mW/cm$^2$, and preferably from 20 to 1,000 mW/cm$^2$.

Mercury lamps, gas or solid state lasers and the like have been widely used as active radiation sources, and mercury lamps and metal halide lamps are widely used in ultraviolet-curing inkjet printers. However, under the current urgent need for mercury-free devices from the viewpoint of environmental protection, substitution thereof with a GaN semiconductor ultraviolet ray-emitting device is very useful industrially or environmentally. In addition, LED's (UV-LEDs) and LD's (UV-LDs) are smaller in size, longer in lifetime, higher in efficiency and lower in cost, and thus, attracting attention as a light source for radiation-curing inkjet printers.

In the invention, light-emitting diodes (LED) and laser diodes (LD) may be used as the source of active radiation. In particular, when a UV light source is needed, a UV-LED or a UV-LD may be used. For example, Nichia Corporation has marketed a violet LED having a wavelength of the main emission spectrum of between 365 nm and 420 nm. Further, when a shorter wavelength is needed, U.S. Pat. No. 6,084,250 discloses an LED capable of emitting active radiation whose wavelength is centered between 300 nm and 370 nm. Further, another violet LED is available, and irradiation can be carried out with radiation of a different UV bandwidth. The active radiation source particularly preferable in the invention is a UV-LED, and a UV-LED having a peak wavelength at 350 to 420 nm is particularly preferable. The maximum illumination intensity of the LED on a recording medium is preferably 10 to 2,000 mW/cm$^2$, more preferably 20 to 1,000 mW/cm$^2$, and particularly preferably 50 to 800 mJ/cm$^2$.

In the invention, the ink composition is preferably exposed to the active radiation, for example, for 0.01 to 120 seconds, preferably, 0.1 to 90 seconds. The irradiation condition and the basic irradiation method of the active radiation are disclosed in JP-A No. 60-132767. Specifically, the exposure is performed in a so-called shuttle process, i.e., by moving a head unit and light sources that are placed at both sides of the head unit in the ink-ejecting device. The active radiation is irradiated after a certain period (e.g., 0.01 to 0.5 second, preferably 0.01 to 0.3 second, and more preferably, 0.01 to 0.15 second) from ink ejection. It is possible to prevent bleeding of the ink ejected on the recording medium before curing by controlling the period from ink ejection as short as possible. In this manner, it becomes possible to irradiate the ink before penetration into the depth to which no light is penetrable even on a porous recording medium, suppress the amount of unreacted residual monomer, and consequently reduce odor. Alternatively, the ink may be hardened with a light from another fixed light source. WO 99/54415 Pamphlet discloses, as the irradiation method, a method of using optical fiber and a method of irradiating the recorded area with a collimated UV ray, i.e., a collimated light reflected from a mirror placed on the side face of head unit.

Thus, by using the method for producing a planographic printing plate according to the invention, a hydrophobic image is formed on the surface of a support by curing the ink composition according to the invention by irradiation with active radiation. As described above, according to an aspect of the invention, there is provided an ink composition which is cured highly sensitively by active radiation to form an image having flexibility and excellent adhesiveness to the substrate. From these facts, the planographic printing plate obtained by the method of producing a planographic printing plate according to the invention (i.e. planographic printing plate according to the invention) has a high quality image portion having excellent flexibility, and provides excellent printing durability.

According to the invention, as mentioned above, it is possible to provide an ink composition that has excellent adhesion to a substrate and satisfactory curing sensitivity, and an inkjet recording method using such an ink composition. The invention can further provide a printed material having images highly adhesive to their substrate, a planographic printing plate having a long press life and a manufacturing method thereof.

EXAMPLES

Examples and comparative examples are illustrated below, and thereby the present invention is described more specifically. However, the invention should not be construed as being limited by these examples. Additionally, all parts in the following description are by mass unless otherwise indicated.

Example 1

Image Formation by Cationic Polymerization (Preparation of Ink)
<Yellow Ink 1>

| | |
|---|---|
| C.I. Pigment Yellow 13 | 3 parts by mass |
| Cationic photopolymerization initiator: Triphenylsulfonium salt (UVI-6992, produced by The Dow Chemical Company) | 10.8 parts by mass |
| Sensitizing dye: 9,10-Dibutoxyanthracene | 8.1 parts by mass |
| Polymerizable compounds | |

| -continued | |
|---|---|
| Monomer: 3,4-Epoxycyclohexylmethyl-3',4'-epoxycyclohexane carboxylate (CELOXIDE 2021A, produced by Daicel UCB Co., Ltd.) | 11.0 parts by mass |
| Monomer: 3,7-Bis(3-oxetanyl)-5-oxanonane (OXT-221, produced by TOAGOSEI Co., Ltd.) | 3.8 parts by mass |
| Monomer: 3-Ethyl-3-phenoxymethyloxetane (OXT-211, produced by TOAGOSEI Co., Ltd.) | 56.7 parts by mass |
| Specified phosphoric acid group-containing polymer: Exemplified Compound (D-1) | 5 parts by mass |

<Magenta Ink 1>

| | |
|---|---|
| C.I. Pigment Red 57:1 | 3 parts by mass |
| Cationic photopolymerization initiator: Triphenylsulfonium salt (UVI-6992, produced by The Dow Chemical Company) | 10.8 parts by mass |
| Sensitizing dye: 9,10-Dibutoxyanthracene | 8.1 parts by mass |
| Polymerizable compounds | |
| Monomer: 3,4-Epoxycyclohexylmethyl-3',4'-epoxycyclohexane carboxylate (CELOXIDE 2021A, produced by Daicel UCB Co., Ltd.) | 11.0 parts by mass |
| Monomer: 3,7-Bis(3-oxetanyl)-5-oxanonane (OXT-221, produced by TOAGOSEI Co., Ltd.) | 3.8 parts by mass |
| Monomer: 3-Ethyl-3-phenoxymethyloxetane (OXT-211, produced by TOAGOSEI Co., Ltd.) | 56.7 parts by mass |
| Specified phosphoric acid group-containing polymer: Exemplified Compound (D-1) | 5.0 parts by mass |

<Cyan Ink 1>

| | |
|---|---|
| C.I. Pigment Blue 15:3 | 3 parts by mass |
| Cationic photopolymerization initiator: Triphenylsulfonium salt (UVI-6992, produced by The Dow Chemical Company) | 10.8 parts by mass |
| Sensitizing dye: 9,10-Dibutoxyanthracene | 8.1 parts by mass |
| Polymerizable compounds | |
| Monomer: 3,4-Epoxycyclohexylmethyl-3',4'-epoxycyclohexane carboxylate (CELOXIDE 2021A, produced by Daicel UCB Co., Ltd.) | 11.0 parts by mass |
| Monomer: 3,7-Bis(3-oxetanyl)-5-oxanonane (OXT-221, produced by TOAGOSEI Co., Ltd.) | 3.8 parts by mass |
| Monomer: 3-Ethyl-3-phenoxymethyloxetane (OXT-211, produced by TOAGOSEI Co., Ltd.) | 56.7 parts by mass |
| Specified phosphoric acid group-containing polymer: Exemplified Compound (D-1) | 5.0 parts by mass |

<Black Ink 1>

| | |
|---|---|
| C.I. Pigment Black 7 | 3 parts by mass |
| Cationic photopolymerization initiator: Triphenylsulfonium salt (UVI-6992, produced by The Dow Chemical Company) | 10.8 parts by mass |
| Sensitizing dye: 9,10-Dibutoxyanthracene | 8.1 parts by mass |
| Polymerizable compounds | |
| Monomer: 3,4-Epoxycyclohexylmethyl-3',4'-epoxycyclohexane carboxylate (CELOXIDE 2021A, produced by Daicel UCB Co., Ltd.) | 11.0 parts by mass |
| Monomer: 3,7-Bis(3-oxetanyl)-5-oxanonane (OXT-221, produced by TOAGOSEI Co., Ltd.) | 3.8 parts by mass |
| Monomer: 3-Ethyl-3-hydroxymethyloxetane (OXT-101, produced by TOAGOSEI Co., Ltd.) | 56.7 parts by mass |
| Specified phosphoric acid group-containing polymer: Exemplified Compound (D-1) | 5.0 parts by mass |

Crude Ink 1 of each color prepared in the above manner was passed through a filter with an absolute filtration accuracy of 2 μm, thereby obtaining Ink 1 of each color.

(Inkjet Image Recording)

Next, using the ink composition obtained above, recording on a recording medium was performed with a commercially available inkjet recording apparatus having a piezoelectric inkjet nozzle. The ink supply system was composed of a main tank, a supply pipe, an ink supply tank immediately before an inkjet head, a filter, and a piezoelectric inkjet head, and the section from the ink supply tank to the inkjet head was thermally insulated and heated. Temperature sensors were provided on the ink supply tank and in the vicinity of the nozzle of the inkjet head, and the temperature was controlled so that the nozzle section was always at 70° C.±2° C. The piezoelectric inkjet head was driven so as to discharge multisize dots of 8 to 30 pl at a resolution of 720×720 dpi. After the dots have impacted, the exposure system, the main scanning speed, and the discharge frequency were adjusted so that UV light was focused to give an illumination intensity of 100 mW/cm$^2$ on the exposed surface and so that irradiation was started 0.1 seconds after the ink impacted onto the recording medium. Furthermore, the exposure time was made variable, and necessary exposure energy for curing was irradiated. The term dpi referred to in the invention represents the number of dots per inch (~2.54 cm).

(Color Image Formation and Evaluation)

The ink of each color prepared above were discharged in the order black, cyan, magenta, and yellow at an environmental temperature of 25° C., and each color was irradiated with UV rays using a metal halide lamp (trade name: VZERO 085; manufactured by Integration Technology). The total exposure energy per color was 100 mJ/cm$^2$ for all the colors, an energy level that could completely cure the inks to the point where tackiness to the touch disappeared. As recording media, a grained aluminum support, a transparent biaxially orientated polypropylene film whose surface had been treated so as to be printable, a PVC sheet (trade name: MPI 1005, 2 mm PVC vinyl, manufactured by Avery), a cast coated paper, and a commercially available recycled paper were used. Color Images were recorded on these recording media, and images having a high resolution with no dot bleeding were obtained in all cases. Further, for high quality paper, the ink did not penetrate to the reverse side, the ink was sufficiently cured, and there was hardly any odor due to unreacted monomer. Moreover, the images recorded on the film had sufficient flexibility, did not crack when bent, and there were no problems therewith in an adhesion test involving peeling with Sellotape (registered trademark).

Example 2

Image Formation by Cationic Polymerization

<Magenta Ink 2>

Magenta Ink 2 was prepared in the same manner as Magenta Ink 1 prepared in Example 1, except that the exemplified Compound (D-1) was replaced with the exemplified Compound (D-2).

Example 3

Image Formation by Cationic Polymerization

<Magenta Ink 3>

Magenta Ink 3 was prepared in the same manner as Magenta Ink 1 prepared in Example 1, except that the exemplified Compound (D-1) was replaced with the exemplified Compound (A-1).

Example 4

Image Formation by Cationic Polymerization

<Magenta Ink 4>

Magenta Ink 4 was prepared in the same manner as Magenta Ink 1 prepared in Example 1, except that the exemplified Compound (D-1) was replaced with the exemplified Compound (B-1).

Example 5

Image Formation by Cationic Polymerization

<Magenta Ink 5>

Magenta Ink 5 was prepared in the same manner as Magenta Ink 1 prepared in Example 1, except that the exemplified Compound (D-1) was replaced with the exemplified Compound (C-1).

Example 6

Image Formation by Cationic Polymerization

<Magenta Ink 6>

Magenta Ink 6 was prepared in the same manner as Magenta Ink 1 prepared in Example 1, except that the 8.1 parts by mass of 9,10-dibutoxyanthracene used as sensitizing dye was replaced with 8.1 parts by mass of Darocur ITX (produced by Ciba Specialty Chemicals).

Example 7

Image Formation by Cationic Polymerization

<Magenta Ink 7>

Magenta Ink 7 was prepared in the same manner as Magenta Ink 1 prepared in Example 1, except that the 3 parts by mass of C.I. Pigment Red 57:1 was replaced with 3 parts by mass of an oil-soluble Dye M-1 illustrated below (oxidation potential: +1.37 V).

M-1

Example 8

Image Formation by Cationic Polymerization

<Magenta Ink 8>

Magenta Ink 8 was prepared in the same manner as Magenta Ink 1 prepared in Example 1, except that the 3 parts by mass of C.I. Pigment Red 57:1 was replaced with 3 parts by mass of an oil-soluble Dye M-2 illustrated below (oxidation potential: +0.94 V).

M-2

Comparative Example 1

Image Formation by Cationic Polymerization

<Magenta Ink 9>

Magenta Ink 9 was prepared in the same manner as Magenta Ink 1 prepared in Example 1, except that the exemplified Compound (D-1) was replaced with CELOXIDE 2021A.

Comparative Example 1

<Magenta Ink 10>

Magenta Ink 10 was prepared in the same manner as Magenta Ink 1 prepared in Example 1, except that the exemplified Compound (D-1) was replaced with the following Comparative Compound (1)

Comparative Example 3

<Magenta Ink 11>

Magenta Ink 11 was prepared in the same manner as Magenta Ink 1 prepared in Example 1, except that the exemplified Compound (D-1) was replaced with the following Comparative Compound (2).

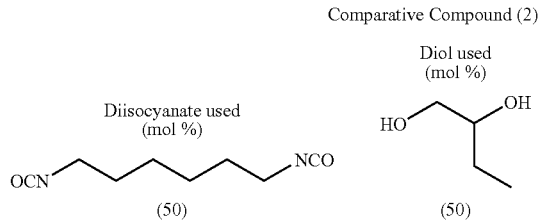

Comparative Compound (2)

The crude compositions of Magenta Ink 2 to 11 prepared in Examples 2 to 8 and Comparative Examples 1 to 3 respectively were each passed through a filter with an absolute filtration accuracy of 2 μm, and the thus filtered ones were designated as Magenta Ink 2 to 11 respectively.

And it was found that the ink compositions prepared in Examples and Comparative Examples had their viscosities in a range of 7 to 20 mPa·s at the discharge temperature of ink.

(Inkjet Image Recording)

By using Magenta Ink 2 to 11 prepared in Examples 2 to 8 and Comparative Examples 1 to 3 and Magenta Ink 1 prepared in Example 1, magenta images were formed in accordance with the same method as described in Example 1.

(Evaluation of Inkjet Images)

Evaluations of curing sensitivity and adhesion to a recording medium in conformance with the following methods were performed on the images formed using the thus prepared ink and according to the same method as described in Example 1.

1. Determination of Curing Sensitivity

The quantity of exposure energy (mJ/cm$^2$) put into obtaining an UV-irradiated image surface having no tacky feel when examined with the hand was defined as curing sensitivity. The smaller value of this quantity indicates the higher sensitivity. The substrate used was PET (produced by HIGASHIYAMA).

2. Evaluation of Adhesion to Recording Medium

Evaluations of adhesion to a recording medium was made using as the recording medium each of a corona-treated polypropylene sheet and a copper substrate. The corona-treated polypropylene sheet and the copper substrate each having magenta images were evaluated by a crosshatch test (EN ISO2409). The greater value obtained in this test means the better adhesion properties, and the value of 3B or more was rated as a state of no problem in practical use.

TABLE 1

| | Magenta Ink Number | Sensitivity (mJ/cm$^2$) | Adhesion properties | |
|---|---|---|---|---|
| | | | Corona-treated PP | Copper Substrate |
| Example 1 | 1 | 240 | 5B | 5B |
| Example 2 | 2 | 240 | 5B | 5B |
| Example 3 | 3 | 280 | 5B | 4B |
| Example 4 | 4 | 300 | 5B | 4B |
| Example 5 | 5 | 300 | 5B | 4B |
| Example 6 | 6 | 240 | 5B | 5B |
| Example 7 | 7 | 240 | 5B | 5B |
| Example 8 | 8 | 240 | 5B | 5B |
| Comparative Example 1 | 9 | 240 | 1B | 1B |
| Comparative Example 2 | 10 | 240 | 1B | 1B |
| Comparative Example 3 | 11 | 240 | 2B | 1B |

Example 9

Image Formation by Light-Emitting Diode (LED)

An inkjet image recording was made using Magenta Ink 1 prepared in Example 1 in the same manner as in Example 1, except that UV light-emitting diodes (UV-LED) were used in place of the metal halide lamp Vzero 085 made by Integration Technology. In this Example, NCCU033 made by Nichia Corporation was used as the UV-LED. This LED produces from one chip an output of UV light with a wavelength of 365 nm, and emits light of about 100 mW from one chip by passage of a current of about 500 mA. When these chips were arranged in 7 mm intervals, a power of 0.3 W/cm$^2$ was obtained on the surface of a recording medium (hereinafter referred to as "medium" too). The time from impact of ink droplets to exposure and the exposure time are changeable by alteration of the feed speed of a medium and the distance between a head and a travel direction of UV-LED. In this example, the start of exposure was made after a lapse of about 0.5 second from the impact of ink droplets. The exposure energy on a medium was adjustable within a range between 0.01 to 15 J/cm$^2$ according to the settings of a distance from a medium and a feed speed.

Comparative Example 4

Image Formation by Light-Emitting Diode (LED)

Inkjet image recording was made in the same manner as in Example 9, except that Magenta Ink 10 prepared in Comparative Example 2 was used in place of Magenta Ink (Evaluation of Inkjet Images)

Evaluations of curing sensitivity and adhesion properties in conformance with the foregoing methods were performed on the images formed in Example 9 and Comparative Example 4 each. Evaluation results are shown in Table 2.

TABLE 2

| | Magenta Ink No. | Sensitivity (mJ/cm$^2$) | Adhesion properties | |
|---|---|---|---|---|
| | | | Corona-treated PP | Copper Substrate |
| Example 9 | 1 | 80 | 5B | 5B |
| Comparative Example 4 | 10 | 80 | 1B | 1B |

From comparisons of the cases shown in Table 1 where the UV lamp was used and the cases shown in Table 2 where the UV light-emitting diodes were used, it can be seen that the cases where the UV light-emitting diodes were used were higher in the sensitivity than the cases where the UV lamp (application of radiation) was used.

Example 10

Image Formation by Radical Polymerization (Preparation of Ink)
<Yellow Ink 2>

| | |
|---|---|
| Tridecyl acrylate (SR498E, produced by Sartomer Company) | 11.0 parts |
| Specified phosphoric acid group-containing polymer [exemplified Compound (D-1)] | 5.0 parts |
| N-Vinylcaprolactam | 16.0 parts |
| 2-Phenoxyethyl acrylate (SR339, produced by Sartomer Company) | 27.4 parts |
| Trimethylolpropane triacrylate (SR351, produced by Sartomer Company) | 3.0 parts |
| Dipropylene glycol diacrylate (SR508, produced by Sartomer Company) | 1.0 part |
| Solsperse 32000 (produced by Noveon, Inc., dispersant) | 0.4 parts |
| Cromophtal Yellow LA (pigment produced by Ciba Specialty Chemicals) | 3.6 parts |
| Genorad 16 (produced by Rahn AG, polymerization inhibitor) | 0.05 parts |
| Rapi-Cure DVE-3 (produced by ISP Europe, vinyl ether compound) | 2.0 parts |
| Lucirin TPO (produced by BASF, photoinitiator) | 8.5 parts |
| Benzophenone (photoinitiator) | 4.0 parts |
| Irgacure 184 (produced by Ciba Specialty Chemicals, photoinitiator) | 4.0 parts |
| Isopropylthioxanthone (ITX) | 1.0 part |
| Byk 307 (produced by BYK Chemie, antifoaming agent) | 0.05 parts |

<Magenta Ink 12>

| | |
|---|---|
| Tridecyl acrylate (SR498E, produced by Sartomer Company) | 11.0 parts |
| Specified phosphoric acid group-containing polymer [exemplified Compound (D-1)] | 5.0 parts |
| N-Vinylcaprolactam | 16.0 parts |
| 2-Phenoxyethyl acrylate (SR339, produced by Sartomer Company) | 29.4 parts |
| Trimethylolpropane triacrylate (SR351, produced by Sartomer Company) | 5.0 parts |
| Solsperse 32000 (produced by Noveon, Inc., dispersant) | 0.4 parts |
| Cinquasia Mazenta RT-355D (produced by Ciba Specialty Chemicals, pigment) | 3.6 parts |
| Genorad 16 (produced by Rahn AG, polymerization inhibitor) | 0.05 parts |
| Rapi-Cure DVE-3 (produced by ISP Europe, vinyl ether compound) | 4.0 parts |
| Lucirin TPO (produced by BASF, photoinitiator) | 8.5 parts |
| Benzophenone (photoinitiator) | 4.0 parts |
| Irgacure 184 (produced by Ciba Specialty Chemicals, photoinitiator) | 4.0 parts |
| Isopropylthioxanthone (ITX) | 1.0 part |
| Byk 307 (produced by BYK Chemie, antifoaming agent) | 0.05 parts |

<Cyan Ink 2>

| | |
|---|---|
| Specified phosphoric acid group-containing polymer [exemplified Compound (D-1)] | 5.0 parts |
| Tridecyl acrylate (SR498E, produced by Sartomer Company) | 11.0 parts |
| 2-Phenoxyethyl acrylate (SR339, produced by Sartomer Company) | 27.4 parts |
| N-Vinylcaprolactam | 16.0 parts |
| Trimethylolpropane triacrylate (SR351, produced by Sartomer Company) | 8.0 parts |
| Solsperse 32000 (produced by Noveon, Inc., dispersant) | 0.4 parts |
| Irgalite Blue GLVO (produced by Ciba Specialty Chemicals, pigment) | 3.6 parts |
| Genorad 16 (produced by Rahn AG, polymerization inhibitor) | 0.05 parts |
| Rapi-Cure DVE-3 (produced by ISP Europe, vinyl ether compound) | 4.0 parts |
| Lucirin TPO (produced by BASF, photoinitiator) | 8.5 parts |
| Benzophenone (photoinitiator) | 4.0 parts |
| Irgacure 184 (produced by Ciba Specialty Chemicals, photoinitiator) | 4.0 parts |
| Byk 307 (produced by BYK Chemie, antifoaming agent) | 0.05 parts |

<Black Ink 2>

| | |
|---|---|
| Specified phosphoric acid group-containing polymer [exemplified Compound (D-1)] | 5.0 parts |
| Tridecyl acrylate (SR498E, produced by Sartomer Company) | 11.0 parts |
| Isobornyl acrylate (SR506D, produced by Sartomer Company) | 19.0 parts |
| 2-Phenoxyethyl acrylate (SR339, produced by Sartomer Company) | 28.4 parts |
| Trimethylolpropane triacrylate (SR351, produced by Sartomer Company) | 8.0 parts |
| Solsperse 32000 (produced by Noveon, Inc., dispersant) | 0.4 parts |
| Microlith Black C-K (produced by Ciba Specialty Chemicals, pigment) | 2.6 parts |
| Genorad 16 (produced by Rahn AG, polymerization inhibitor) | 0.05 parts |
| Lucirin TPO (produced by BASF, photoinitiator) | 8.5 parts |
| Benzophenone (photoinitiator) | 4.0 parts |
| Irgacure 184 (produced by Ciba Specialty Chemicals, photoinitiator) | 4.0 parts |
| Isopropylthioxanthone (ITX) | 1.0 part |
| Byk 307 (produced by BYK Chemie, antifoaming agent) | 0.05 parts |

The crude ink composition of each color prepared in the above manner was passed through a filter with an absolute filtration accuracy of 2 µm, thereby obtaining ink of each color.

Recording on a recording medium was then performed using commercially available inkjet recording apparatus with piezo-type inkjet nozzles. The ink feed system of the apparatus included source tanks, feed piping, ink feed tanks installed immediately in front of an inkjet head, filters and a piezo-type inkjet head, and insulation and heating were given to the section extending from the ink feed tanks to the inkjet head. Temperature sensors were put in the ink feed tanks and in the vicinity of nozzles of the inkjet head, respectively, and the temperature in the nozzle region was controlled so as to fall within a range of 70° C.±2° C. The piezo-type inkjet head was actuated so that multiple-size dots of 8 to 30 pl jetted out in a resolution of 720×720 dpi. The exposure system, the main scan speed and the jet frequencies were adjusted so that UV light was condensed so as to have illuminance of 300 mW/cm² at the exposed surface and the irradiation therewith started after a lapse of 0.1 second from impact of ink droplets against a recording medium. In addition, the exposure time was made variable, and application of exposure light energy was carried out. Incidentally, the term "dpi" used in the invention refers to the number of dots per 2.54 cm.

(Four-Color Inkjet Image Recording)

The black ink, the cyan ink, the magenta ink and the yellow ink prepared in the foregoing manners were made to jet out sequentially in order of mention at ambient temperature of 25° C., and UV light was applied to the ink of each individual color. In order to apply energy enough to cure the ink of each color completely and feel no tackiness in examination by touch, every exposure was carried out so that the total exposure energy per color was adjusted to 900 mj/cm². The recording media used herein were a grained aluminum substrate, a transparent biaxially-stretched polypropylene film which had undergone surface treatment for giving printing suitability thereto, a soft sheet of polyvinyl chloride, cast-coated paper and commercially available recycled paper. When images of each color were recorded on each of those recording media, high-resolution images free of dot spread were obtained. Even on wood free paper, each ink was cured to a sufficient degree and free from a strike-through phenomenon, and besides, there was almost no emission of a bad smell traceable to unreacted monomers. Furthermore, the ink recorded on the film had sufficient flexibility, was not cracked even by bending, and had no problem in the adhesion test through the peeling of cellophane tape.

Example 11

Image Formation by Radical Polymerization

<Magenta Ink 13>
Magenta Ink 13 was prepared in the same manner as Magenta Ink 12 prepared in Example 10, except that the exemplified Compound (D-1) was replaced with the exemplified Compound (D-2).

Example 12

Image Formation by Radical Polymerization

<Magenta Ink 14>
Magenta Ink 14 was prepared in the same manner as Magenta Ink 12 prepared in Example 10, except that the exemplified Compound (D-1) was replaced with the exemplified Compound (D-3).

Example 13

Image Formation by Radical Polymerization

<Magenta Ink 15>
Magenta Ink 15 was prepared in the same manner as Magenta Ink 12 prepared in Example 10, except that the exemplified Compound (D-1) was replaced with the exemplified Compound (A-1).

Example 14

Image Formation by Radical Polymerization

<Magenta Ink 16>
Magenta Ink 16 was prepared in the same manner as Magenta Ink 12 prepared in Example 10, except that the exemplified Compound (D-1) was replaced with the exemplified Compound (C-1).

Example 15

<Magenta Ink 17>

| | |
|---|---|
| N-Vinylcaprolactam | 25.0 parts |
| 2-Phenoxyethyl acrylate (SR339, produced by Sartomer Company) | 36.4 parts |
| Specified phosphoric acid group-containing polymer [exemplified Compound (B-1)] | 5.0 parts |
| Solsperse 32000 (produced by Noveon, Inc., dispersant) | 0.4 parts |

-continued

| | |
|---|---|
| Cinquasia Mazenta RT-355D (produced by Ciba Specialty Chemicals, pigment) | 3.6 parts |
| Genorad 16 (produced by Rahn AG, polymerization inhibitor) | 0.05 parts |
| Rapi-Cure DVE-3 (produced by ISP Europe, vinyl ether compound) | 4.0 parts |
| Lucirin TPO (produced by BASF, photoinitiator) | 8.5 parts |
| Benzophenone (photoinitiator) | 4.0 parts |
| Irgacure 184 (produced by Ciba Specialty Chemicals, photoinitiator) | 4.0 parts |
| Isopropylthioxanthone (ITX) | 1.0 part |
| Byk 307 (produced by BYK Chemie, antifoaming agent) | 0.05 parts |

Comparative Example 5

<Magenta Ink 18>
Magenta Ink 18 was prepared in the same manner as Magenta Ink 12 prepared in Example 10, except that the exemplified Compound (D-1) was replaced with 2-phenoxyethyl acrylate.

Comparative Example 6

<Magenta Ink 19>
Magenta Ink 19 was prepared in the same manner as Magenta Ink 12 prepared in Example 10, except that the exemplified Compound (D-1) was replaced with the comparative Compound (1).

Comparative Example 7

<Magenta Ink 20>
Magenta Ink 20 was prepared in the same manner as Magenta Ink 12 prepared in Example 10, except that the exemplified Compound (D-1) was replaced with the comparative Compound (2).

The crude compositions of Magenta Ink 12 to 20 prepared in Examples 10 to 15 and Comparative Examples 5 to 7 respectively were each passed through a filter with an absolute filtration accuracy of 2 μm, and the thus filtered ones were designated as Magenta Ink 12 to 20 respectively.

In addition, it was found that the ink compositions prepared in Examples and Comparative Examples had their viscosities in a range of 7 to 20 mPa·s at the discharge temperature of ink. By using Magenta Ink 12 to 20 prepared in Examples 10 to 15 and Comparative Examples 5 to 7, magenta images were formed in accordance with the same method as described in Example 1. Evaluations of curing sensitivity and adhesion to each recording medium in conformance with the aforementioned methods, as in the case of Example 1, were performed on each of these images formed and each ink before using for image formation.

TABLE 3

| | Magenta Ink No. | Sensitivity (mJ/cm$^2$) | Adhesion properties | |
|---|---|---|---|---|
| | | | Corona-treated PP | Copper Substrate |
| Example 10 | 12 | 820 | 5B | 5B |
| Example 11 | 13 | 820 | 5B | 5B |
| Example 12 | 14 | 540 | 5B | 5B |
| Example 13 | 15 | 850 | 5B | 5B |
| Example 14 | 16 | 820 | 5B | 5B |
| Example 15 | 17 | 850 | 5B | 5B |
| Comparative Example 5 | 18 | 820 | 1B | 1B |

TABLE 3-continued

| Magenta Ink No. | Sensitivity (mJ/cm²) | Adhesion properties | |
| | | Corona-treated PP | Copper Substrate |
| --- | --- | --- | --- |
| Comparative Example 6 | 19 | 820 | 1B | 1B |
| Comparative Example 7 | 20 | 850 | 2B | 2B |

As can be seen from Table 3, the magenta ink prepared in every Comparative Example was inferior in adhesion properties. With respect to the sensitivities attained in Examples, the radical polymerization-utilizing ink compositions in Table 3 were lower than the cationic polymerization-utilizing ink compositions in Table 1. However, their adhesion properties to both corona-treated polypropylene sheet and copper substrate were found to be extremely satisfactory.

All publications, patent applications, and technical standards mentioned in this specification are herein incorporated by reference to the same extent as if each individual publication, patent application, or technical standard was specifically and individually indicated to be incorporated by reference.

What is claimed is:

1. An ink composition comprising a polymerization initiator, a polymerizable monomer, and a phosphoric acid group-containing polymer having a weight-average molecular weight in a range of from 10,000 to 30,000 and has a phosphoric acid group content of 0.4 meq/g to 3.6 meq/g, wherein the phosphoric acid group-containing polymer is a single polymer or a mixture of two or more polymers selected from the group consisting of a polyurethane resin having, as its skeleton, a product of reaction between at least one diisocyanate compound represented by the following Formula (1A) and at least one diol compound represented by the following Formula (1B); a polyester resin; a polyurea resin; and a (meth)acrylic resin represented by the following Formula (1-3):

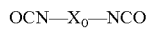  (1A)

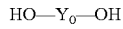  (1B)

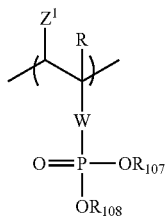  (1-3)

wherein in Formula 1A and Formula 1B, $X_0$ and $Y_0$ each independently represents a divalent organic residue; and wherein in Formula (1-3), R represents a hydrogen atom or a methyl group;

$R_{107}$ and $R_{108}$ each independently represents a hydrogen atom, sodium, potassium, an alkyl group or an aryl group;

$Z^1$ represents a hydrogen atom or a univalent organic group; and

W represents a divalent linkage group selected from the group consisting of a straight-chain having 1 to 20 carbon atoms, branched-chain or cyclic alkylene, a straight-chain, branched-chain or cyclic alkenylene having 2 to 20 carbon atoms, an alkynylene group having 2 to 20 carbon atoms, an arylene having 6 to 20 carbon atoms, —OC(=O)—, —OC(=O)Ar—, —OC(=O)O—, —OC(=O)OAr—, —C(=O)N(R)—, —C(=O)N(Ar)—, —SO₂N(R)—, —SO₂N(Ar)—, alkyleneoxy, polyalkyleneoxy, aryleneoxy, polyaryleneoxy, —C(=O)O—, —C(=O)O—Ar—, —C(=O)Ar—, —C(=O)—, —SO₂O—, —SO₂OAr—, —OSO₂—, OSO2Ar—, —N(R)SO₂—, —N(Ar)SO₂—, —N(R)C(=O)—, —N(Ar)C(=O)—, —N(R)C(=O)O—, —N(Ar)C(=O)O—, —OC(=O)N(R)—, —OC(=O)N(Ar)—, —N(Ar)—, —N(R)—, —N⁺(R)(R')—, —N⁺(R)(Ar)—, —N⁺(Ar)(Ar')—, —S—, —SAr—, —ArS—, a heterocycle residue of 3- to 12-membered monocyclic or condensed ring containing at least one hetero atom, —OC(=S)—, —OC(=S)Ar—, —C(=S)O—, —C(=S)OAr—, —C(=S)OAr—, —C(=O)S—, —C(=O)SAr—, —ArC(=O)—, —ArC(=O)N(R)—, —ArC(=O)N(Ar)—, —ArC(=O)O—, —ArC(=O)S—, —ArC(=S)O—, —ArO— and —ArN(R)—, wherein R and R' in the W linkage group each independently represents a hydrogen atom, a straight-chain or branched alkyl group, a chain or cyclic alkyl group, a straight-chain or branched alkenyl group, a chain or cyclic alkenyl group, a straight-chain or branched alkynyl group, or a chain or cyclic alkynyl group; and Ar and Ar' each independently represents an aryl group.

2. The ink composition of claim 1, wherein a content of the phosphoric acid group-containing polymer is in a range of from 1 to 10 mass %.

3. The ink composition of claim 1, wherein the phosphoric acid group-containing polymer is a phosphoric acid group-containing acrylic or methacrylic resin.

4. The ink composition of claim 1, wherein the weight-average molecular weight the phosphoric acid group-containing polymer is in a range of from 10,000 to 20,000.

5. The ink composition of claim 1, further comprising a coloring agent.

6. The ink composition of claim 1, wherein the polymerizable monomer is a cationic polymerizable compound.

7. The ink composition of claim 1, wherein the polymerizable monomer is a radical polymerizable compound.

8. The ink composition of claim 1, wherein the ink composition is an ink composition for ink jet recording.

9. The ink composition of claim 1, wherein the weight-average molecular weight of the phosphoric acid group-containing polymer is in a range of from 10,000 to 15,000, and the degree of polydispersion, which is the ratio of the weight-average molecular weight to the number-average molecular weight, is in a range of from 1.1 to 10.

10. The ink composition of claim 1, having a viscosity in a range of from 7 to 30 mPa·s.

11. The ink composition of claim 1, wherein W represents a divalent linkage group selected from the group consisting of a straight-chain having 1 to 20 carbon atoms, branched-chain or cyclic alkylene, a straight-chain, branched-chain or cyclic alkenylene having 2 to 20 carbon atoms, an alkynylene group having 2 to 20 carbon atoms, an arylene having 7 to 20 carbon atoms, —OC(=O)—, —OC(=O)Ar—, —OC(=O)O—, —OC(=O)OAr—, —C(=O)N(R)—, —C(=O)N(Ar)—, —SO₂N(R)—, —SO₂N(Ar)—, alkyleneoxy, polyalkyleneoxy, aryleneoxy, polyaryleneoxy, —C(=O)O—, —C(=O)O—Ar—, —C(=O)Ar—, —C(=O)—, —SO₂O—, —SO₂OAr—, —OSO₂—, —OSO₂Ar—, —N(R)SO₂—, —N(Ar)SO₂, —N(R)C(=O)—, —N(Ar)C (=O)—, —N(R)C(=O)O—, —N(Ar)C(=O)O—, —OC(=O)N(R)—, —OC(=O)N(Ar)—, —N(Ar)—, —N(R)—, —N⁺(R)(R')—, —N⁺(R)(Ar)—, —N⁺(Ar)(Ar')—, —S—, —SAr—, —ArS—, a heterocycle residue of 3- to 12-membered monocyclic or condensed ring containing at least one hetero atom, —OC(=S)—, —OC(=S)Ar—, —C(=S)O—, —C(=S)OAr—, —C(=S)OAr—, —C(=O)S—, —C(=O)SAr—, —ArC(=O)—, —ArC(=O)N(R)—, —ArC(=O)N(Ar)—, —ArC(=O)O—, —ArC(=O)S—, —ArC(=S)O—, —ArO— and —ArN(R)—, wherein R and R' in the W linkage group each independently represents a hydrogen atom, a straight-chain or branched alkyl group, a chain or cyclic alkyl group, a straight-chain or branched alkenyl group, a chain or cyclic alkenyl group, a straight-chain or branched alkynyl group, or a chain or cyclic alkynyl group; and Ar and Ar' each independently represents an aryl group.

12. The ink composition of claim 1, wherein W represents a hydrogen atom or a univalent organic group selected from the group consisting of

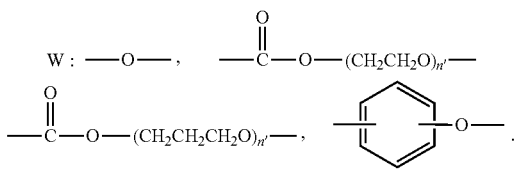

n' = 1 ~ 40

13. The ink composition of claim 1, wherein $Z^1$ represents a hydrogen atom, a straight-chain, branched-chain or cyclic alkyl group having 1 to 20 carbon atoms, a straight-chain, branched-chain or cyclic alkenyl group having 2 to 20 carbon atoms, an alkynyl group having 2 to 20 carbon atoms, an aryl group having 6 to 20 carbon atoms, an acyloxy group having 1 to 20 carbon atoms, an alkoxycarbonyloxy group having 2 to 20 carbon atoms, an aryloxycarbonyloxy group having 7 to 20 carbon atoms, a carbamoyloxy group having 1 to 20 carbon atoms, a carbonamido group having 1 to 20 carbon atoms, a sulfonamido group having 1 to 20 carbon atoms, a carbamoyl group having 1 to 20 carbon atoms, a sulfamoyl group having 0 to 20 carbon atoms, an alkoxy group having 1 to 20 carbon atoms, an aryloxy group having 6 to 20 carbon atoms, an aryloxycarbonyl group having 7 to 20 carbon atoms, an alkoxycarbonyl group having 2 to 20 carbon atoms, a N-acylsulfamoyl group having 1 to 20 carbon atoms, a N-sulfamoylcarbamoyl group having 1 to 20 carbon atoms, an alkylsulfonyl group having 1 to 20 carbon atoms, an arylsulfonyl group having 6 to 20 carbon atoms, an alkoxycarbonylamino group having 2 to 20 carbon atoms, an aryloxycarbonylamino group having 7 to 20 carbon atoms, an amino group having 0 to 20 carbon atoms, an ammonio group having 3 to 20 carbon atoms, a cyano group, a nitro group, a carboxyl group, a hydroxyl group, a sulfo group, a mercapto group, an alkylsulfmyl group having 1 to 20 carbon atoms, an arylsulfinyl group having 6 to 20 carbon atoms, an alkylthio group having 1 to 20 carbon atoms, an arylthio group having 6 to 20 carbon atoms, a ureido group having 1 to 20 carbon atoms, an heterocyclic group having 2 to 20 carbon atoms, an acyl group having 1 to 20 carbon atoms, a sulfamoylamino group having 0 to 20 carbon atoms, a silyl group having 3 to 50 carbon atoms, an azo group, or a halogen atom, and when $Z^1$ is a substituent other than a hydrogen atom or a halogen atom, the substituent may further have a substituent.

14. The ink composition of claim 1, wherein ¹ represents a univalent organic group selected from the group consisting of

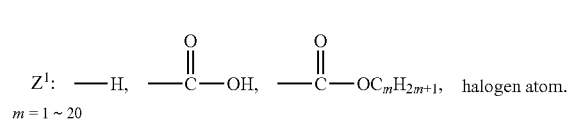

m = 1 ~ 20

15. An inkjet recording method comprising:
ejecting the ink composition of claim 1 onto a recording medium using an inkjet recording apparatus, and
curing the ejected ink composition by irradiating the ejected ink composition with active radiation.

16. The inkjet recording method of claim 15, wherein the active radiation is ultraviolet light emitted from a light-emitting diode that emits ultraviolet light having an emission peak wavelength within the range of 350 to 420 nm and achieves a maximum illumination intensity of 10 to 2,000 mW/cm² at the surface of the recording medium.

17. A printed material recorded by the inkjet recording method of claim 15.

18. A method for producing a planographic printing plate comprising:
ejecting the ink composition of claim 1 onto a support; and
forming a hydrophobic image on the support by irradiating the ejected ink composition with active radiation to cure the ink composition.

19. A planographic printing plate that has been produced by the method for producing a planographic plate of claim 18.

* * * * *